(12) United States Patent
Nii et al.

(10) Patent No.: US 10,644,009 B2
(45) Date of Patent: May 5, 2020

(54) SEMICONDUCTOR MEMORY DEVICE

(71) Applicant: RENESAS ELECTRONICS CORPORATION, Tokyo (JP)

(72) Inventors: Koji Nii, Tokyo (JP); Makoto Yabuuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/178,227

(22) Filed: Nov. 1, 2018

(65) Prior Publication Data
US 2019/0198507 A1 Jun. 27, 2019

(30) Foreign Application Priority Data

Dec. 21, 2017 (JP) .................. 2017-245114
Jun. 14, 2018 (JP) .................. 2018-113366

(51) Int. Cl.
| G11C 11/412 | (2006.01) |
| H01L 27/11 | (2006.01) |
| G11C 8/14 | (2006.01) |
| G11C 15/04 | (2006.01) |
| H01L 23/528 | (2006.01) |
| H01L 27/02 | (2006.01) |

(52) U.S. Cl.
CPC ............ *H01L 27/1104* (2013.01); *G11C 8/14* (2013.01); *G11C 11/412* (2013.01); *G11C 15/04* (2013.01); *H01L 23/528* (2013.01); *H01L 27/0207* (2013.01)

(58) Field of Classification Search
CPC .............................. G11C 11/412; H01L 27/11
See application file for complete search history.

(56) References Cited

U.S. PATENT DOCUMENTS 7,038,925 B1 *  5/2006  Ohbayashi ............ G11C 11/418
                                                     365/154
2002/0117722 A1  8/2002  Osada et al.
2003/0227060 A1  12/2003  Yamauchi

FOREIGN PATENT DOCUMENTS

JP        05-290577 A      11/1993

OTHER PUBLICATIONS

Partial European Search Report issued in corresponding European Patent Application No. 18205349.6-1203, dated Apr. 17, 2019.

* cited by examiner

Primary Examiner — Thomas L Dickey
(74) Attorney, Agent, or Firm — McDermott Will & Emery LLP

(57) ABSTRACT

To provide a semiconductor memory device fast in address access time. The semiconductor memory device includes a plurality of memory cells, and a word line coupled to the memory cells. The word line is extended in a first direction. Each of the memory cells includes gate electrodes extended in a second direction intersecting with the first direction.

14 Claims, 33 Drawing Sheets

SEMICONDUCTOR MEMORY DEVICE

CROSS-REFERENCE TO RELATED APPLICATIONS

The disclosure of Japanese Patent Application No. 2017-245114 filed on Dec. 21, 2017 and No. 2018-113366 filed on Jun. 14, 2018 each including the specification, drawings and abstract are incorporated herein by reference in its entirety.

BACKGROUND

The present invention relates to a semiconductor memory device, and is particularly applicable to a semiconductor memory device equipped with a static type memory cell, and a semiconductor device equipped therewith.

There has been known a semiconductor device equipped with a volatile semiconductor memory device like a static random access memory (SRAM). There has been proposed a layout of a slender memory cell as a memory cell of an SRAM generated by a miniaturized semiconductor process (refer to U.S. Unexamined Patent Application Publication No. 2002/0117722). This slender memory cell has a laterally-long layout in which a gate wiring is arranged in a horizontal direction and a diffusion layer is arranged in a vertical direction. A word line is extended in the same direction as the gate wiring, and a bit line is extended in the same direction as the diffusion layer.

Further, as the SRAM, there has been proposed a configuration in which a bit line is shared between adjacent memory cells (refer to Japanese Unexamined Patent Application Publication Laid-Open No. Hei 5 (1993)-290577).

RELATED ART DOCUMENTS

Patent Documents

[Patent Document 1] U.S. Unexamined Patent Application Publication No. 2002/0117722, Specification
[Patent Document 2] Japanese Unexamined Patent Application Publication Laid-Open No. Hei 5(1993)-290577

SUMMARY

The present inventors have found that an SRAM having adopted a layout of such a slender memory cell as described in U.S. Unexamined Patent Application Publication No. 2005/014696 has the following cases.

That is, in the layout of the slender memory cell, the rectangular shape of a memory array becomes a layout very long along the direction of arrangement of each word line. Since the wiring length of the word line becomes long where the number of memory cells coupled to one word line is large (multi-bit width), a parasitic resistance and capacitance parasitic to the word line are increased. Since the rise of the word line to a selection level was delayed, there was a case where the address access time of the SRAM became slow.

An object of the present disclosure is to provide a semiconductor memory device fast in address access time.

Other objects and novel features of the present invention will become apparent from the description of the present specification and the accompanying drawings.

A summary of a typical one of the present disclosure will be described in brief as follows:

A semiconductor memory device has a plurality of memory cells, and a word line coupled to the memory cells. The word line is extended in a first direction. Each of the memory cells includes gate electrodes extended in a second direction intersecting with the first direction.

According to the semiconductor memory device, it is possible to provide a semiconductor memory device fast in address access time.

DETAILED DESCRIPTION

Figure 1:
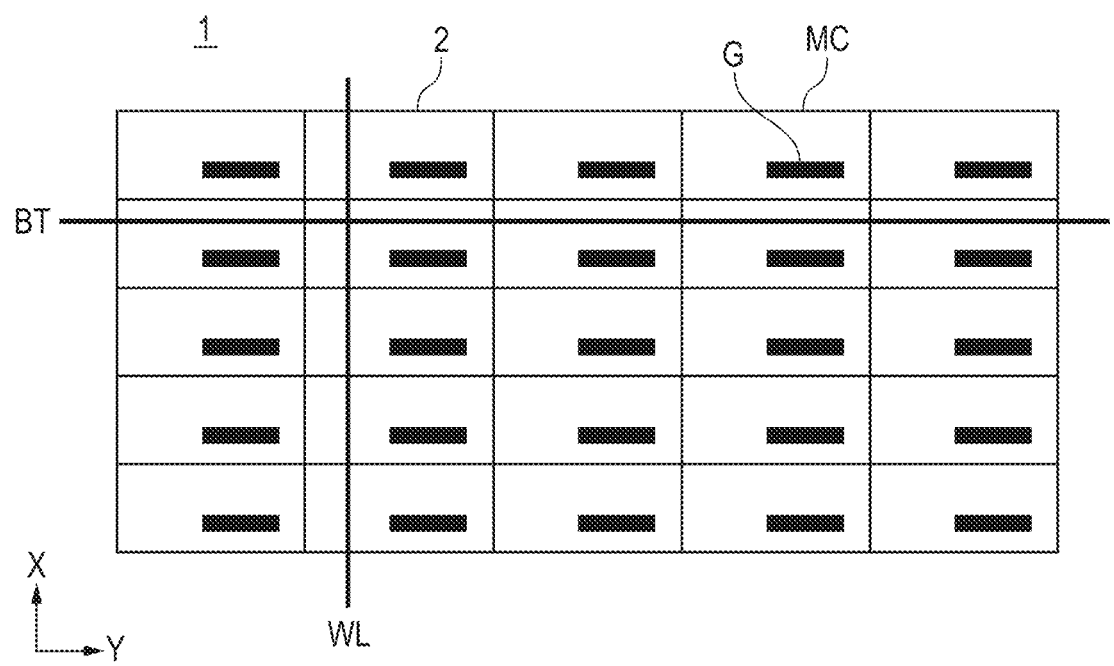
FIG. 1 is a diagram describing a memory array of a semiconductor memory device according to an embodiment.

An embodiment, exemplary embodiments, a comparative example, and applications will hereinafter be described using the accompanying drawings. In the following description, however, the same components are denoted by the same reference numerals, and their description might be omitted. Incidentally, in order to make description clearer, the drawings may be typically represented in terms of the width, thickness, shape, etc. of each part as compared with the actual aspects, but they are only one example. The drawings are not intended to limit the interpretation of the present invention.

EMBODIMENT

Figure 2:
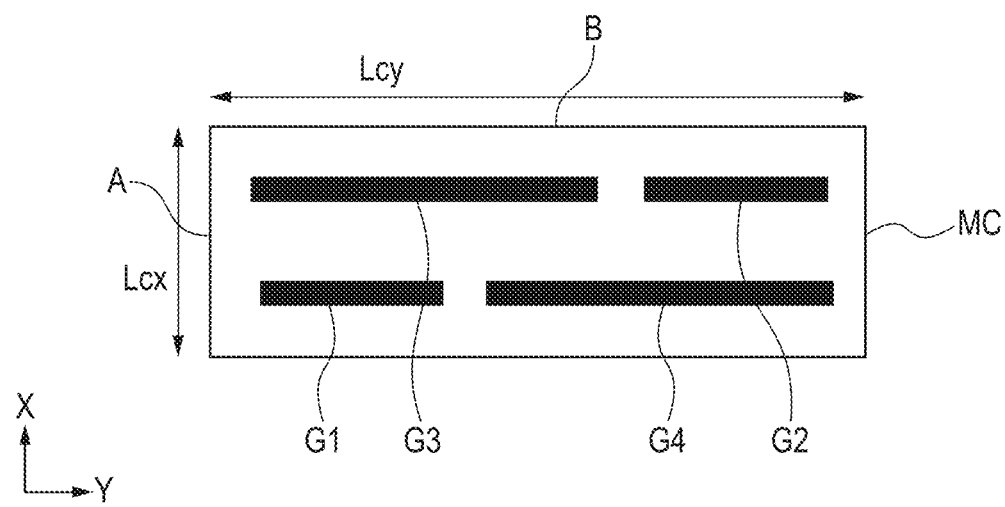
FIG. 2 is a diagram typically showing a layout arrangement of a memory cell of FIG. 1.

FIG. 1 is a diagram describing a memory array of a semiconductor memory device according to an embodiment. FIG. 2 is a diagram typically showing a layout arrangement of a memory cell of FIG. 1. Incidentally, one of four gate electrodes G1 through G4 shown in FIG. 2 is illustratively drawn as a gate electrode G in each memory cell MC shown in FIG. 1 to simplify the drawing and provide easy understanding.

The memory array 2 of the semiconductor memory device 1 illustratively has memory cells MC of 5 rows and 5 columns. Each of the memory cells MC is a static type memory cell and is configured as a layout pattern whose outer shape is in the form of a rectangle slender in its lateral direction in plan view as shown in FIG. 2. The rectangular-shaped layout pattern has a side A short in its vertical direction (X direction or first direction), and a side B long in its horizontal direction (Y direction or second direction). The length Lcx of the side A taken along the X direction is made shorter than the length Lcy of the side B taken along the Y direction orthogonal to or intersecting with the X direction (Lcx<Lcy). As illustratively shown in FIG. 2, the memory cell MC has four gate electrodes (or gate wirings) G1, G2, G3, and G4 arranged to extend in a direction taken along the Y direction. The first gate electrode G1, second gate electrode G2, third gate electrode G3, and fourth gate electrode G4 are respectively provided separated from each other and formed in a bending-free linear form. The fourth gate electrode G4 is arranged on the lateral side of the first gate electrode G1. The first gate electrode G1 and the third gate electrode G3 are arranged to run in parallel in the X direction. The second gate electrode G2 is arranged on the lateral side of the third gate electrode G3. The first gate electrode G1 and the fourth gate electrode G4 are linearly arranged in the Y direction. The third gate electrode G3 and the second gate electrode G2 are linearly arranged in the Y direction.

Thus, in the slender rectangular-shaped memory cell MC, two MOS transistors are vertically formed side by side in the X direction. On the other hand, in the slender rectangular-shaped memory cell MC, three MOS transistors can be formed side by side in the Y direction. This will be described in detail with reference to FIG. 6 to be described later.

One word line WL and one bit line BT are illustratively drawn in FIG. 1. The word line WL is arranged to extend in a direction taken along the X direction, and the bit line BT is arranged to extend in a direction taken along the Y direction. In FIG. 1, the direction of arrangement of the word line WL is assumed to be a direction crossing the arrangement direction of the gate electrode G in the memory cell MC. The direction of arrangement of the bit line BT is assumed to be the same direction as the arrangement direction of the gate electrode G in the memory cell MC. In other words, the arrangement direction of the word line WL is a direction taken along the direction of the side A being the short side of the rectangular-shaped layout pattern of the memory cell. The arrangement direction of the bit line BT is a direction taken along the direction of the side B being the long side of the rectangular-shaped layout pattern of the memory cell. Further, in the layout pattern of the rectangular-shaped memory cell whose outer shape is slender in the horizontal direction, the length of the word line WL corresponding to one memory cell MC is the same as the length (Lcx) of the short side A, and the length of the bit line BT corresponding to one memory cell is the same as the length (Lcy) of the long side B. Therefore, the length (Lcx) of the word line WL per memory cell MC is shorter than the length (Lcx) of the bit line BT per memory cell (Lcx<Lcy).

In FIG. 1, since the word line WL is arranged in the X direction to be coupled to the five memory cells arranged in the X direction, the length of the word line WL over the memory array 2 is 5Lcx. On the other hand, since the bit line BT is arranged in the Y direction to be coupled to the five memory cells arranged in the Y direction, the length of the bit line BT over the memory array 2 is 5Lcy. That is, since the slender rectangular-shaped memory cell shown in FIG. 2 is used, the length (5Lcx (WL)) of the word line WL is made shorter than the length (5Lcy(BT)) of the bit line BT (5Lcx (WL)<5Lcy (BT)).

Figure 3:
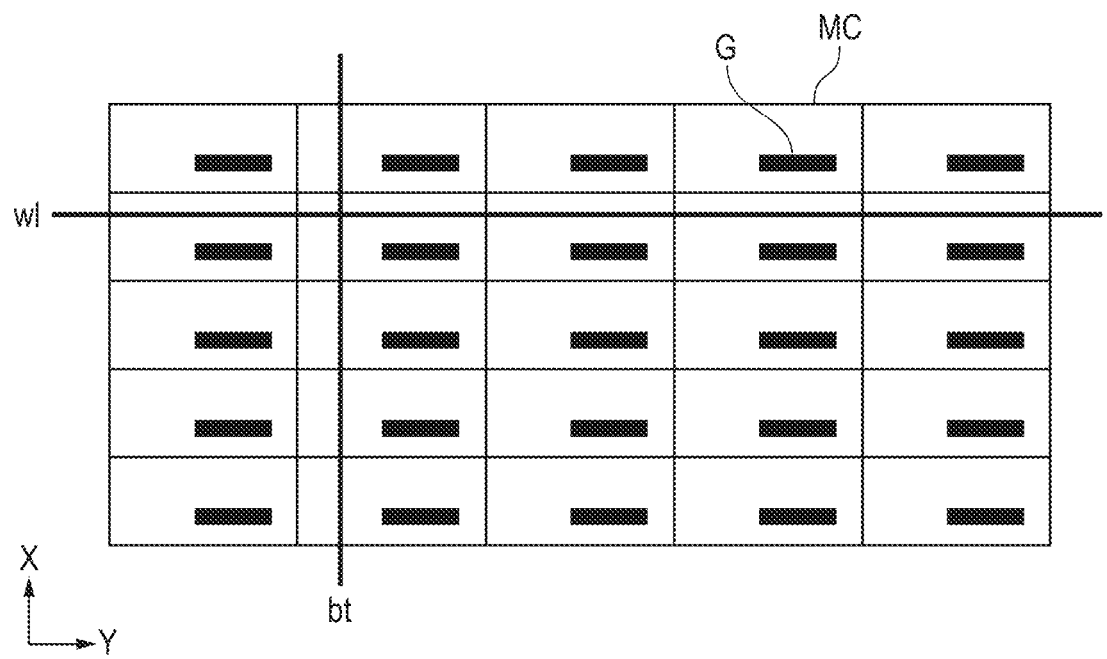
FIG. 3 is a diagram describing a memory array of a semiconductor memory device according to a comparative example.

FIG. 3 is a diagram describing a memory array of a semiconductor memory device according to a comparative example. Memory cells MC of 5 rows and 5 columns are described as with FIG. 1. Even in this case, the slender rectangular-shaped memory cell shown in FIG. 2 is assumed to be used as each memory cell MC. The direction of arrangement of a word line wl is assumed to be the same direction as the direction of arrangement of a gate electrode G of each memory cell MC. On the other hand, the direction of arrangement of a bit line is assumed to be a direction intersecting with the arrangement direction of the gate electrode G of each memory cell MC. The length of the word line wl over the memory array 2 is 5Lcy (wl), and the length of the bit line bt over the memory array 2 is 5Lcx (bt). Thus, the length (5Lcy (wl)) of the word line wl is made longer than the length (5Lcx (bt)) of the bit line bt in FIG. 3 (5Lcy (wl)>5Lcx (bt)).

When FIG. 1 and FIG. 3 are compared with each other, a condition for them is that the same number of memory cells are coupled. Since, however, the length (5Lcx (WL)) of the word line WL is shorter than the length (5Lcy (wl)) of the word line wl (5Lcx (WL)<5Lcy (wl)), the parasitic resistance and capacitance of the word line WL shown in FIG. 1 are reduced more than the parasitic resistance and capacitance of the word line wl shown in FIG. 3.

Although the configuration example of the memory cells MC of 5 rows and 5 columns has been described in FIGS. 1 and 3, it is understood that where such a multi-bit configured semiconductor memory device that 8 word lines are provided and 64 or 128 memory cells are coupled to one word line is considered, the length of the word line WL shown in FIG. 1 becomes extremely shorter than the length of the word line wl shown in FIG. 3 between the arrangement method for the word line WL shown in FIG. 1 and the arrangement method for the word line wl shown in FIG. 3.

According to the embodiment, since the arrangement direction of the word line WL is set to the direction orthogonal to or crossing the arrangement direction of the gate electrodes G1 through G4 of each memory cell in the semiconductor memory device in which the memory cells each having the rectangular-shaped layout pattern whose outer shape is slender are arranged in a matrix form, the parasitic resistance and capacitance of the word line WL can be reduced. Therefore, the rise of the word line WL to a selection level becomes fast. It is therefore possible to make fast an address access time for data reading in the semiconductor memory device.

Further, since the fall of the word line WL from the selection level to a non-selection level is also made fast, an address access interval for continuous data reading or data writing in the semiconductor memory device can be made fast. It is therefore possible to provide a high-speed semiconductor memory device.

Exemplary Embodiment 1

Figure 4:
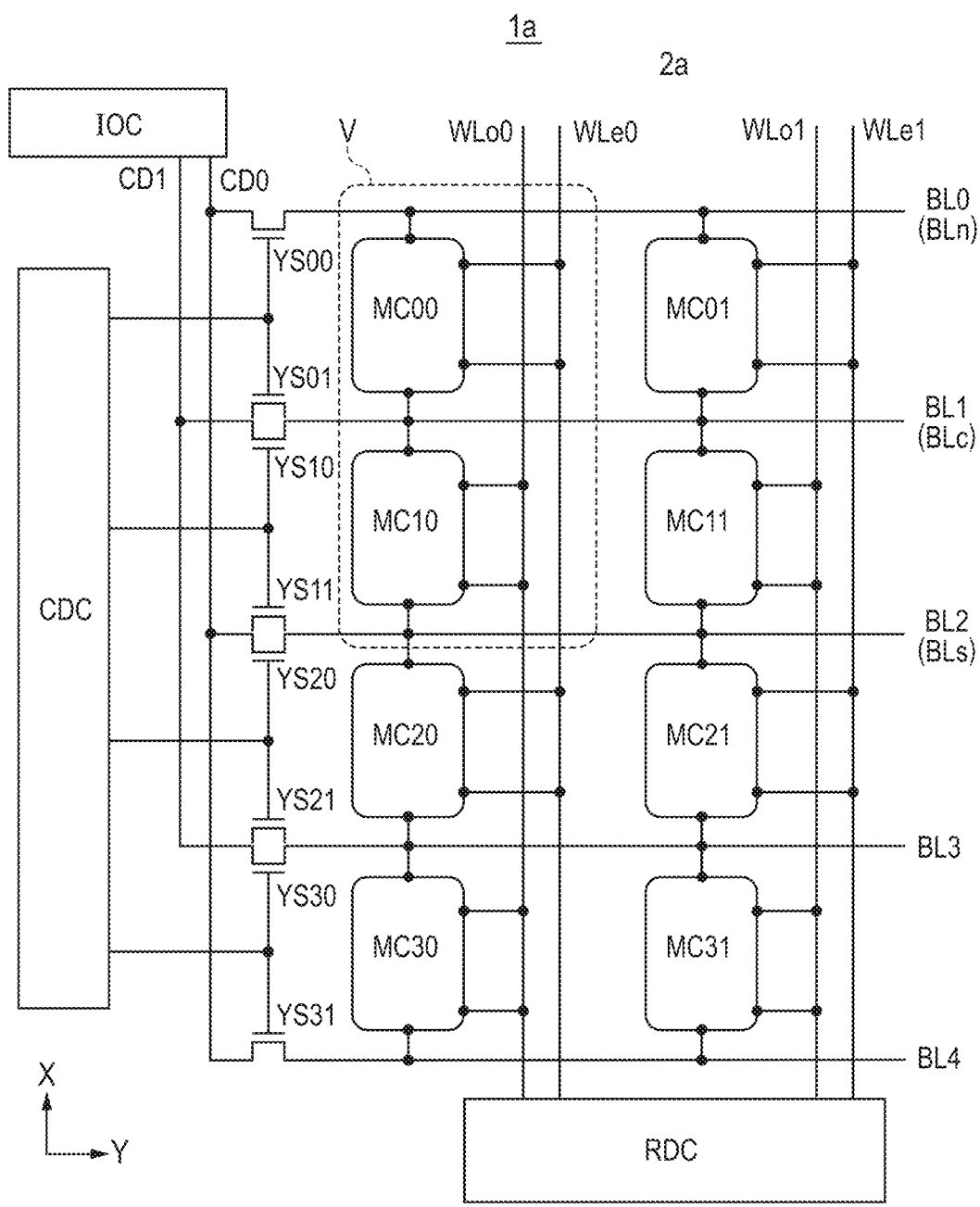
FIG. 4 is a diagram describing a configuration example of a semiconductor memory device according to an exemplary embodiment 1.

FIG. 4 is a diagram describing a configuration example of a semiconductor memory device according to an exemplary embodiment 1.

A semiconductor memory device 1a being a static type semiconductor memory device SRAM (Static Random Access Memory) is formed over the surface of a semiconductor substrate like single crystal silicon, for example by the known CMOS semiconductor manufacturing method. As shown illustratively, the semiconductor memory device 1a has a memory array 2a including eight memory cells (MC00 through MC31) arranged in 2 rows and 4 columns. Each of the memory cells (MC00 through MC31) includes a static type memory cell. The memory array 2a of the semiconductor memory device 1a is not limited to the memory cells of 2 rows and 4 columns, but may be configured to include a plurality of memory cells arranged in a matrix of more than 2 rows and 4 columns. Although a layout pattern of each of the memory cells MC will be described later, as described in FIG. 2, it is defined as the rectangular-shaped layout pattern slender in the Y direction and has the gate electrodes G1 through G4.

The memory cells MC00 and MC01 are coupled to a bit line pair BL0, BL1, and the memory cells MC10 and MC11 are coupled to a bit line pair BL1, BL2. Further, the memory cells MC20 and MC21 are coupled to a bit line pair BL2, BL3, and the memory cells MC30 and MC31 are coupled to a bit line pair BL3, BL4. That is, the bit lines BL1, BL2, and BL3 are shared by the memory cells arranged next to each other.

On the other hand, the memory cells MC00 and MC20 are coupled to a word line WLe0, and the memory cells MC10 and MC30 are coupled to a word line WLo0. Further, the memory cells MC01 and MC21 are coupled to a word line WLe1, and the memory cells MC11 and MC31 are coupled to a word line WLo1.

Bit lines (BT0 through BT4) are provided to extend in the Y direction. The word lines (WLe0, WLo0, WLe1, and WLo1) are provided to extend in an X direction crossing the Y direction. That is, the direction of arrangement of the word lines (WLe0, WLo0, WLe1, and WLo1) and the bit lines (BT0 through BT4) in FIG. 4 is set on the basis of a conception similar to that for the arrangement direction of the word line WL and the bit line BL shown in FIG. 1.

The bit line pair BL0, BL1 is coupled to a common data line pair CD0, CD1 through N channel MOS transistors YS00 and YS01 for selection. The bit line pair BL1, BL2 is coupled to the common data line pair CD0, CD1 through N channel MOS transistors YS10 and YS11 for section. The bit line pair BL2, BL3 is coupled to the common data line pair CD0, CD1 through N channel MOS transistors YS20 and YS21 for selection. The bit line pair BL3, BL4 is coupled to the common data line pair CD0, CD1 through N channel MOS transistors YS30 and YS31 for selection.

A row selection circuit (row decoder) RDC sets one of the word lines WLe0, WLo0, WLe1, and WLo1 to a selection level according to a row address signal like a first selection signal.

A column selection circuit (column decoder) CDC is coupled to a common gate of the N channel MOS transistors YS10 and YS11, a common gate of the N channel MOS transistors YS20 and YS21, a common gate of the N channel MOS transistors YS30 and YS31, and a common gate of the N channel MOS transistors YS40 and YS41. The column decoder CDC brings a pair of the N channel MOS transistors ((YS10, YS11), (YS20, YS21), (YS30, YS31), or (YS40, YS41)) into a selection state according to a column address signal like a second selection signal to thereby couple a pair of the bit lines ((BL0, BL1), (BL1, BL2), (BL2, BL3), or (BL3, BL4)) to the common data line pair CD0, CD1 through the pair of N channel MOS transistors in an on state.

An input/output circuit IOC is coupled to the common data line pair CD0, CD1 and has a read circuit having a sense amplifier and a latch circuit used when reading data from the corresponding memory cell, and a write circuit used when writing data into the corresponding memory cell. The read circuit receives data from the memory cell coupled to the selected word line (WLe0, WLo0, WLe1, or WLo1) and the selected bit line pair ((BL0, BL1), (BL1, BL2), (BL2, BL3), or (BL3, BL4)) as an input signal through the common data line pair CD0, CD1 and amplifies the input signal, followed by output to the outside of the semiconductor memory device 1a. The write circuit writes data input from the outside of the semiconductor memory device 1a into the corresponding memory cell coupled to the selected word line (WLe0, WLo0, WLe1, or WLo1) and the selected bit line pair ((BL0, BL1), (BL1, BL2), (BL2, BL3), or (BL3, BL4)) through the common data line pair CD0, CD1.

A circuit example of the memory cells MC00 and MC10 surrounded by a dotted line V in FIG. 4 and a configuration example of their layout will next be described.

Figure 5:
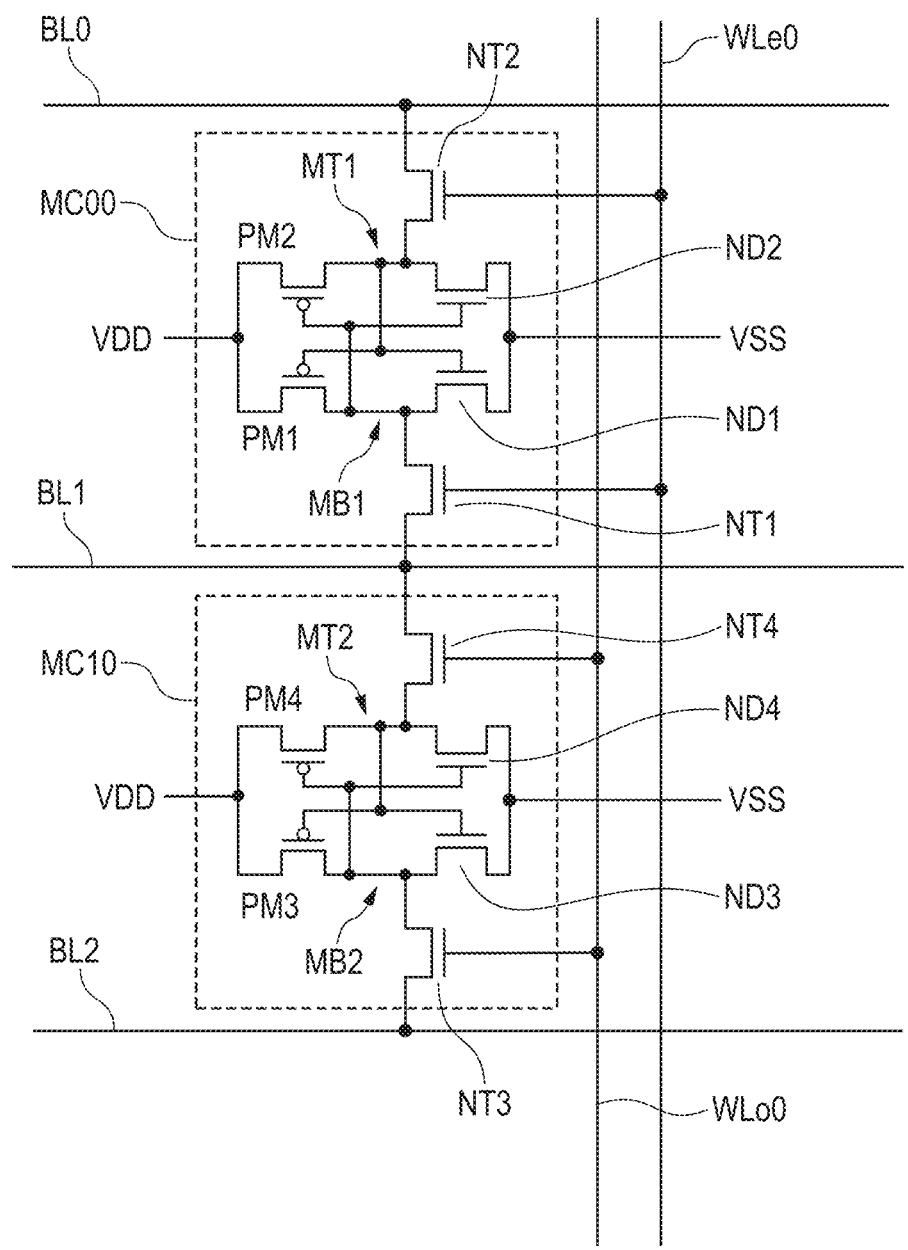
FIG. 5 is a diagram showing a circuit example of two memory cells.

FIG. 5 is a diagram showing a circuit example of the two memory cells. Each of the memory cells MC00 and MC10 is a single port-type memory cell (6T SP SRAM cell) including six MOS transistors.

The memory cell MC00 includes first and second P channel MOS transistors PM1 and PM2, and first through fourth N channel MOS transistors NT1, NT2, ND1, and ND2. Source-drain paths of the P channel MOS transistors PM1 and PM2 defined as first and second load transistors are respectively coupled between a supply line of a power supply potential VDD and first and second memory nodes MB1 and MT1, and their gates are respectively coupled to the second and first memory nodes MT1 and MB1. Source-drain path of the N channel MOS transistors ND1 and ND2 defined as first and second drive transistors are respectively coupled between the first and second memory nodes MB1 and MT1 and a supply line of a ground potential VSS, and their gates are respectively coupled to the second and first memory nodes MT1 and MB1. Source-drain paths of the N channel MOS transistors NT1 and NT2 defined as first and second transfer transistors are respectively coupled between the first and second memory nodes MB1 and MT1 and the bit lines BL1 and BL0, and their gates are both coupled to the word line WLe0.

The MOS transistors PM1 and ND1 configure a first inverter which provides an inverted signal of a signal of the second memory node MT1 to the first memory node MB1. The MOS transistors PM2 and ND2 configure a second inverter which provides an inverted signal of a signal of the first memory node MB1 to the second memory node MT1. The input/output of the two inverters are coupled in reverse-parallel between the first and second memory nodes MB1 and MT1 and configure a latch circuit.

The memory cell MC10 includes first and second P channel MOS transistors PM3 and PM4, and first through fourth N channel MOS transistors NT3, NT4, ND3, and ND4. Source-drain paths of the P channel MOS transistors PM3 and PM4 defined as first and second load transistors are respectively coupled between the supply line of the power supply potential VDD and first and second memory nodes MB2 and MT2, and their gates are respectively coupled to the second and first memory nodes MT2 and MB2. Source-drain paths of the N channel MOS transistors ND3 and ND4 defined as first and second drive transistors are respectively coupled between the first and second memory nodes MB2 and MT2 and the supply line of the ground potential VSS, and their gates are respectively coupled to the second and first memory nodes MT2 and MB2. Source-drain paths of the N channel MOS transistors NT3 and NT4 defined as first and second transfer transistors are respectively coupled between the first and second memory nodes MB2 and MT2 and the bit lines BL2 and BL1, and their gates are both coupled to the word line WLo0.

The MOS transistors PM3 and ND3 configure a first inverter which provides an inverted signal of a signal of the second memory node MT2 to the first memory node MB2. The MOS transistors PM4 and ND4 configure a second inverter which provides an inverted signal of a signal of the first memory node MB2 to the second memory node MT2. The input/output of the two inverters are coupled in reverse-parallel between the first and second memory nodes MB2 and MT2 and configure a latch circuit.

Figure 6:
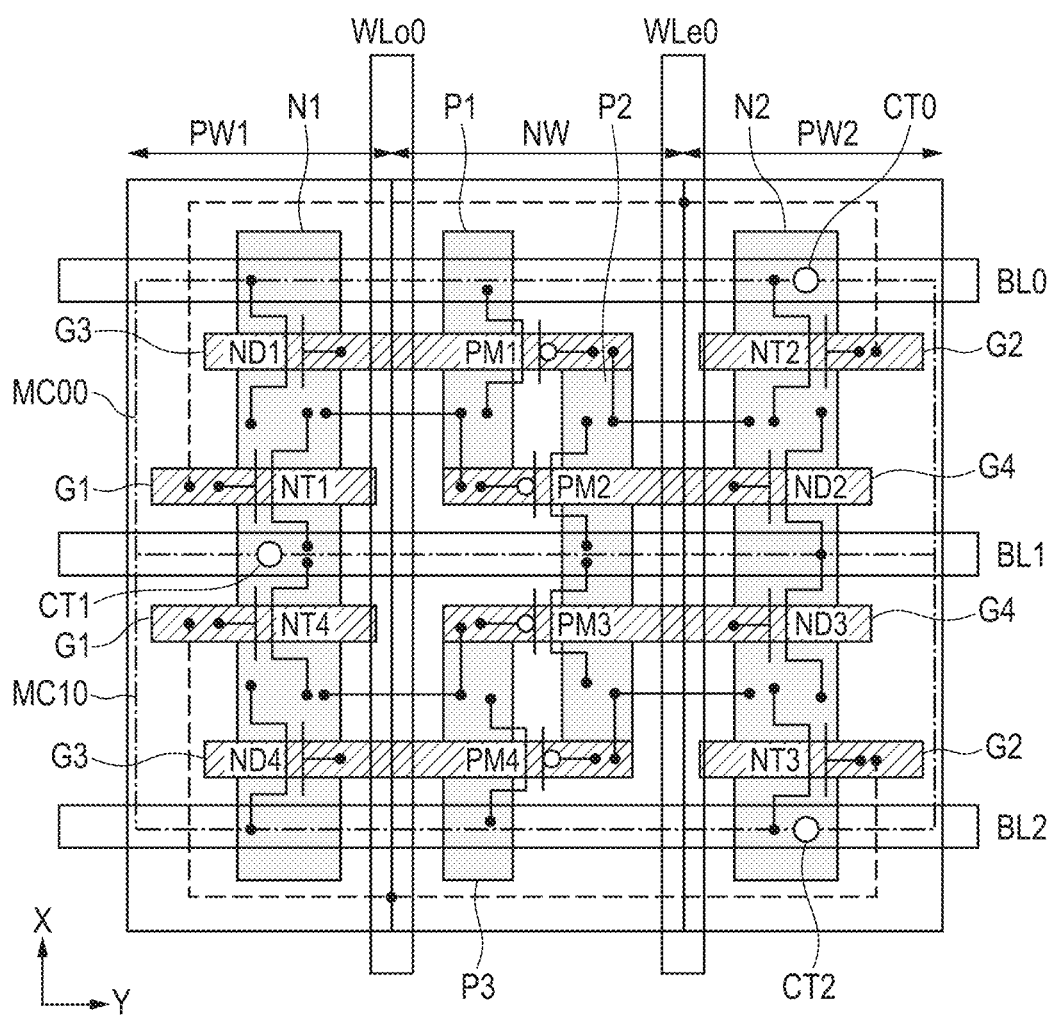
FIG. 6 is a diagram describing a configuration example of a layout arrangement of the two memory cells shown in FIG. 5.

FIG. 6 is a diagram describing a configuration example of a layout arrangement of the two memory cells shown in FIG. 5. Incidentally, although coupling portions to the power supply potential VDD and the ground potential VSS are omitted in FIG. 6 for simplification of the drawing, they will be described in detail below.

The memory cells MC00 and MC10 are vertically arranged over the surface of the semiconductor substrate in plan view. A forming area for each of the memory cells MC00 and MC10 is an area surrounded by a one-dot chain line, which indicates a cell boundary. The forming area for one memory cell is configured as a rectangular-shaped layout pattern whose outer shape is slender in the lateral direction (Y direction) in plan view as described in FIG. 2. The bit lines BL0, BL1, and BL3 are arranged to extend in the Y direction, and the word lines WLe0 and WLo0 are arranged to extend in the X direction. The bit line BL0 is arranged along the cell boundary on the upper side of the memory cell MC00, and the bit line BL1 is arranged along the cell boundary between the memory cell MC00 and the memory cell MC10. The bit line BL2 is arranged along the cell boundary on the lower side of the memory cell MC10.

In the forming area for each of the memory cells MC00 and MC10, two P-type well regions PW1 and PW2 provided along the X direction, and an N-type well region NW provided between the two P-type well regions PW1 and PW2 are formed in the surface of the semiconductor substrate. The P-type well regions PW1 and PW2 are semiconductor regions in which a P-type impurity is introduced. The N-type well region NW is a semiconductor region in which an N-type impurity is introduced.

Further, in the respective forming areas for the memory cells MC00 and MC10, the first gate electrode G1, the second gate electrode G2, the third gate electrode G3, and the fourth gate electrode G4 are extended in the Y direction as described in FIG. 2. Incidentally, since the layout of the first gate electrode G1, second gate electrode G2, third gate electrode G3, and fourth gate electrode G4 has been described using FIG. 2, their description will be omitted herein.

In the forming area for the memory cell MC00, the gate electrode G1 configures a gate electrode of the N channel MOS transistor NT1. The gate electrode G2 configures a gate electrode of the N channel MOS transistor NT2. The gate electrode G3 configures gate electrodes of the P channel MOS transistor PM1 and the N channel MOS transistor ND1. The gate electrode G4 configures gate electrodes of the P channel MOS transistor PM2 and the N channel MOS transistor ND2. On the other hand, in the forming area for the memory cell MC10, the gate electrode G1 configures a gate electrode of the N channel MOS transistor NT4. The gate electrode G2 configures a gate electrode of the N channel MOS transistor NT3. The gate electrode G3 configures gate electrodes of the P channel MOS transistor PM4 and the N channel MOS transistor ND4. The gate electrode G4 configures gate electrodes of the P channel MOS transistor PM3 and the N channel MOS transistor ND3.

An N-type impurity region N1 is provided in the P-type well region PW1 along the X direction. The N-type impurity region N1 configures sources or drains of the N channel MOS transistors ND1, NT1, NT4, and ND4. An N-type impurity region N2 is provided in the P-type well region PW2 along the X direction. The N-type impurity region N2 configures sources or drains of the N channel MOS transistors NT2, ND2, ND3, and NT3. The N-type impurity regions N1 and N2 are semiconductor regions in each of which an N-type impurity is introduced.

P-type impurity regions P1, P2, and P3 are provided in the N-type well region NW along the X direction. The P-type impurity regions P1, P2, and P3 are semiconductor regions in each of which a P-type impurity is introduced. The P-type impurity region P1 configures a source or drain of the P channel MOS transistor PM1. In the forming area for the memory cell MC00, the P-type impurity region P2 configures a source or drain of the P channel MOS transistor PM2. In the forming area for the memory cell MC10, the P-type impurity region P2 configures a source or drain of the P channel MOS transistor PM3. The P-type impurity region P3 configures a source or drain of the P channel MOS transistor PM4.

The word line WLe0 is coupled to the gate electrodes G1 and G2 formed within the forming area for the memory cell MC00 and arranged between the gate electrodes G2 and G3 to extend in the X direction. The word line WLo0 is coupled to the gate electrodes G1 and G2 formed within the forming area for the memory cell MC10 and arranged between the gate electrodes G1 and G4 to extend in the X direction. That is, the word lines WLe0 and WLo0 are arranged to extend in the direction orthogonal to or crossing the gate electrodes G1, G2, G3, and G4. Or, the word lines WLe0 and WLo0 are arranged to extend in the same direction as the direction in which the N-type well region NW and the P-type well regions PW1 and PW2 extend. Alternatively, the word line WLe0 and WLo0 are arranged to extend in the direction orthogonal to or crossing the direction in which the N-type impurity regions N1 and N2 and the P-type impurity regions P1, P2, and P3 extend.

The bit line BL0 is provided to extend over the cell boundary on the upper side of the forming area for the memory cell MC00 along the Y direction and coupled to the N-type impurity region N2 being the source or drain of the NT2 at a coupling portion CT0. The bit line BL1 is provided to extend over the cell boundary between the forming area for the memory cell MC00 and the forming area for the memory cell MC10 along the Y direction and coupled to the N-type impurity region N1 being the sources or drains of the NT1 and NT4 at a coupling portion CT1. The bit line BL3 is provided to extend over the cell boundary on the lower side of the forming area for the memory cell MC10 along the Y direction and coupled to the N-type impurity region N2 being the source or drain of the NT3 at a coupling portion CT2.

As shown in FIG. 6, for example, the two MOS transistors are vertically formed side by side in the X direction in the forming area for the memory cell MC00 as in the NT1 and ND1 or NT2 and ND2. On the other hand, the three MOS transistors are formed side by side in the Y direction as in the NT1, PM2 and ND2, or ND1, PM1 and NT2. The forming area for the memory cell MC10 is also similar to the above.

The configuration of each memory cell in FIG. 6 will next be described in more detail using FIGS. 7 through 10.

Figure 7:
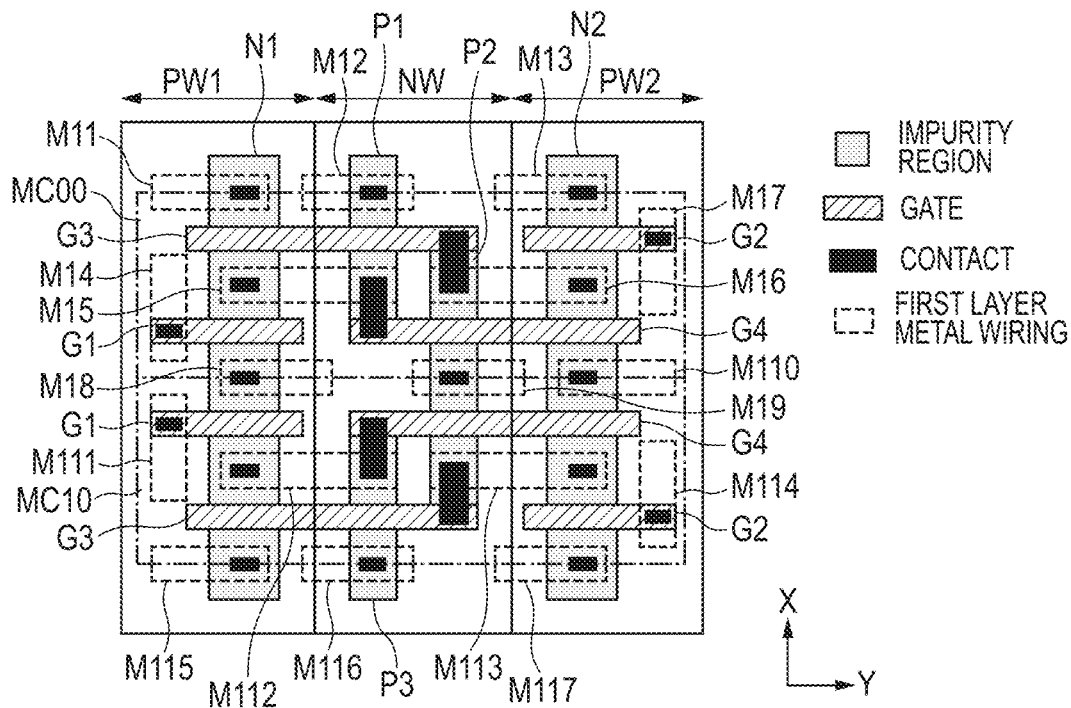
FIG. 7 is a diagram showing a layout arrangement of the memory cells formed with first layer metal wirings.

FIG. 7 is a diagram showing a layout arrangement of the memory cells formed with first layer metal wirings.

As described in FIG. 6, the P-type well regions PW1 and PW2, the N-type well region NW, the gate electrodes G1 through G4, the N-type impurity regions N1 and N2, and the P-type impurity regions P1, P2, and P3 are formed in the surface of the semiconductor substrate.

Further, in the forming areas for the memory cells MC00 and MC10, first layer metal wirings M11 through M19 and M110 through M117 indicated by dotted lines, and contacts are shown in FIG. 7.

The M11 is coupled to the N-type impurity region N1 configuring the source of the ND1 through the contact. The M11 is coupled to the ground potential VSS. The M12 is coupled to the P-type impurity region P1 configuring the source of the PM1 through the contact. The M12 is coupled to the power supply potential VDD. The M13 is coupled to the N-type impurity region N2 configuring the source or drain of the NT2 through the contact. The M13 is coupled to the bit line BL0. The M14 is coupled to the gate electrode G1 through the contact. The M14 is coupled to the word line WLe0. One end of the M15 is coupled to the N-type impurity region N1 configuring the drain of the ND1 or the source or drain of the NT1 through the contact. The other end of the M15 is coupled to the P-type impurity region P1 configuring the drain of the PM1 through the contact. Also, the other end of the M15 is coupled to the gate electrode G4 through the contact. One end of the M16 is coupled to the N-type impurity region N2 configuring the drain of the ND2 or the source or drain of the NT2 through the contact. The other end of the M16 is coupled to the P-type impurity region P2 configuring the drain of the PM2 through the contact. Also, the other end of the M16 is coupled to the gate electrode G3 through the contact. The M17 is coupled to the gate electrode G2 through the contact. The M17 is coupled to the word line WLe0. The M18 is coupled to the N-type impurity region N1 configuring the sources or drains of the NT1 and NT4 through the contact. The M18 is coupled to the bit line BL1. The M19 is coupled to the P-type impurity region P2 configuring the sources of the PM2 and PM3 through the contact. The M19 is coupled to the power supply potential VDD.

The M110 is coupled to the N-type impurity region N2 configuring the sources of the ND2 and ND3 through the contact. The M110 is coupled to the ground potential VSS. The M111 is coupled to the gate electrode G1 through the contact. The M111 is coupled to the word line WLo0. One end of the M112 is coupled to the N-type impurity region N1 configuring the drain of the ND4 or the source or drain of the NT4 through the contact. The other end of the M112 is coupled to the P-type impurity region P3 configuring the drain of the PM4 through the contact. Also, the other end of the M112 is coupled to the gate electrode G4 through the contact. One end of the M113 is coupled to the N-type impurity region N2 configuring the drain of the ND3 or the source or drain of the NT3 through the contact. The other end of the M113 is coupled to the P-type impurity region P2 configuring the drain of the PM3 through the contact. Also, the other end of the M113 is coupled to the gate electrode G3 through the contact. The M114 is coupled to the gate electrode G2 through the contact. The M114 is coupled to the word line WLo0. The M115 is coupled to the N-type impurity region N1 configuring the source of the ND4 through the contact. The M115 is coupled to the ground potential VSS. The M116 is coupled to the P-type impurity region P3 configuring the source of the PM4 through the contact. The M116 is coupled to the power supply potential VDD. The M117 is coupled to the N-type impurity region N2 configuring the source or drain of the NT3 through the contact. The M117 is coupled to the bit line BL2.

Figure 8:
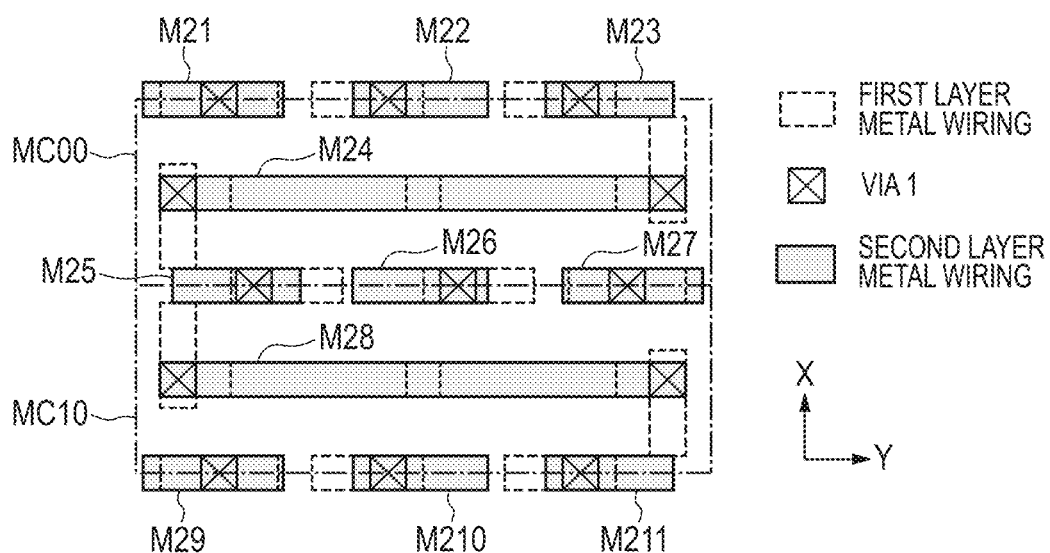
FIG. 8 is a diagram showing a layout arrangement of the memory cells formed with second layer metal wirings.

FIG. 8 is a diagram showing a layout arrangement of the memory cells formed with second layer metal wirings. Second layer metal wirings M21 through M29, M210, and M211, and first via electrodes (vias 1) are drawn in FIG. 8. The via electrodes are electrodes coupling the first layer metal wirings and the second layer metal wirings M21 through M29, M210, and M211. Incidentally, reference symbols for the first layer metal wirings are not drawn in FIG. 8 for simplification of the drawing.

The M21 is coupled to the M11 through the first via electrode. The M21 is coupled to the ground potential VSS. The M22 is coupled to the M12 through the first via electrode. The M22 is coupled to the power supply potential VDD. The M23 is coupled to the M13 through the first via electrode. The M23 is coupled to the bit line BL0. The M24 is coupled to the M14 and M17 through the first via electrodes. The M24 is coupled to the word line WLe0. The M25 is coupled to the M18 through the first via electrode. The M25 is coupled to the bit line BL1. The M26 is coupled to the M19 through the first via electrode. The M26 is coupled to the power supply potential VDD. The M27 is coupled to the M110 through the first via electrode. The M27 is coupled to the ground potential VSS. The M28 is coupled to the M111 and M114 through the first via electrodes. The M28 is coupled to the word line WLe0. The M29 is coupled to the M115 through the first via electrode. The M29 is coupled to the ground potential VSS. The M210 is coupled to the M116 through the first via electrode. The M210 is coupled to the power supply potential VDD. The M211 is coupled to the M117 through the first via electrode. The M211 is coupled to the bit line BL2.

Figure 9:
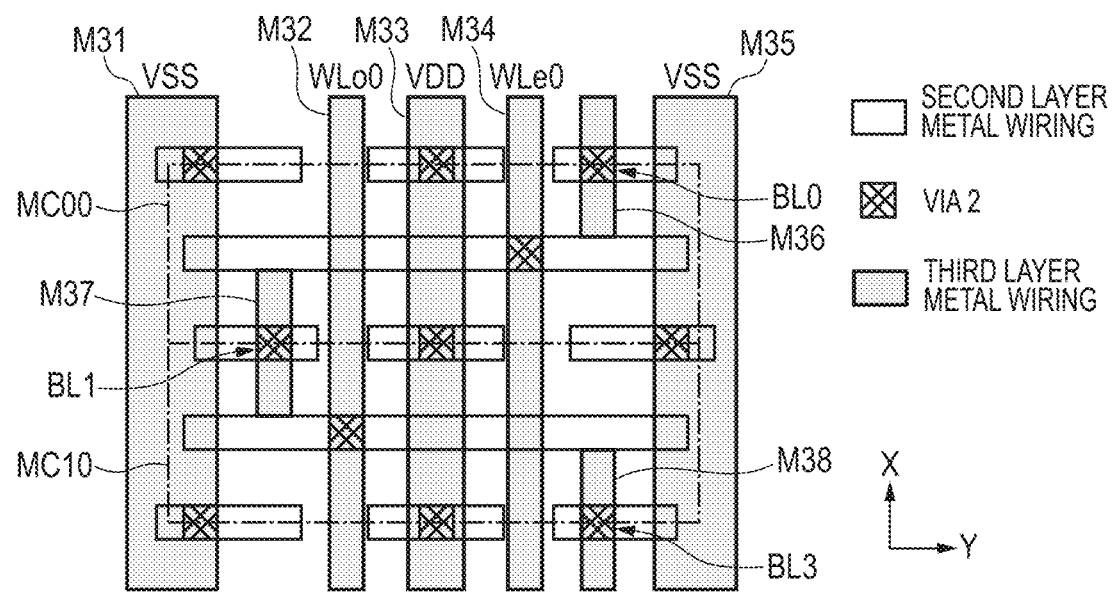
FIG. 9 is a diagram showing a layout arrangement of the memory cells formed with third layer metal wirings.

FIG. 9 is a diagram showing a layout arrangement of the memory cells formed with third layer metal wirings. Third layer metal wirings M31 through M38 arranged to extend in the X direction, and second via electrodes (vias 2) are drawn in FIG. 9. The second via electrodes are electrodes coupling the second layer metal wirings and the third layer metal wirings M31 through M38. Incidentally, reference symbols for the second layer metal wirings are not drawn in FIG. 9 for simplification of the drawing.

The M31 is a wiring supplied with the ground potential VSS and is coupled to the M21 and M29 through the second via electrodes. The M32 is the word line WLo0 and is coupled to the M28 through the second via electrode. The M33 is a wiring supplied with the power supply potential VDD and is coupled to the M22, M26, and M210 through the second via electrodes. The M34 is the word line WLe0 and is coupled to the M24 through the second via electrode. The M35 is a wiring supplied with the ground potential VSS and is coupled to the M27 through the second via electrode. The M36 is coupled to the M23 through the second via electrode. The M36 is coupled to the bit line BL0. The M37 is coupled to the M25 through the second via electrode. The M37 is coupled to the bit line BL1. The M38 is coupled to the M211 through the second via electrode. The M38 is coupled to the bit line BL2.

Figure 10:
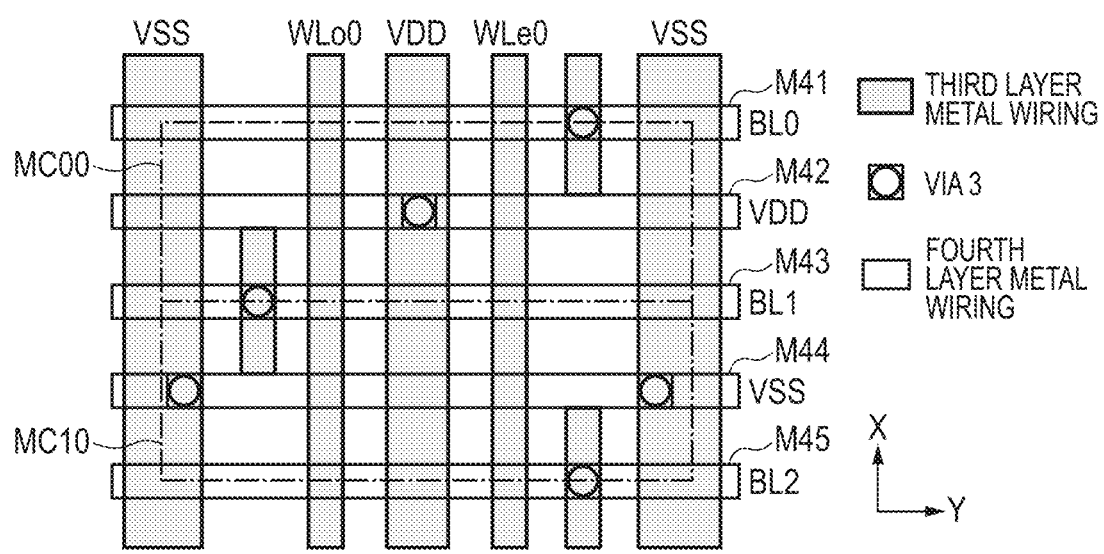
FIG. 10 is a diagram showing a layout arrangement of the memory cells formed with fourth layer metal wirings.

FIG. 10 is a diagram showing a layout arrangement of the memory cells formed with fourth layer metal wirings. Fourth layer metal wirings M41 through M45 arranged to extend in the Y direction, and third via electrodes (vias 3) are drawn in FIG. 10. The third via electrodes are electrodes coupling the third layer metal wirings and the fourth layer metal wirings M41 through M45. Incidentally, reference symbols for the third layer metal wirings are not drawn in FIG. 10 for simplification of the drawing.

The M41 is a bit line BL0 and is coupled to the M36 through the third via electrode. The M42 is a power supply wiring supplied with the power supply potential VDD and is coupled to the M33 through the third via electrode. The M43 is a bit line BL1 and is coupled to the M37 through the third via electrode. The M44 is a power supply wiring supplied with the ground potential VSS and is coupled to the M31 and M35 through the third via electrodes. The M45 is a bit line BL2 and is coupled to the M38 through the third via electrode.

Thus, the memory cells using the first through fourth layer metal wirings are formed as shown in FIGS. 7 through 10.

Incidentally, although the exemplary embodiment 1 has shown the configuration example in which the word lines WLo0 and WLe0 are formed by the third layer metal wirings, and the bit lines BL0, BL1, and BL2 are formed by the fourth layer metal wirings, the present embodiment is not limited to it. The bit lines BL0, BL1, and BL2 may be changed so that they are formed by the third layer metal wirings, and the word lines WLo0 and WLe0 may be changed so that they are formed by the fourth layer metal wirings.

According to the exemplary embodiment 1, since in plan view, the length of each word line can be made short even if the rectangular-shaped memory cells each slender in the Y direction are used, the parasitic resistance and capacitance of the word line WL can be reduced as with the embodiment. Therefore, it is possible to make fast the rise of the word line WL to a selection level. Thus, it is possible to make fast an address access time for data reading in the semiconductor memory device.

Further, since the fall of the word line WL from the selection level to a non-selection level becomes also fast, an address access interval for continuous data reading or data writing in the semiconductor memory device can be made short. It is therefore possible to provide a high-speed semiconductor memory device.

(Modification)

A modification will be described using FIGS. 11 through 13. The modification enables each memory cell to be formed by first through third layer metal wirings by the use of local interconnects (local wirings, LIC: Local Inter Connect).

Figure 11:
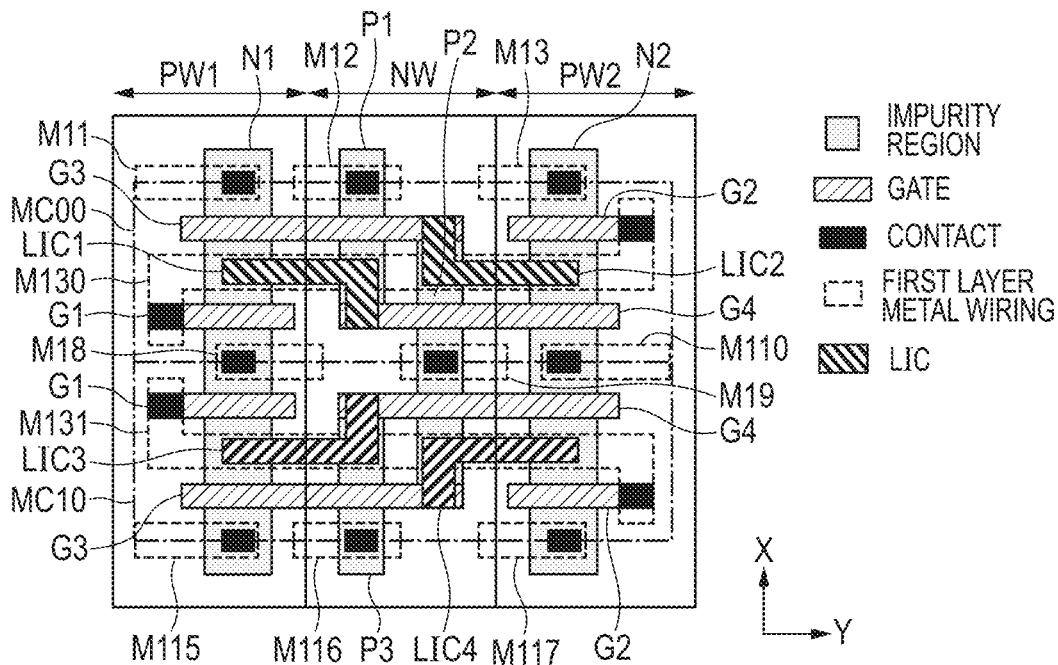
FIG. 11 is a diagram showing a layout arrangement of each memory cell according to a modification.

FIG. 11 is a diagram showing a layout arrangement of each memory cell according to the modification. FIG. 11 shows a case wherein two local interconnects (local wirings: LIC1, LIC2, LIC3, LIC4) are used in each of the areas for the memory cells MC00 and MC10. In FIG. 11, portions different from FIG. 7 are as follows.

The first layer metal wiring M15 and the contact in FIG. 7 are changed to the local interconnect LIC1 in FIG. 11. The first layer metal wiring M16 and the contact in FIG. 7 are changed to the local interconnect LIC2 in FIG. 11. The first layer metal wiring M112 and the contact in FIG. 7 are changed to the local interconnect LIC3 in FIG. 11. The first layer metal wiring M113 and the contact in FIG. 7 are changed to the local interconnect LIC4 in FIG. 11. Also, in the forming area for the MC00, the first layer metal wirings M14 and M15 in FIG. 7 are changed to a first layer metal wiring M130 coupling gate electrodes G1 and G2 in FIG. 11 on the basis of the above changes. Further, in the forming area for the memory cell MC10, the first layer metal wirings M111 and M114 in FIG. 7 are changed to a first layer metal wiring M131 coupling the gate electrodes G1 and G2 in FIG. 11. Since other configurations are the same as in FIG. 7, their description will be omitted.

Figure 12:
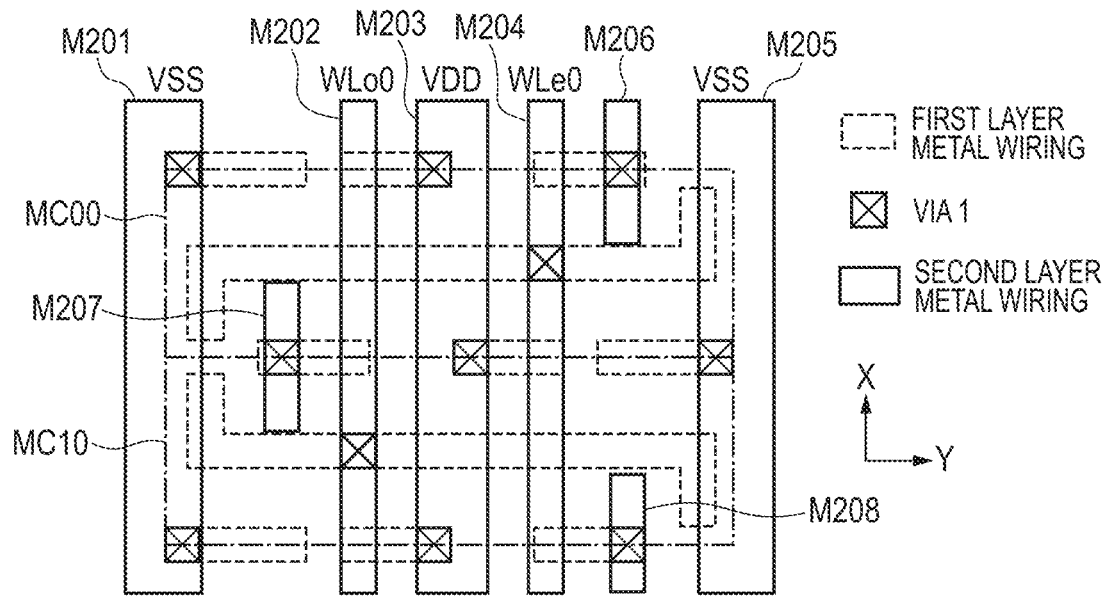
FIG. 12 is a diagram showing a layout arrangement of each memory cell formed with second layer metal wirings.

FIG. 12 is a diagram showing a layout arrangement of each memory cell formed with second layer metal wirings. Second layer metal wirings M201 through M208 arranged to extend in the X direction, and first via electrodes (vias 1) are drawn in FIG. 12. Incidentally, reference symbols for the first layer metal wirings are not drawn in FIG. 12 for simplification of the drawing.

The M201 is a wiring supplied with the ground potential VSS and is coupled to the M11 and M115 through the first via electrodes. The M202 is the word line WLo0 and is coupled to the M131 through the first via electrode. The M203 is a wiring supplied with the power supply potential VDD and is coupled to the M12, M19, and M116 through the first via electrodes. The M204 is the word line WLe0 and is coupled to the M130 through the first via electrode. The M205 is a wiring supplied with the ground potential VSS and is coupled to the M110 through the first via electrode. The M206 is coupled to the M13 through the first via electrode. The M206 is coupled to the bit line BL0. The M207 is coupled to the M18 through the first via electrode. The M207 is coupled to the bit line BL1. The M208 is coupled to the M117 through the first via electrode. The M208 is coupled to the bit line BL2.

Figure 13:
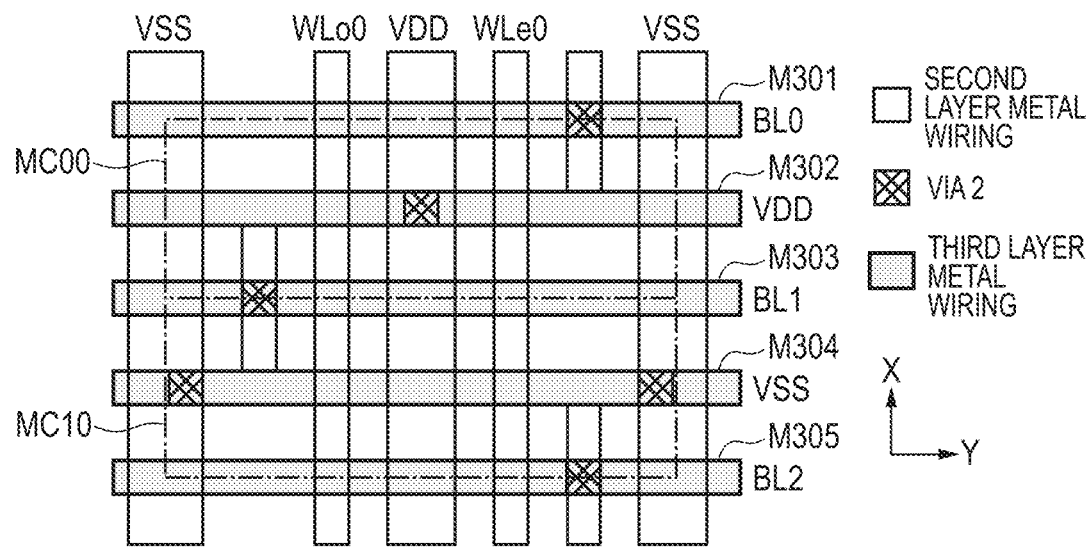
FIG. 13 is a diagram showing a layout arrangement of each memory cell formed with third layer metal wirings.

FIG. 13 is a diagram showing a layout arrangement of each memory cell formed with third layer metal wirings. Third layer metal wirings M301 through M305 arranged to extend in the Y direction, and second via electrodes (vias 3) are drawn in FIG. 13. Incidentally, reference symbols for the second layer metal wirings are not drawn in FIG. 13 for simplification of the drawing.

The M301 is a bit line BL0 and is coupled to the M206 through the second via electrode. The M302 is a power supply wiring supplied with the power supply potential VDD and is coupled to the M203 through the second via electrode. The M303 is a bit line BL1 and is coupled to the M207 through the second via electrode. The M304 is a power supply wiring supplied with the ground potential VSS and is coupled to the M201 and M205 through the second via electrodes. The M305 is a bit line BL2 and is coupled to the M208 through the second via electrode.

Although the modification has shown the configuration example in which the word lines WLo0 and WLe0 are formed by the second layer metal wirings, and the bit lines BL0, BL1, and BL2 are formed by the third layer metal wirings, the present modification is not limited to it. The bit lines BL0, BL1, and BL2 may be changed so that they are formed by the second layer metal wirings, and the word lines WLo0 and WLe0 may be changed so that they are formed by the third layer metal wirings.

According to the modification, the memory cells using the first through third layer metal wirings are formed as shown in FIGS. 11 through 13. That is, since the memory cells are formed by the first through third layer metal wirings without using the metal wirings of the four layers as compared with the exemplary embodiment 1, the manufacturing process of the semiconductor memory device can be reduced. Thus, it is possible to reduce the manufacturing cost of the semiconductor memory device.

(Application)

Figure 14:
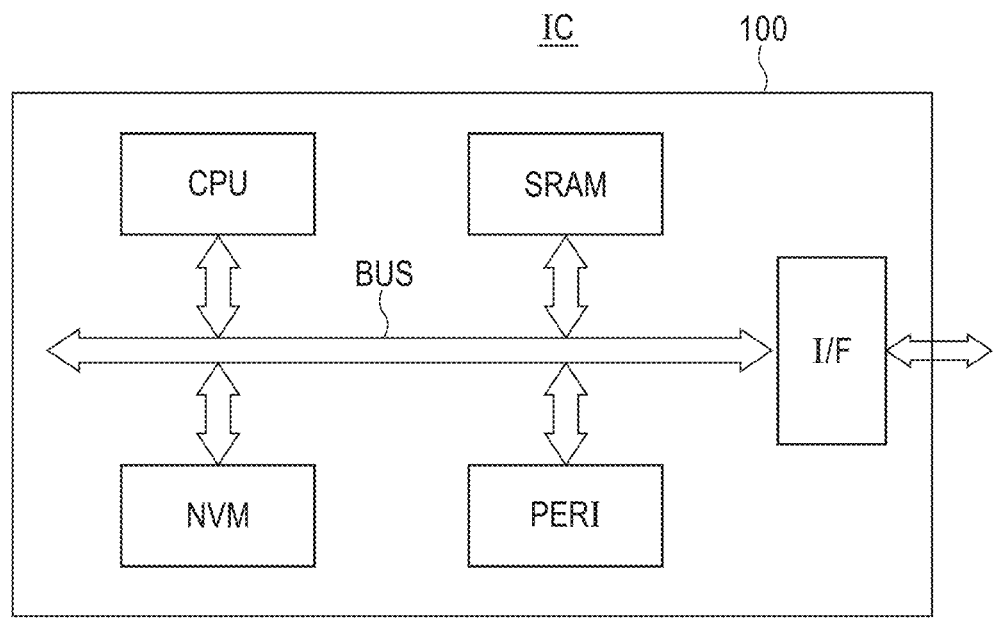
FIG. 14 is a block diagram showing the configuration of a semiconductor device according to an application.

FIG. 14 is a block diagram showing the configuration of a semiconductor device according to an application. A microcomputer being one example of a semiconductor device IC is shown in FIG. 14. The semiconductor device IC is configured to include a central processing unit CPU, a volatile semiconductor memory device SRAM, a non-volatile memory device NVM like a flash memory, a peripheral circuit PERI, an interface circuit I/F, and a bus BUS intercoupling these with each other in one semiconductor chip (semiconductor substrate) 100 like a silicon single crystal. The volatile semiconductor memory device SRAM is utilized as a memory area for storing temporary data of the central processing unit CPU. The non-volatile memory device NVM is utilized as a memory area for storing a control program executed by the central processing unit CPU.

The semiconductor memory devices 1 and 1a described in the embodiment, the exemplary embodiment, and the modification can be used in the volatile semiconductor memory device SRAM.

An exemplary embodiment 2 will next be described using the drawings. The exemplary embodiment 2 corresponds to a configuration example in which the exemplary embodiment 1 is applied to a TCAM (Ternary Content Addressable Memory) being one of content-addressable memories.

Figure 15:
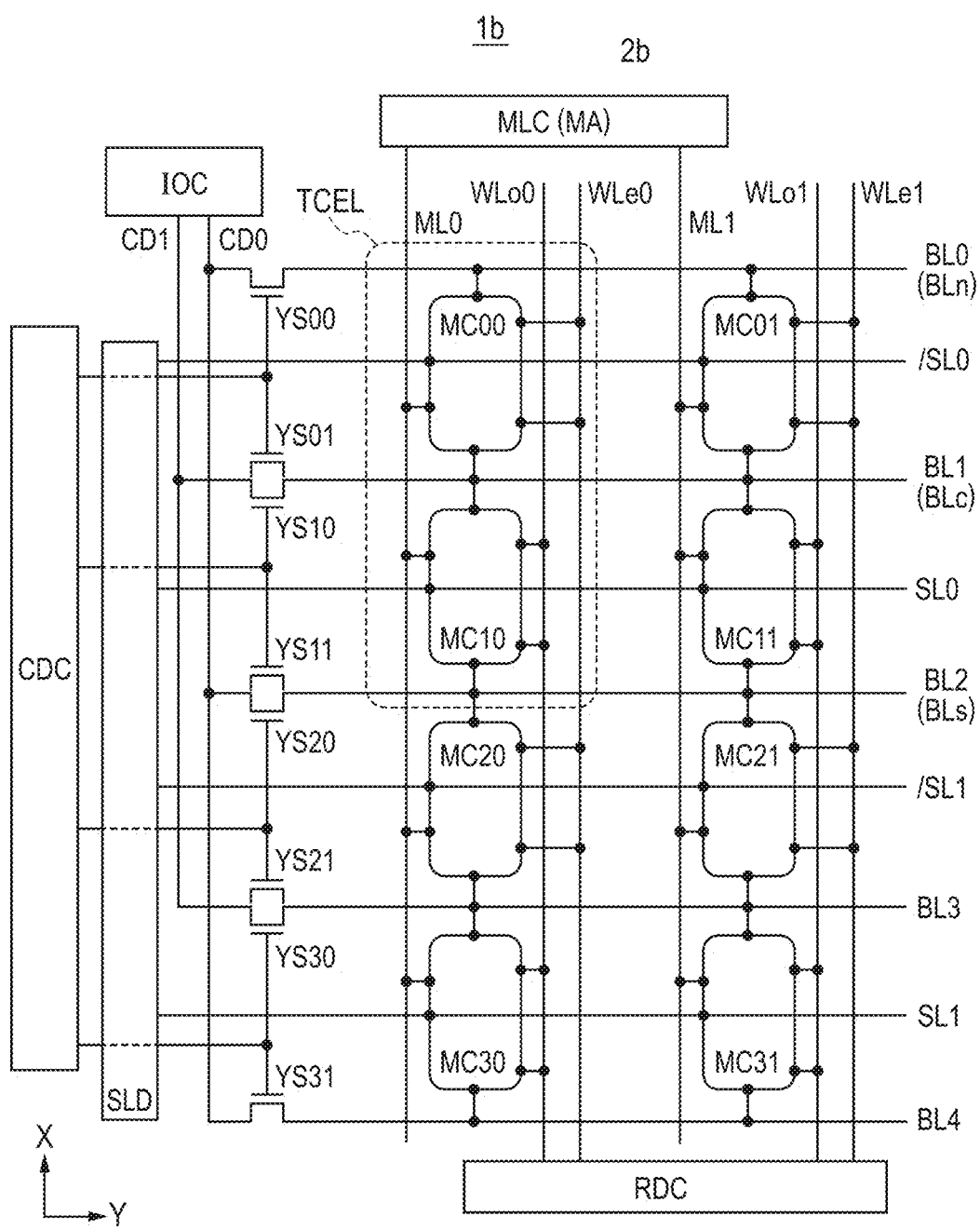
FIG. 15 is a diagram describing a configuration example of a semiconductor memory device according to an exemplary embodiment 2.

FIG. 15 is a diagram describing a configuration example of a semiconductor memory device according to the exemplary embodiment 2. The semiconductor memory device 1b is a TCAM and is formed over the surface of a semiconductor substrate like single crystal silicon, for example by the known CMOS semiconductor manufacturing method. As illustratively shown, the semiconductor memory device 1b has a memory array 2b including eight memory cells (MC00 through MC31) arranged in 2 rows and 4 columns. The memory cells MC00 and MC10 configure one TCAM cell TCEL. Likewise, the memory cells MC20 and MC30 configure one TCAM cell TCEL. The memory cells MC01 and MC11 configure one TCAM cell TCEL. The memory cells MC21 and MC31 configure one TCAM cell TCEL.

In FIG. 15, since write and read operations to and from the memory cells (MC00 through MC31) of the semiconductor memory device 1b are the same as those in the semiconductor memory device 1a of FIG. 4, their description will be omitted. The semiconductor memory device 1b differs from the semiconductor memory device 1a of FIG. 4 in that match lines (ML0, ML1), search line pairs (SL0, /SL0, SL1, /SL1), a match line control circuit MLC, and a search line driver SLD are provided.

The match line ML0 is coupled to the memory cells MC00, MC10, MC20, and MC30 which configure one row. The match line ML1 is coupled to the memory cells MC01, MC11, MC21, and MC31 which configure one row. The match lines ML0 and ML1 are coupled to the match line control circuit MLC including a match amplifier MA.

Of the search line pair SL0, /SL0, the search line /SL0 is coupled to the memory cells MC00 and MC01 which configure one column, and the search line SL0 is coupled to the memory cells MC10 and MC11 which configure one column. Of the search line pair SL1, /SL1, the search line /SL1 is coupled to the memory cells MC20 and MC21 which configure one column, and the search line SL1 is coupled to the memory cells MC30 and MC31 which configure one column. The search line pairs (SL0, /SL0 and SL1, /SL1) are coupled to the search line driver SLD and supplied with search data from the search line driver SLD.

In FIG. 15, the memory cells MC00, MC10, MC20, and MC30 which configure one row store one entry data therein. Likewise, the memory cells MC01, MC11, MC21, and MC31 which configure one row store one entry data therein. In a search operation, the search data supplied from the search line driver SLD is compared with each entry data to determine whether they are matched (match) or unmatched (mismatch or miss). When the search data supplied from the search line driver SLD is the same (coincidence: match) as the entry data, the match lines (ML0, ML1) are maintained at, for example, a precharge level like a high level. On the other hand, when the search data is different from the entry data (noncoincidence: mismatch or miss), the match lines (ML0, ML1) are changed from the precharge level to a low level, for example. The match amplifier MA included in the match line control circuit MLC detects the potential of each of the match lines (ML0, ML1) and outputs information about the math or mismatch.

Figure 16:
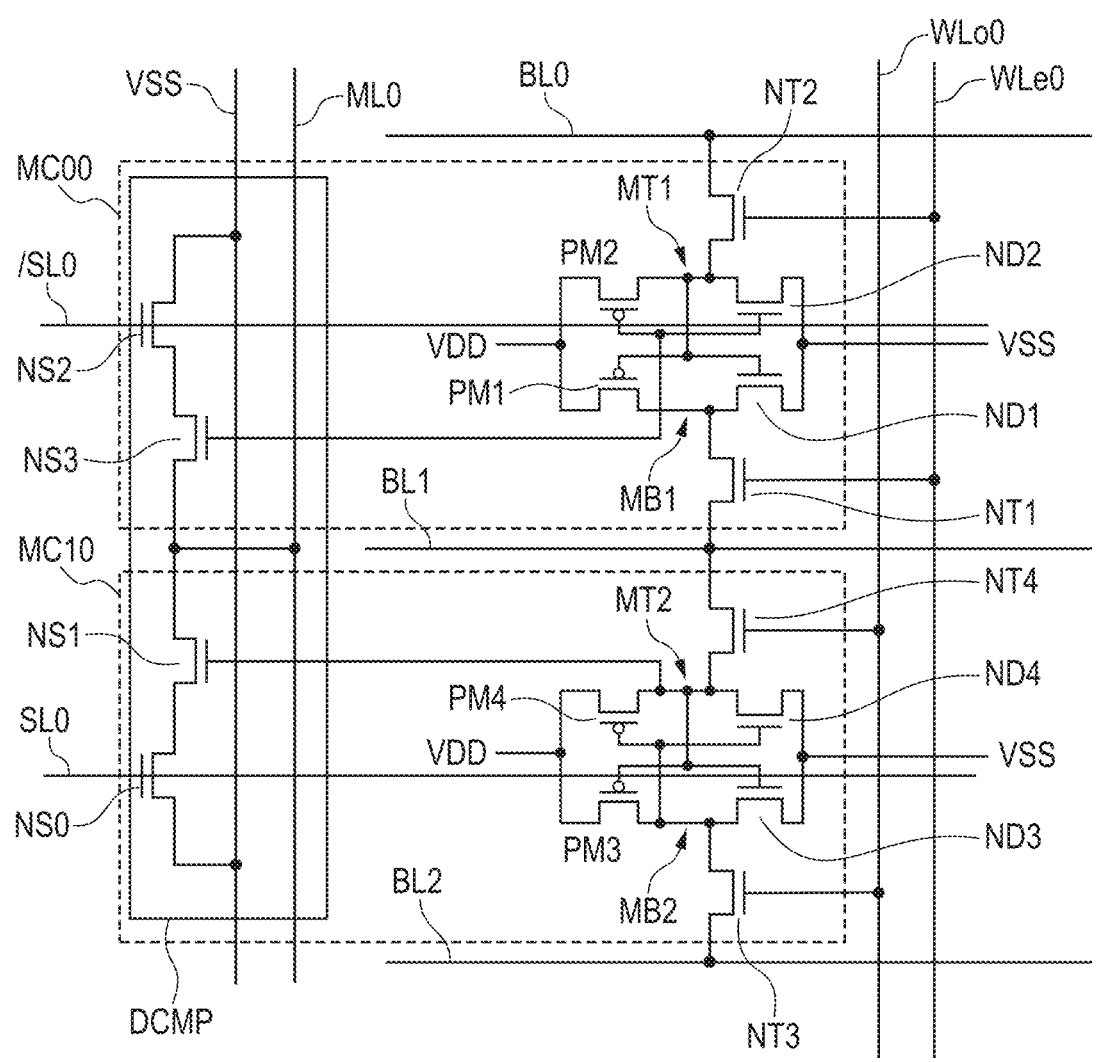
FIG. 16 is a diagram showing a circuit example of a TCAM cell.

FIG. 16 is a diagram showing a circuit example of the TCAM cell TCEL. FIG. 16 differs from FIG. 5 in that a data comparison circuit DCMP is provided. The data comparison circuit DCMP includes four N channel MOS transistors (NS0 through NS3). A source-drain path of the N channel MOS transistor NS0 and a source-drain path of the N channel MOS transistor NS1 are coupled in series between the match line ML0 and a supply line for a ground potential VSS. A gate of the N channel MOS transistor NS0 is coupled to one (search line SL0) of the search line pair (SL0, /SL0). A gate of the N channel MOS transistor NS1 is coupled to a first memory node MT2 of the memory cell MC10. Further, a source-drain path of the N channel MOS transistor NS2 and a source-drain path of the N channel MOS transistor NS3 are coupled in series between the match line ML0 and the supply line for the ground potential VSS. A gate of the N channel MOS transistor NS2 is coupled to the other (search line /SL0) of the search line pair (SL0, /SL0). A gate of the N channel MOS transistor NS3 is coupled to a second memory node MB1 of the memory cell MC00.

The one TCAM cell TCEL is capable of storing three values of "0", "1", and "*" (: don't care) as TCAM data by using SRAM cells of two bits. For example, when "0" is stored in the memory node MB1 of the MC00, and "1" is stored in the memory node MT2 of the MC10, "0" is assumed to be stored in the TCAM cell TCEL. When "1" is stored in the memory node MB1 of the MC00, and "0" is stored in the memory node MT2 of the MC10, "1" is assumed to be stored in the TCAM cell TCEL. When "0" is stored in the memory node MB1 of the MC00, and "0" is stored in the memory node MT2 of the MC10, "*" (don't care) is assumed to be stored in the TCAM cell TCEL. This approach is not used where "1" is stored in the memory node MB1 of the MC00, and "1" is stored in the memory node MT2 of the MC10.

Since the MOS transistors NS0 and NS1 are brought into an on state where the search data is "1" (i.e., the search line SL0 is at "1" and the search line /SL0 is at "0"), and the TCAM data is "0" (memory node MB1 is at "0" and memory node MT2 is at "1"), the potential of the precharged match line ML is pulled up to the ground potential.

Since the MOS transistors NS2 and NS3 are brought into an on state where the search data is "0" (i.e., search line SL is at "0", and search line SL_n is at "1"), and the TCAM data is "1" (memory node MB1 is at "1" and memory node MT2 is at "0"), the potential of the precharged match line ML is pulled up to the ground potential. That is, when the search data and the TCAM data do not match with each other, the potential of the match line ML is pulled up to the ground potential.

On the contrary, when the input search data "1" and the TCAM data is "1" or "*", or when the search data is "0" and the TCAM data is "0" or "*" (i.e., when both match with each other), the potential (power supply potential VDD level) of the precharged match line ML is maintained.

In the TCAM as described above, unless data of all TCAM cells coupled to the match line ML corresponding to one entry (row) match with the input search data, the electric charge accumulated in the match line ML is pulled up. Therefore, a problem arises in that retrieval in the TCAM is speedy, but current consumption is large.

Figure 17:
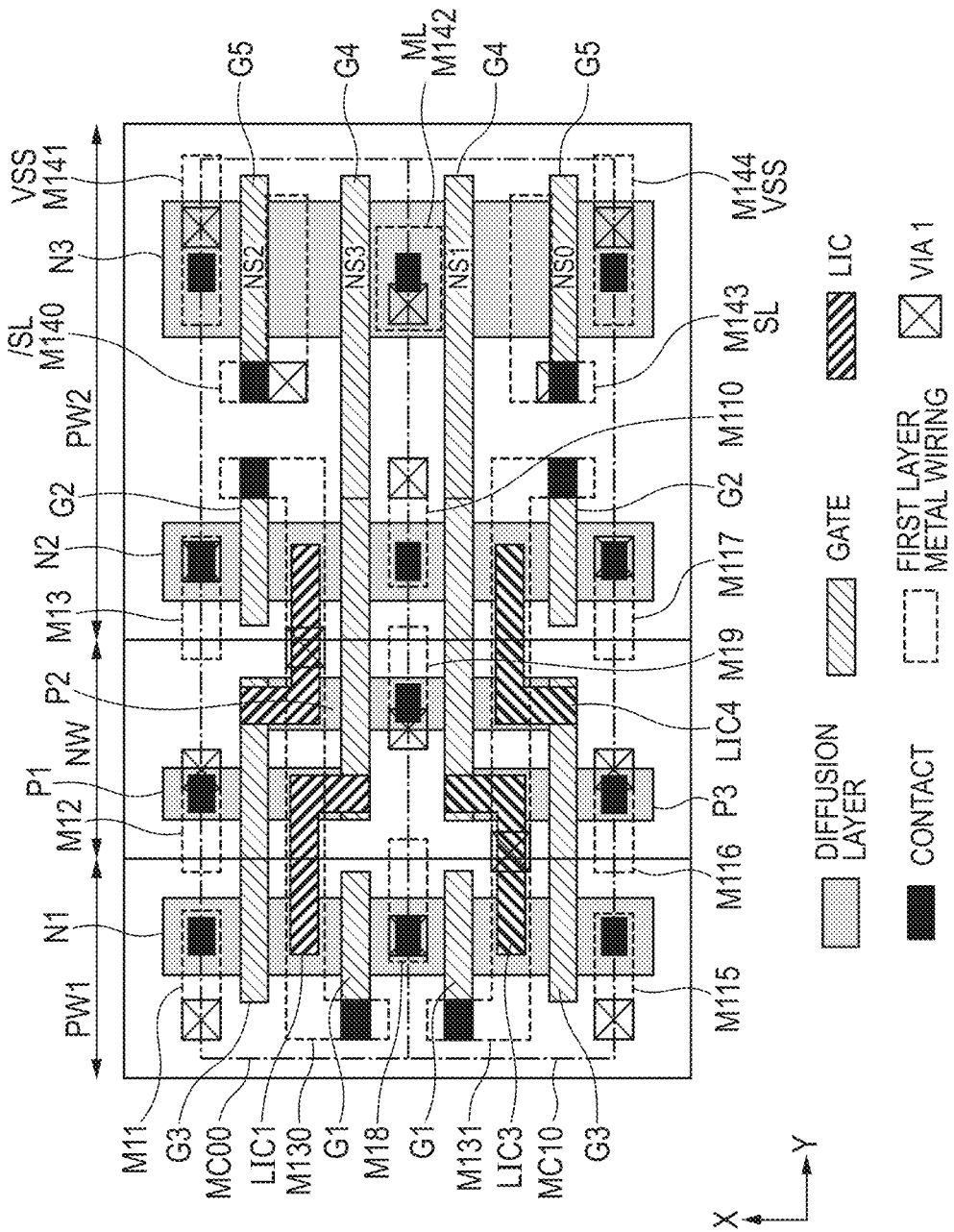
FIG. 17 is a diagram showing a layout arrangement of the TCAM cell formed with first layer metal wirings.
Figure 18:
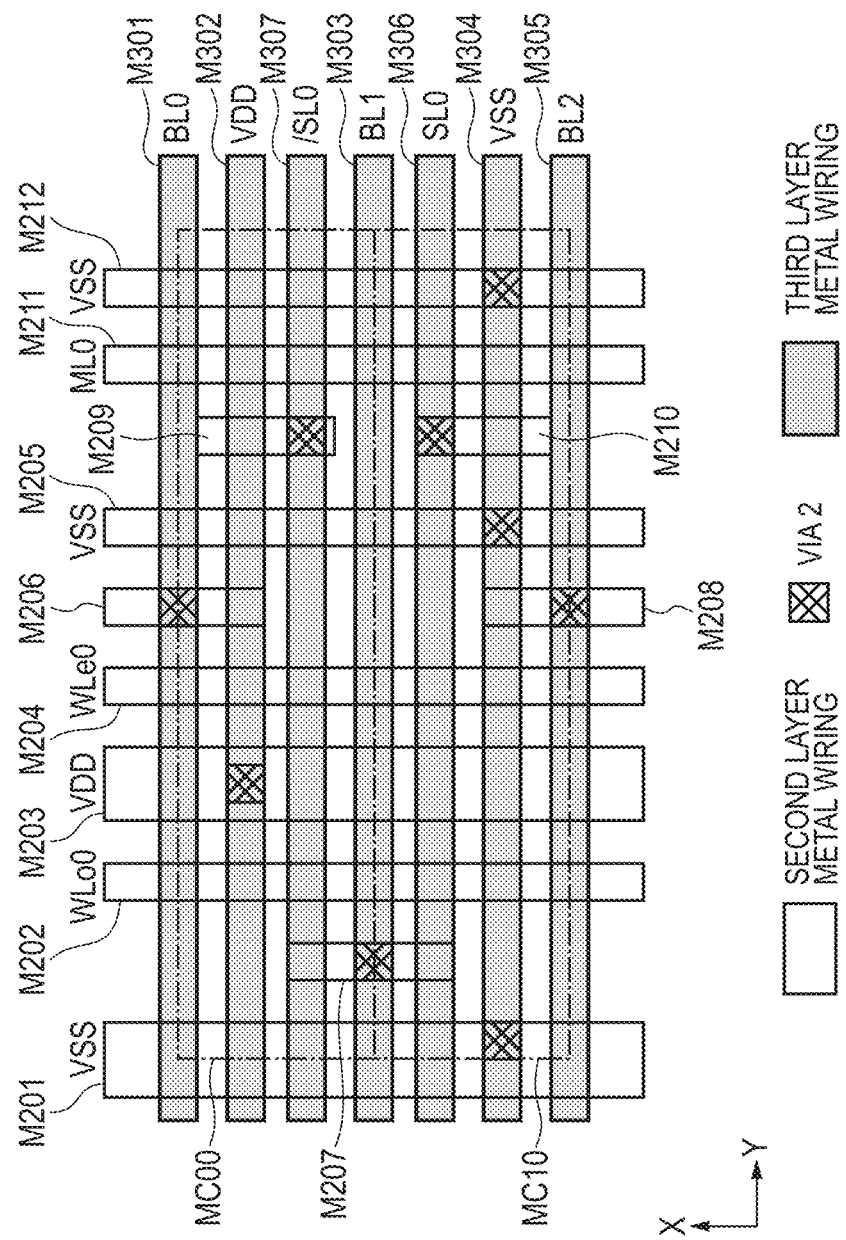
FIG. 18 is a diagram showing a layout arrangement of the TCAM cell formed with second layer metal wirings and third layer metal wirings.

FIG. 17 is a diagram showing a layout arrangement of the TCAM cell formed with first layer metal wirings. FIG. 18 is a diagram showing a layout arrangement of the TCAM cell formed with second layer metal wirings and third layer metal wirings. The layout arrangement shown in each of FIGS. 17 and 18 is one obtained by adding a match line (ML0), a search line pair (SL0, /SL0), and four N channel MOS transistors (NS0 through NS3) to the layout arrangement of each memory cell in each of FIGS. 11 through 13. In the following description in FIGS. 17 and 18, portions different from those in FIGS. 11 through 13 will be mainly described. Incidentally, in FIGS. 17 and 18, a first via electrode (via 1) indicates an electrode coupling the first layer metal wiring and the second layer metal wiring, and a second via electrode (via 2) indicates an electrode coupling the second layer metal wiring and the third layer metal wiring.

In FIG. 17, gate electrodes G5 are extended in the Y direction in the respective forming areas for the memory cells MC00 and MC10 in correspondence with the provision of the N channel MOS transistors (NS0 through NS3). Further, gate electrodes G4 are extended in the Y direction. In the forming area for the memory cell MC00, the gate electrode G5 configures a gate electrode of the N channel MOS transistor NS2. The extended gate electrode G4 configures a gate electrode of the N channel MOS transistor NS3. In the forming area for the memory cell MC10, the gate electrode G5 configures a gate electrode of the N channel MOS transistor NS0, and the extended gate electrode G4 configures a gate electrode of the N channel MOS transistor NS1.

An N-type impurity region N3 is provided in a P-type well region PW2 along an X direction. The N-type impurity region N3 configures sources or drains of the N channel MOS transistors NS0, NS1, NS2, and NS3. The N-type impurity region N3 is a semiconductor region in which an N-type impurity is introduced.

The first layer metal wiring M140 is coupled to the gate electrode G5 of the N channel MOS transistor NS2 through a contact. The M140 is coupled to the search line /SL through the via 1. The first layer metal wiring M141 is coupled to the N-type impurity region N3 configuring the source of the N channel MOS transistor NS2 through a contact. The M141 is coupled to a ground potential VSS through the via 1. The first layer metal wiring M142 is coupled to the N-type impurity region N3 configuring the drains of the N channel MOS transistors NS3 and NS1 through a contact. The M142 is coupled to the match line ML through the via 1. The first layer metal wiring M143 is coupled to the gate electrode G5 of the N channel MOS transistor NS0 through a contact. The M143 is coupled to the search line SL through the via 1. The first layer metal wiring M144 is coupled to the N-type impurity region N3 configuring the source of the N channel MOS transistor NS0 through a contact. The M144 is coupled to the ground potential VSS through the via 1.

Second layer metal wirings M209 through M212 and third layer metal wirings M306 and M307 are provided anew in FIG. 18.

The second layer metal wiring M209 couples the gate electrode G5 of the N channel MOS transistor NS2 to the third layer metal wiring M307 through the via 2. The third layer metal wiring M307 is a search line /SL arranged between the third layer metal wiring M302 and the third layer metal wiring M303 and provided to extend in the Y direction. The second layer metal wiring M210 couples the gate electrode G5 of the N channel MOS transistor NS0 to the third layer metal wiring M306 through the via 2. The third layer metal wiring M306 is a search line SL arranged between the third layer metal wiring M303 and the third layer metal wiring M304 and provided to extend in the Y direction. The second layer metal wiring M211 is a match line ML provided to extend in the X direction. The second layer metal wiring M212 is a ground wiring VSS provided to extend in the X direction. The M212 is coupled to the M141 and M144 through the vias 1 and coupled to the third layer metal wiring M304 through the via 2.

According to the exemplary embodiment 2, since the length of the word line can be made short in plan view even if the rectangular-shaped memory cell slender in the Y direction is used, the parasitic resistance and capacitance of the word line WL can be reduced as with the embodiment and the exemplary embodiment 1. Therefore, the rise of the word line WL to a selection level can be made fast. Accordingly, it is possible to make fast an address access time for data reading in the semiconductor memory device.

Further, the match line ML is arranged in the direction orthogonal to or crossing the direction of arrangement of the gate electrodes (G1 through G5). Besides, the source lines (SL0, /SL0, SL1, /SL1) are placed in the same direction as the direction of arrangement of the gate electrodes (G1 through G5) and the direction of arrangement of the gate electrodes (G1 through G5) of the memory cells MC. Thus, the TCAM memory can be configured.

The ground potential VSS is stabilized by making wiring in a mesh form by the second layer metal wirings M201, M205, and M212 provided in the X direction and the third layer metal wiring M304 provided in the Y direction. Further, the power supply potential VDD is stabilized by making wiring in a mesh form by the second layer metal wiring M203 provided in the X direction and the third layer metal wiring M302 provided in the Y direction.

(Modification 2)

A modification of the exemplary embodiment 2 will next be described using FIGS. 19 through 23.

The modification 2 is configured to couple sources of N channel MOS transistors NS0 and NS2 included in a data comparison circuit DCMP to a local ground wiring LVSS separated from a ground potential VSS. Thus, it is possible to reduce power consumption of a semiconductor memory device due to charging and discharging of a match line ML.

Figure 19:
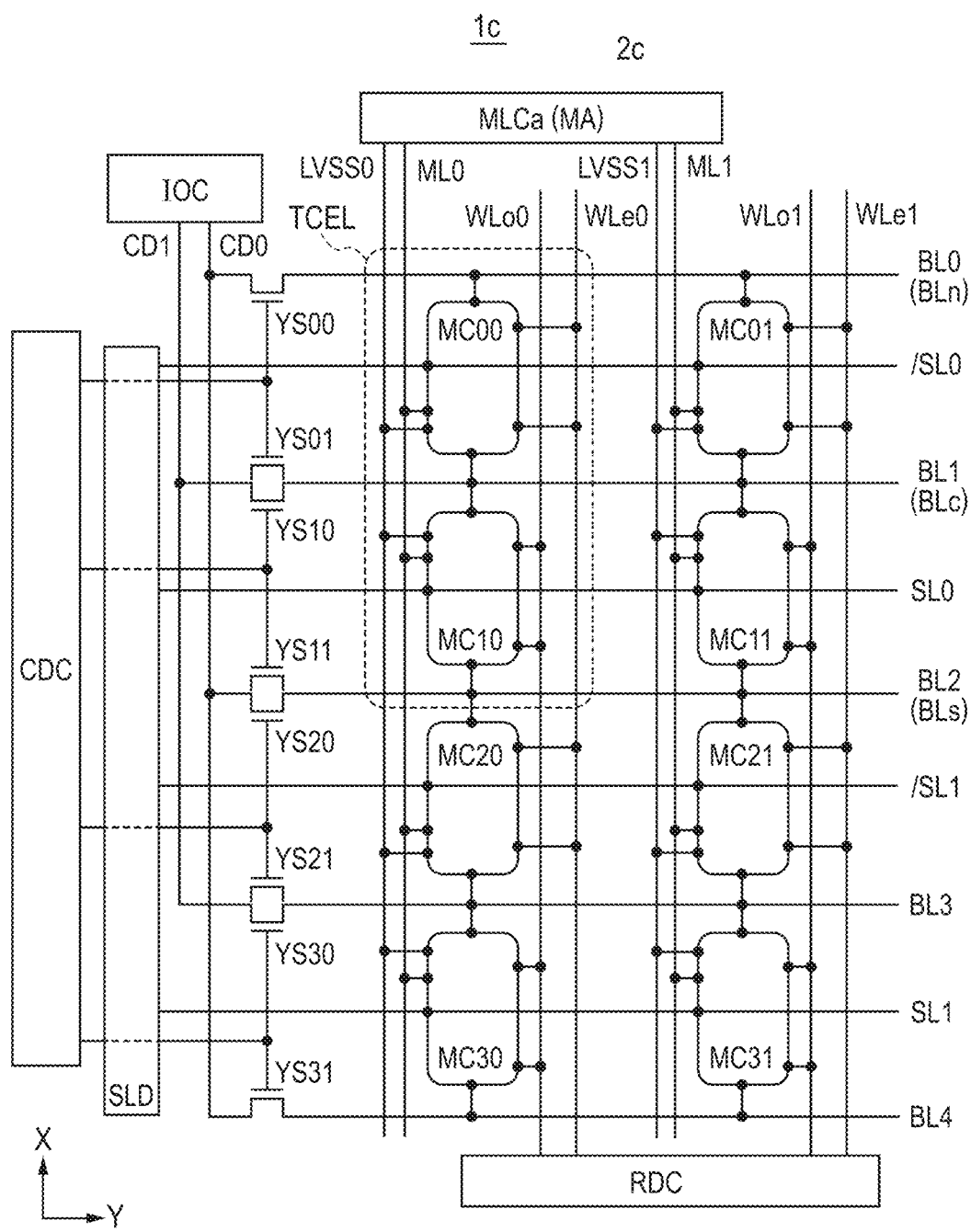
FIG. 19 is a diagram describing a configuration example of a semiconductor memory device according to a modification 2.
Figure 20:
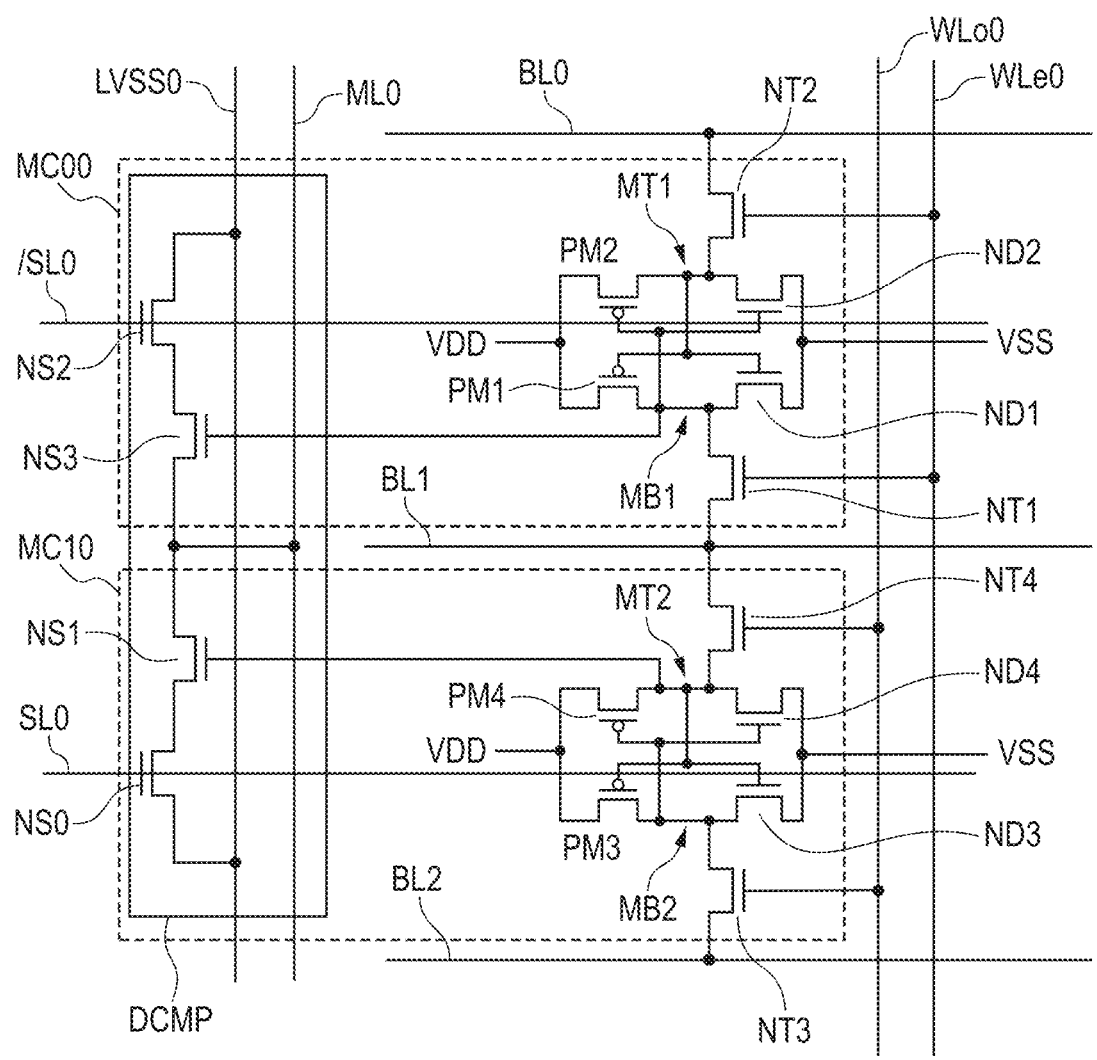
FIG. 20 is a diagram showing a circuit example of a TCAM cell according to the modification 2.
Figure 21A:
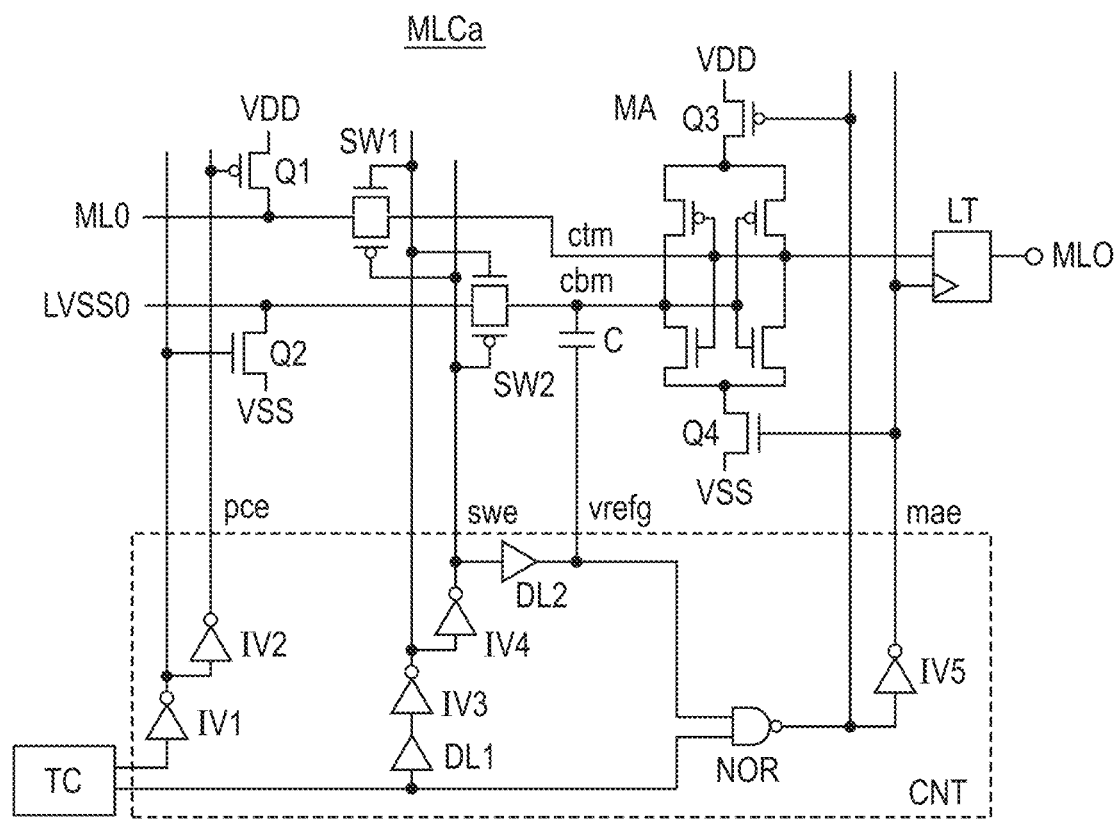
FIGS. 21A and 21B are diagrams showing a configuration example of a match line control circuit and its operation example.
Figure 21B:
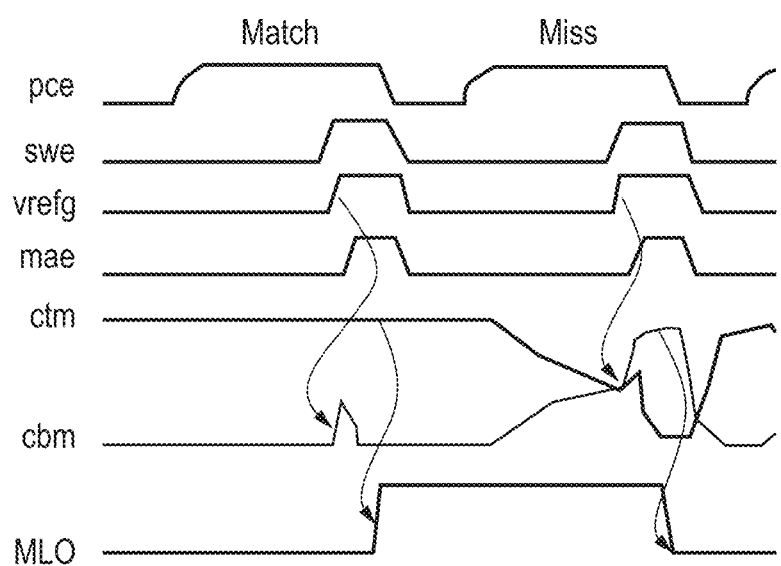
Figure 22:
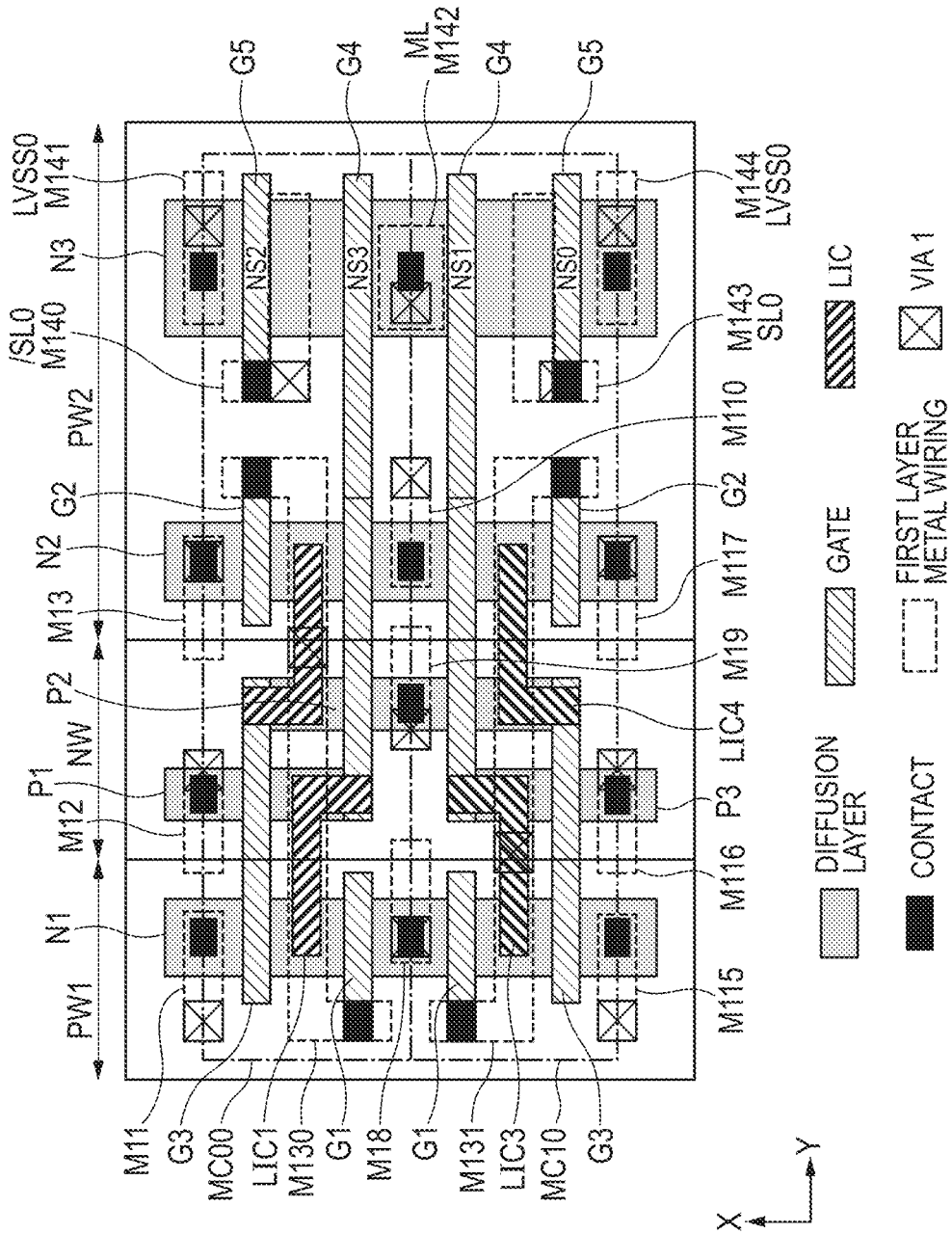
FIG. 22 is a diagram showing a layout arrangement of the TCAM cell formed with first layer metal wirings.
Figure 23:
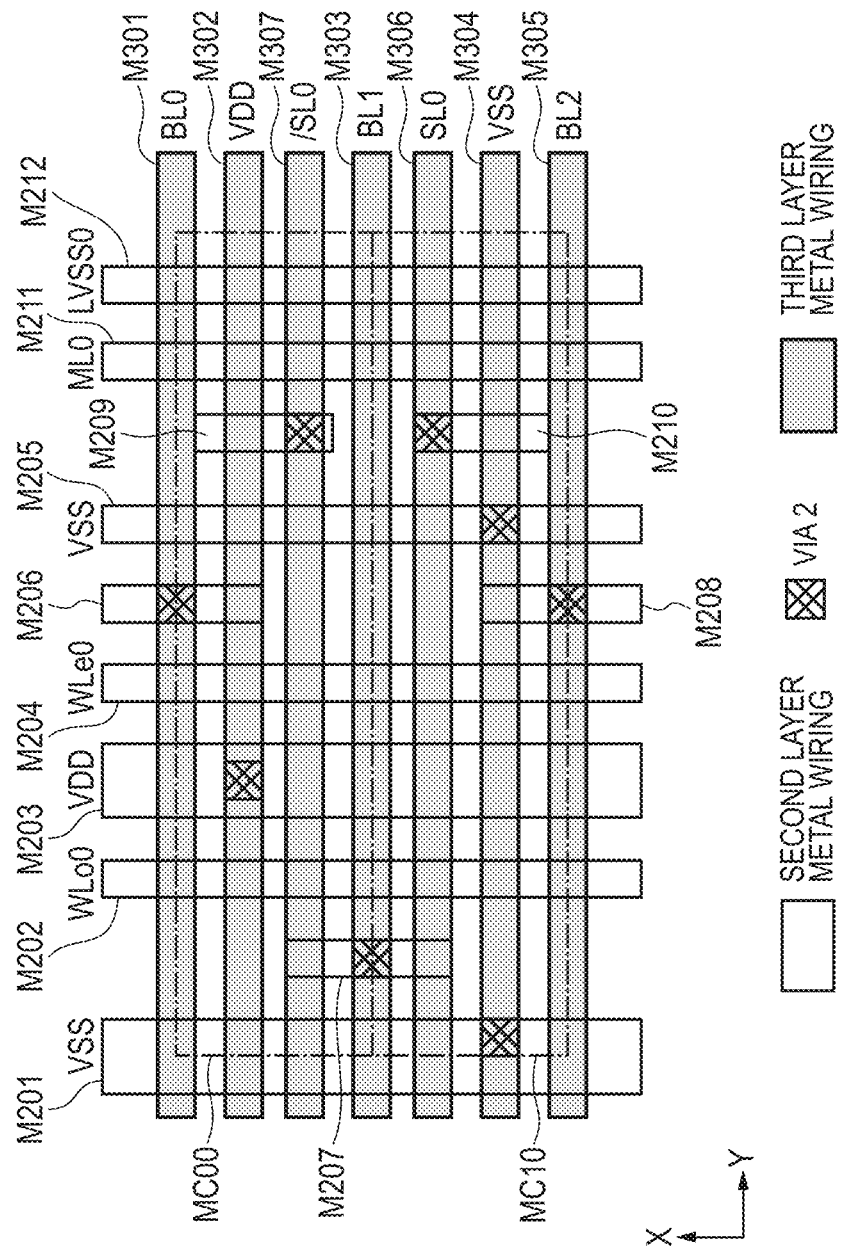
FIG. 23 is a diagram showing a layout arrangement of the TCAM cell formed with second layer metal wirings and third layer metal wirings.

FIG. 19 is a diagram describing a configuration example of a semiconductor memory device according to the modification 2. FIG. 20 is a diagram showing a circuit example of a TCAM cell according to the modification 2. FIGS. 21A and 21B are diagrams showing a configuration example of a match line control circuit and its operation example. FIG. 22 is a diagram showing a layout arrangement of the TCAM cell formed with first layer metal wirings. FIG. 23 is a diagram showing a layout arrangement of the TCAM cell formed with second layer metal wirings and third layer metal wirings.

In FIG. 19, it is different from FIG. 15 in that a memory array 2c of a semiconductor memory device 1c is provided with local ground wirings LVSS0 and LVSS1, and the local ground wirings LVSS0 and LVSS1 are coupled to a match line control circuit MLCa. The local ground wiring LVSS0 is coupled to memory cells MC00, MC10, MC20, and MC30 configuring one row in a manner similar to a match line ML0. The local ground wiring LVSS1 is coupled to memory cells MC01, MC11, MC21, and MC31 configuring one row in a manner similar to a match line ML1. Other configurations are the same as those in FIG. 15, and their description will therefore be omitted.

In FIG. 20, it is different from FIG. 16 in that sources of the N channel MOS transistors NS0 and NS2 included in the data comparison circuit DCMP are coupled to the local ground wiring LVSS0 separated from the ground potential (wiring) VSS. Since other configurations are the same as those in FIG. 16, their description will be omitted.

Since the sources of the N channel MOS transistors NS0 and NS2 are coupled to the local ground wiring LVSS0, the following occurs where search data and TCAM data do not match with each other.

When the search data and the TCAM data do not match with each other, the potential of the match line ML0 precharged to the high level is transitioned to the low level side by either the on operations of the N channel MOS transistors NS1 and NS0 or one of the on operations of the N channel MOS transistors NS1 and NS0. Since the local ground wiring LVSS0 is separated from the ground potential (wiring) VSS, the electric charge of the match line ML0 raises the potential of the local ground wiring LVSS0 precharged to the low level. That is, the distribution of an electric charge (charge sharing) is performed between the match line ML0 and the local ground wiring LVSS0. For example, when the parasitic capacitance of the match line ML0 and the parasitic capacitance of the local ground wiring LVSS0 are considered to be the same, the potentials of the match line ML0 and the local ground wiring LVSS0 are brought to a potential like (½) VDD being an intermediate potential between the power supply potential VDD and the ground potential VSS.

That is, even when the search data and the TCAM data are inconsistent with each other, the potential of the match line ML0 is transitioned only to a potential like (½)VDD. Further, the potential of the local ground wiring LVSS0 is transitioned to the potential like (½)VDD. Thus, it is possible to reduce power consumption of a semiconductor device like a content addressable memory large in inconsistency. Further, since the match line ML0 is precharged from the potential like (½) VDD to the power supply potential like VDD, and the local ground wiring LVSS0 is precharged from the potential like (½)VDD to the potential like VSS, power necessary for precharge of the match line ML0 and the local ground wiring LVSS0 can also be reduced. Thus, it is possible to solve a problem that retrieval in the TCAM is speedy, but current consumption is large.

FIGS. 21A and 21B are diagrams for describing the configuration example of the match line control circuit. FIG. 21A is a circuit diagram showing the configuration example of the match line control circuit. FIG. 21B is a diagram showing the operation example of the match line control circuit.

As illustratively shown, the match line control circuit MLCa is coupled to the match line ML0 coupled to the memory cells MC00, MC10, MC20, and MC30 configuring one row, and the local ground wiring LVSS0. The match line control circuit MLCa includes a control circuit CNT, a pair of precharge MOS transistors Q1 and Q2, a pair of switches SW1 and SW2, a capacitive element C, a match amplifier MA, and an output latch circuit LT.

The precharge MOS transistor Q1 is brought into an on state by a precharge enable signal pce of a low level to precharge the match line ML0 to a precharge level like a high level. Further, the precharge MOS transistor Q2 is brought into an on state by the precharge enable signal pce of the low level to precharge the local ground wiring LVSS0 to a low level. The precharge MOS transistors Q1 and Q2 are brought into an off state by a precharge enable signal pce of a high level.

When the switch SW1 is brought into an on state by a switch enable signal swe of a low level, the switch SW1 couples the match line ML0 and an input wiring ctm of the match amplifier MA to each other. When the switch SW1 is brought into an off state by a switch enable signal swe of a high level, the switch SW1 discouples the match line ML0 and the input wiring ctm from each other. Further, when the switch SW2 is brought into an on state by the switch enable signal swe of the low level, the switch SW2 couples the local ground wiring LVSS0 and an input wiring cbm of the match amplifier MA. When the switch SW2 is brought into an off state by a switch enable signal swe of a high level, the switch SW2 discouples the local ground wiring LVSS and the input wiring cbm from each other.

One end of the capacitive element C is provided to be coupled to the input wiring cbm, and the other end of the capacitive element C is provided to receive a reference potential generation signal vrefg. When the reference potential generation signal vrefg is brought to a high level, the potential of the input wiring cbm coupled to one end of the capacitive element C is raised by a bootstrap effect.

When power switch transistors Q3 and Q4 of the match amplifier MA are brought into an on state by a match amplifier enable signal mae of a high level, the match amplifier MA amplifies a difference in level between the potentials of the input wirings ctm and cbm. The signal amplified by the match amplifier MA is captured in and held by the output latch circuit LT, from which the signal is output as a match line output signal ML0.

The control circuit CNT includes inverters IV1 and IV2 and generates a precharge enable signal pce, based on a precharge control signal from a timing control circuit TC. The precharge enable signal pce is generated from the output of the inverter IV2. Thus, the output of the inverter IV1 is an inverted signal of the precharge enable signal pce.

The control circuit CNT also includes a delay circuit DL1, inverters IV3 and IV4, and a delay circuit DL2 and generates a switch enable signal swe and a reference potential generation signal vrefg, based on a switch control signal from the timing control circuit TC. The switch enable signal swe is generated from the output of the inverter IV4. Thus, the output of the inverter IV3 is an inverted signal of the switch enable signal swe. The reference potential generation signal vrefg is generated from the output of the delay circuit DL2. The input of the delay circuit DL2 is coupled to the output of the inverter IV4. The reference potential generation signal vrefg corresponds to a signal obtained by delaying the switch enable signal swe by the delay circuit DL2.

The control circuit CNT further includes a NOR circuit NOR, and an inverter IV5 and generates a match amplifier enable signal mae. The match amplifier enable signal mae is generated from the output of the inverter IV5. The input of the inverter IV5 is an inverted signal of the match amplifier enable signal mae. The input of the inverter IV5 is coupled to the output of the NOR circuit NOR. The input of the NOR circuit NOR receives the reference potential generation signal vrefg and the switch control signal from the timing control circuit TC.

The operation of the match line control circuit MLCa will next be described using FIG. 21B.

A description will first be made about the case in which the coincidence (match) is taken.

Since each of the precharge MOS transistors Q1 and Q2 is brought into the on state by the low level of the precharge enable signal pce in its initial state, the match line ML0 is precharged to the high level, and the local ground wiring LVSS0 is precharged to the low level.

With the transition of the precharge enable signal pce to the high level, the precharge MOS transistors Q1 and Q2 are brought into an off state, and search data is compared with each entry data. When the search data matches with data in plural TCAM cells coupled to the match line ML0, for example, the match line ML0 maintains a precharge level like a high level, and the local ground wiring LVSS0 maintains a precharge level like a low level. Sine the switches SW1 and SW2 are brought into an on state by the low-level switch enable signal swe, the potentials of the match line ML0 and the local ground wiring LVSS0 are transmitted to the input wirings ctm and cbm of the match amplifier MA.

Thereafter, the switch enable signal swe is transitioned from the low level to the high level. Thus, the switches SW1 and SW2 are brought into an off state. Then, after a predetermined delay time has passed, the reference potential generation signal vrefg is temporarily transitioned from the low level to the high level. Thus, the potential level of the input wiring cbm is temporarily raised from the low level and thereafter transitioned to the low level again. However, the potential of the input wiring cbm does not exceed the high-level potential of the input wiring ctm.

Thereafter, the match amplifier enable signal mae is transitioned from the low level to the high level, and the potential levels of the input wirings ctm and cbm are captured and amplified. The output latch circuit LT outputs a high-level match line output signal ML0 indicative of match.

A description will next be made about the case where the inconsistency (mismatch) is taken.

Since the precharge MOS transistors Q1 and Q2 are brought into an on state by the low level of the precharge enable signal pce in their initial states, the match line ML0 is precharged to a high level, and the local ground wiring LVSS0 is precharged to a low level.

With the transition of the precharge enable signal pce to the high level, the precharge MOS transistors Q1 and Q2 are brought into an off state, and search data is compared with each entry data. When the search data does not match with data in plural TCAM cells coupled to the match line ML0, for example, the match line ML0 is transitioned from a precharge level like a high level to a low level, and the local ground wiring LVSS0 is transitioned to the level side which avoids reaching the precharge level like the low level. Then, with the distribution (charge share) of an electric charge between the match line ML0 and the local ground wiring LVSS0, the potential of the match line ML0 is transitioned to a potential like ($½$)VDD, and the potential of the local ground wiring LVSS0 is transitioned to the potential like ($½$)VDD. Since the switches SW1 and SW2 are brought into an on state by the low-level switch enable signal swe, the potentials of the match line ML0 and the local ground wiring LVSS0 are transmitted to the input wirings ctm and cbm of the match amplifier MA.

Thereafter, the switch enable signal swe is transitioned from the low level to the high level. Thus, the switches SW1 and SW2 are brought into an off state. Then, after a predetermined delay time has passed, the reference potential generation signal vrefg is temporarily transitioned from the low level to the high level. Thus, the potential level of the input wiring cbm is temporarily raised from the potential like (½)VDD. That is, the potential level of the input wiring cbm reaches a potential which exceeds the potential level of the input wiring ctm.

Thereafter, the match amplifier enable signal mae is transitioned from the low level to the high level to capture and amplify the potential levels of the input wirings ctm and cbm. The output latch circuit LT outputs a low-level match line output signal ML0 indicative of mismatch.

According to FIGS. 21A and 21B, even in the case of the configuration in which the charge sharing of the electric charge is carried out between the match line ML0 and the local ground wiring LVSS0, the potential level of the input wiring cbm is temporarily pulled up by a bootstrap to thereby enable the outputs of match and mismatch to be accurately output from the output latch circuit LT.

In FIG. 22, it is different from FIG. 17 in that the first layer metal wirings M141 and M144 are made short in the Y direction and not shared with the TCAM cell adjacent thereto, and each of the first layer metal wirings M141 and M144 is coupled to the local ground wiring LVSS0 through the corresponding via 1. Since other configurations are the same as those in FIG. 17, their description will be omitted.

In FIG. 23, it is different from FIG. 18 in that the via 2 coupling the second layer metal wiring M212 and the third layer metal wiring M304 is deleted, and the second layer metal wiring M212 is used as the local ground wiring LVSS0. Since other configurations are the same as those in FIG. 18, their description will be omitted.

Exemplary Embodiment 3

An exemplary embodiment 3 will next be described using the drawings. The exemplary embodiment 3 corresponds to a configuration example in which the exemplary embodiment 1 or the exemplary embodiment 2 is applied to a BCAM (Binary Content Addressable Memory) being one of content-addressable memories.

Figure 24:
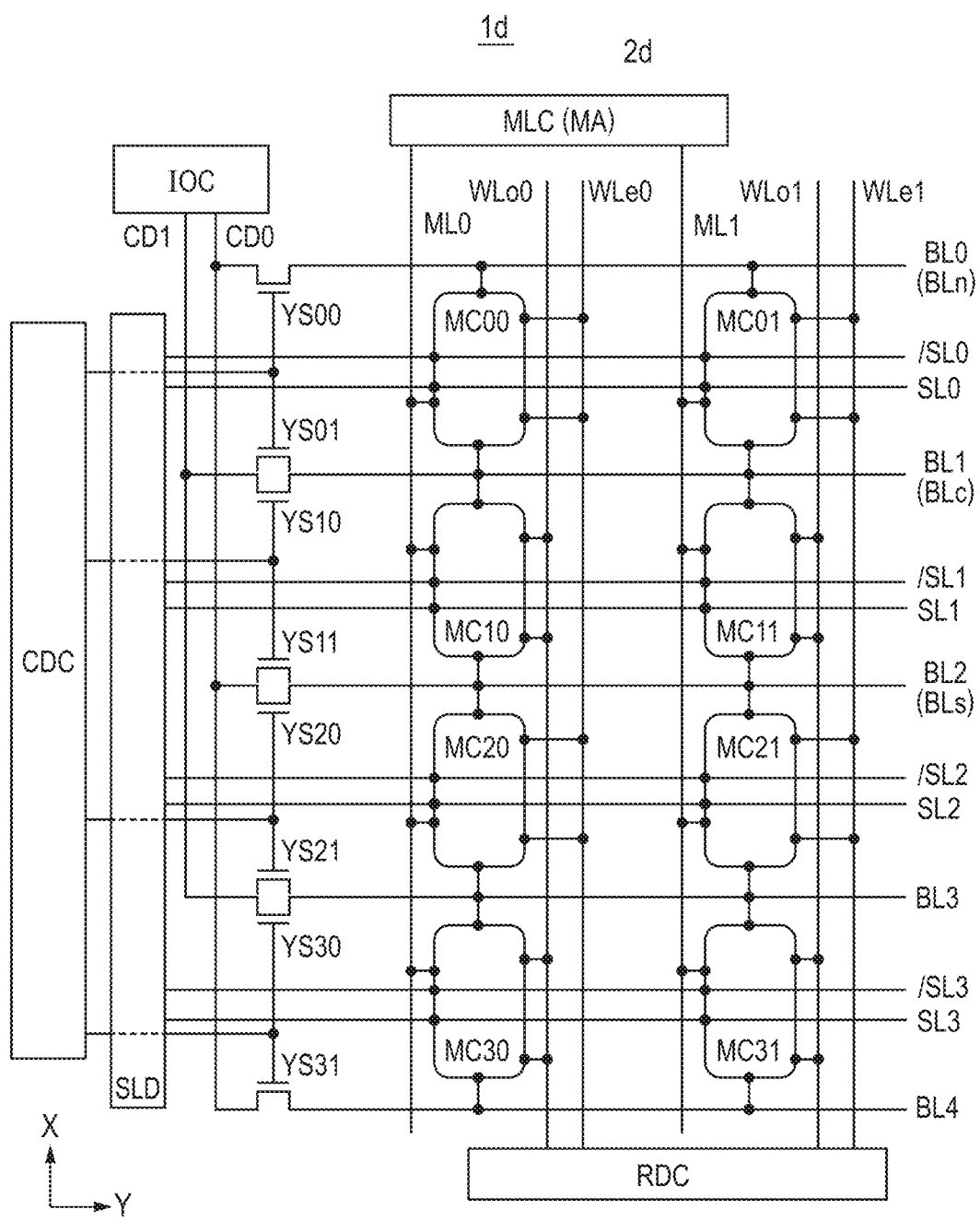
FIG. 24 is a diagram showing a configuration example of a semiconductor memory device according to an exemplary embodiment 3.

FIG. 24 is a diagram showing a configuration example of a semiconductor memory device according to the exemplary embodiment 3. The semiconductor memory device 1d is a BCAM and is formed in the surface of a semiconductor substrate like single crystal silicon, for example by the known CMOS semiconductor manufacturing method. As shown illustratively, the semiconductor memory device 1d has a memory array 2d including eight memory cells (MC00 through MC31) arranged in 2 rows and 4 columns.

In FIG. 24, it is different from FIG. 19 in that a pair of search lines is coupled to each of the memory cells (M000 through MC31). That is, the search line pair SL0, /SL0 is coupled to the memory cells MC00 and MC01 configuring one column. Likewise, the search line pair SL1, /SL1 is coupled to the memory cells MC10 and MC11 configuring one column. The search line pair SL2, /SL2 is coupled to the memory cells MC20 and MC21 configuring one column. The search line pair SL3, /SL3 is coupled to the memory cells MC30 and MC31 configuring one column. Other configurations are the same as those in FIG. 19.

Figure 25:
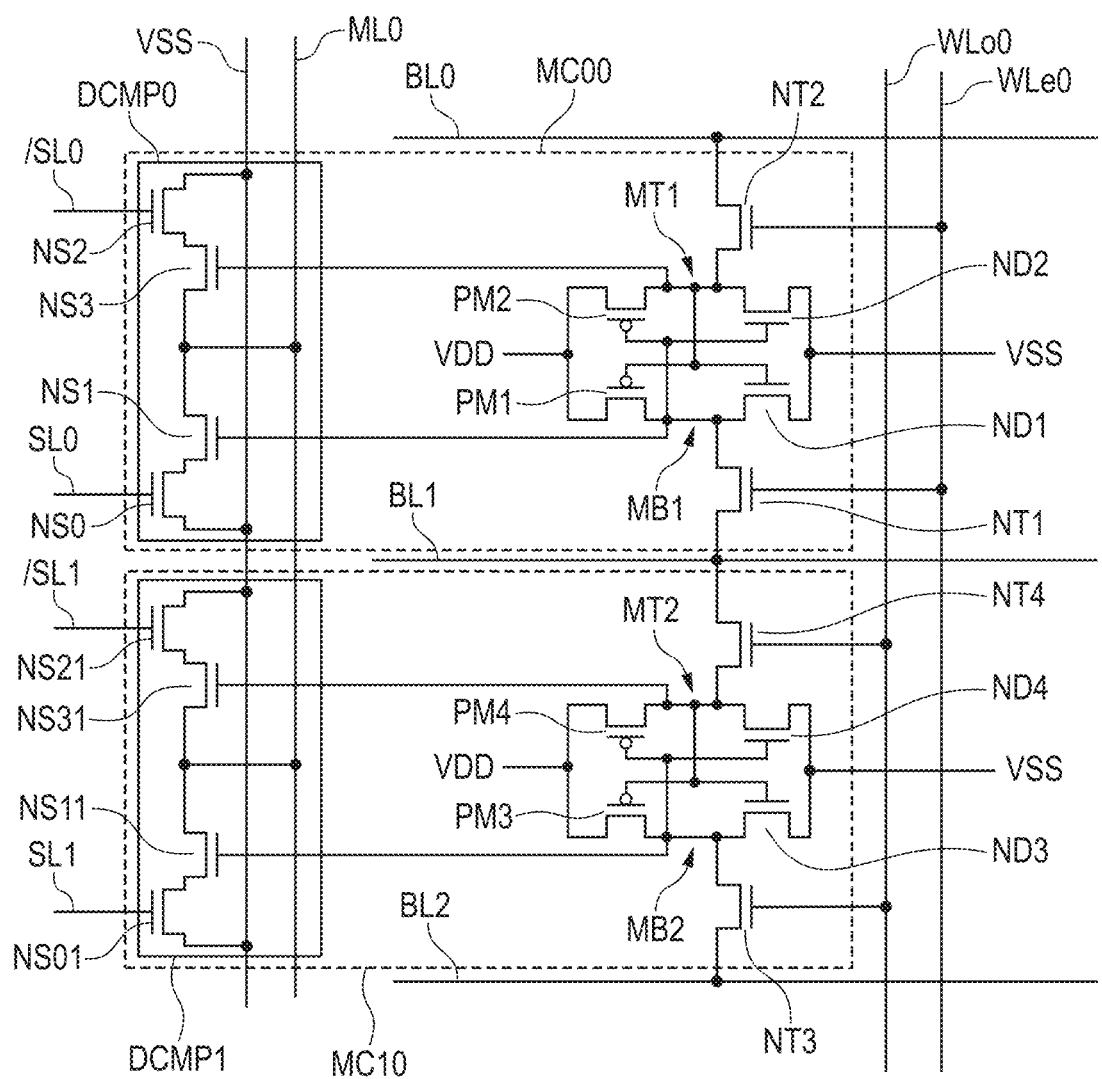
FIG. 25 is a diagram showing a circuit example of each memory cell of a BCAM according to the exemplary embodiment 3.

FIG. 25 is a diagram showing a circuit example of each memory cell in the BCAM according to the exemplary embodiment 3. FIG. 25 illustratively shows the configuration of the memory cells MC00 and MC10. As shown in FIG. 25, a data comparison circuit DCMP0 is provided in the memory cell MC00, and a data comparison circuit DCMP1 is provided in the memory cell MC10.

The data comparison circuit DCMP0 includes four N channel MOS transistors (NS0 through NS3). A source-drain path of the N channel MOS transistor NS0 and a source-drain path of the N channel MOS transistor NS1 are coupled in series between a match line ML0 and a supply line for a ground potential VSS. A gate of the N channel MOS transistor NS0 is coupled to the search line SL0. A gate of the N channel MOS transistor NS1 is coupled to a first memory node MB1 of the memory cell MC00. A source-drain path of the N channel MOS transistor NS2 and a source-drain path of the N channel MOS transistor NS3 are coupled in series between the match line ML0 and the supply line for the ground potential VSS. A gate of the N channel MOS transistor NS2 is coupled to the search line /SL0. A gate of the N channel MOS transistor NS3 is coupled to a second memory node MT1 of the memory cell MC00.

The data comparison circuit DCMP1 includes four N channel MOS transistors (NS01 through NS31). A source-drain path of the N channel MOS transistor NS01 and a source-drain path of the N channel MOS transistor NS11 are coupled in series between the match line ML0 and the supply line for the ground potential VSS. A gate of the N channel MOS transistor NS01 is coupled to the search line SL1. A gate of the N channel MOS transistor NS11 is coupled to a second memory node MB2 of the memory cell MC10. A source-drain path of the N channel MOS transistor NS21 and a source-drain path of the N channel MOS transistor NS31 are coupled in series between the match line ML0 and the supply line for the ground potential VSS. A gate of the N channel MOS transistor NS21 is coupled to the search line /SL1. A gate of the N channel MOS transistor NS31 is coupled to a second memory node MT2 of the memory cell MC10.

Figure 26:
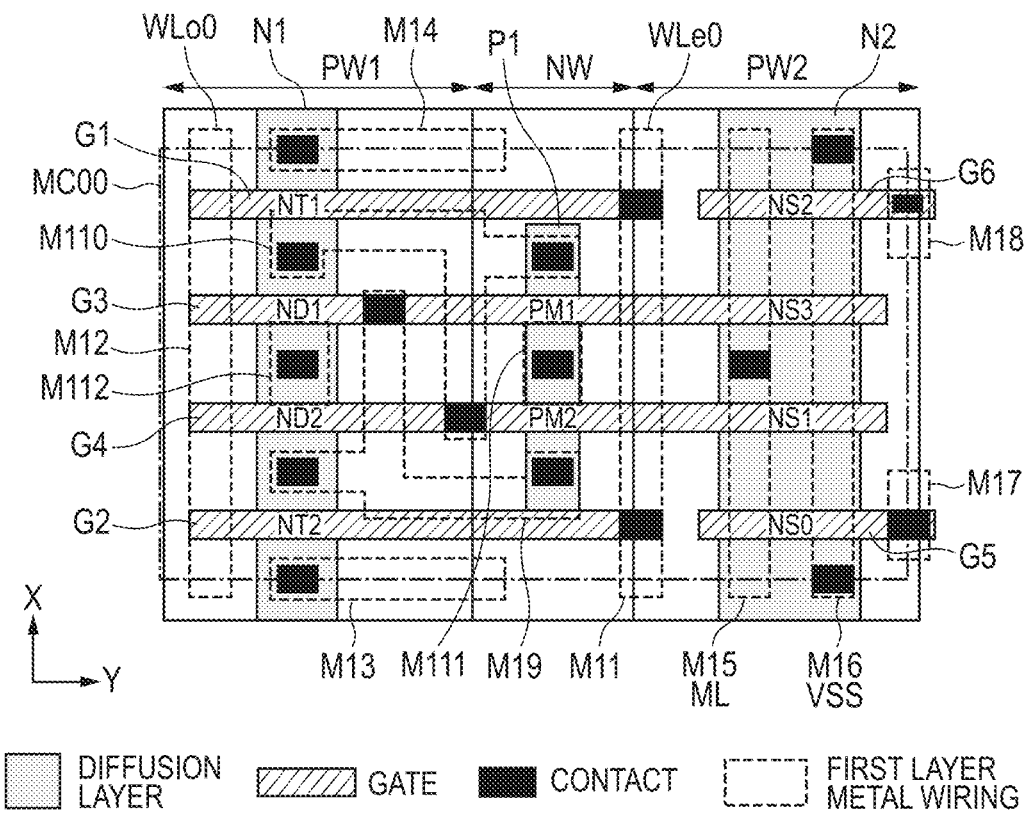
FIG. 26 is a diagram showing a layout arrangement of the memory cell of the BCAM formed with first layer metal wirings.
Figure 27:
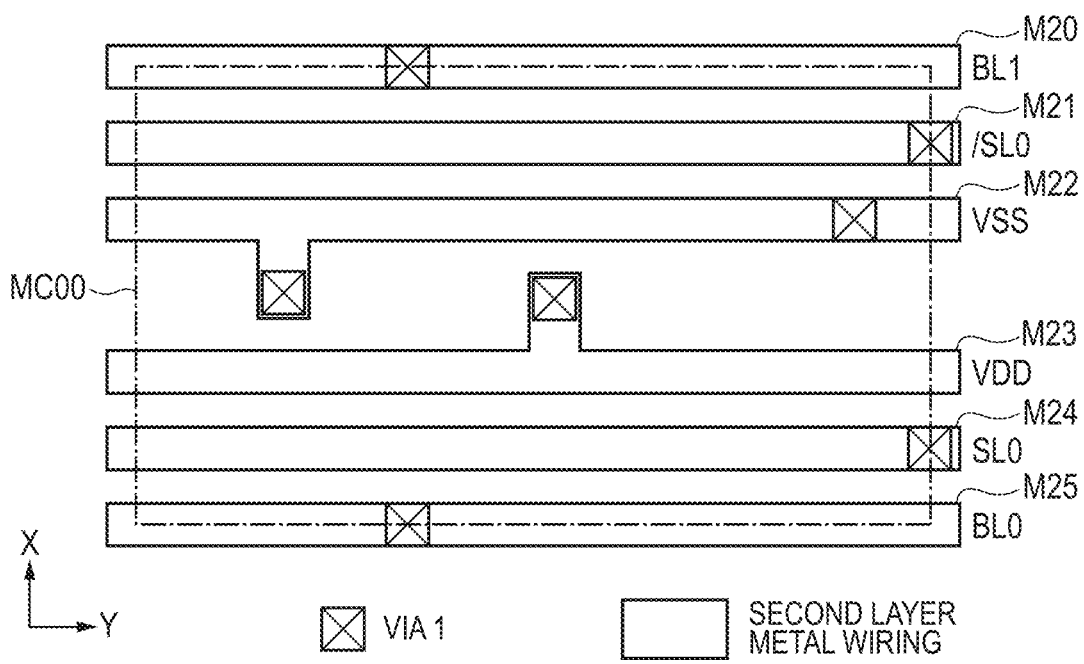
FIG. 27 is a diagram showing a layout arrangement of the memory cell of the BCAM formed with second layer metal wirings.

FIG. 26 is a diagram showing a layout arrangement of the memory cell in the BCAM formed with first layer metal wirings. FIG. 27 is a diagram showing a layout arrangement of the memory cell of the BCAM formed with second layer metal wirings. Incidentally, in the following description, the same reference symbols as those in the embodiment, the exemplary embodiment 1, the modification, the exemplary embodiment 2, and the modification 2 may be used, but may indicate different reference symbols.

A layout configuration of the memory cell MC00 is illustratively shown in FIG. 26. The layout shown in FIG. 26 is applicable even to the memory cells MC20, MC01, and MC21.

In a forming area for the memory cell MC00, two P-type well regions PW1 and PW2 provided along an X direction, and an N-type well region NW provided between the two P-type well regions PW1 and PW2 are formed in the surface of the semiconductor substrate. The P-type well regions PW1 and PW2 are semiconductor regions in which a P-type impurity is introduced, and the N-type well region NW is a semiconductor region in which an N-type impurity is introduced.

Six gate electrodes (G1 through G6) are arranged in the forming area for the memory cell MC00 along a Y direction. The gate electrode G1 configures a gate electrode of an N channel MOS transistor NT1. The gate electrode G2 configures a gate electrode of an N channel MOS transistor NT2. The gate electrode G3 configures gate electrodes of a P channel MOS transistor PM1, an N channel MOS transistor ND1, and the N channel MOS transistor NS3. The gate electrode G4 configures gate electrodes of a P channel MOS transistor PM2, an N channel MOS transistor ND2, and the N channel MOS transistor NS1. The gate electrode G5 configures a gate electrode of the N channel MOS transistor NS0. The gate electrode G6 configures a gate electrode of the N channel MOS transistor NS2.

An N-type impurity region N1 is provided in the P-type well region PW1 along the X direction. The N-type impurity region N1 configures sources or drains of the N channel MOS transistors NT1, ND1, ND2, and NT2. An N-type impurity region N2 is provided in the P-type well region PW2 along the X direction. The N-type impurity region N2 configures sources or drains of the N channel MOS transistors NS2, NS3, NS1, and NS0. The N-type impurity regions N1 and N2 are semiconductor regions in which an N-type impurity is introduced.

A P-type impurity region P1 is provided in the N-type well region NW along the X direction. The P-type impurity region P1 is a semiconductor region in which a P-type impurity is introduced. The P-type impurity region P1 configures sources or drains of the P channel MOS transistors PM1 and PM2.

As shown in FIG. 26, first layer metal wirings (M11 through M19, M110 through M112) are provided in the forming area for the memory cell MC00. The first layer metal wiring M11 configures a word line WLe0 provided along the X direction and is coupled to the gate electrodes G1 and G2 through contacts. The first layer metal wiring M12 configures a word line WLo0 provided along the X direction. The first layer metal wiring M12 is coupled to the gate electrodes G1 and G2 through contacts in a forming area for a memory cell MC10. Incidentally, although the layout of the forming area for the memory cell MC10 is not illustrated, it is configured in a manner similar to the layout of FIG. 26. The first layer metal wiring M13 is coupled to the source or drain of the N channel MOS transistor NT2 through a contact. The first layer metal wiring M13 is coupled to a bit line BL0. The first layer metal wiring M14 is coupled to the source or drain of the N channel MOS transistor NT1 through a contact. The first layer metal wiring M14 is coupled to a bit line BL1. The first layer metal wiring M15 configures a match line ML0 provided along the X direction. The first layer metal wiring M15 is coupled to the drains of the N channel MOS transistors NS3 and NS1 through a contact. The first layer metal wiring M16 configures a ground potential wiring VSS provided along the X direction. The first layer metal wiring M16 is coupled to the sources of the N channel MOS transistors NS2 and NS0 through contacts. The first layer metal wiring M17 is coupled to the gate electrode G5 through a contact. The first layer metal wiring M17 is coupled to the search line SL0. The first layer metal wiring M18 is coupled to the gate electrode G6 through a contact. The first layer metal wiring M18 is coupled to the search line /SL0. The first layer metal wiring M19 is coupled to the drain of the P channel MOS transistor PM2, the drain of the N channel MOS transistor ND2, and the gate electrode G3 through contacts. The first layer metal wiring M110 is coupled to the drain of the P channel MOS transistor PM1, the drain of the N channel MOS transistor ND1, and the gate electrode G4 through contacts. The first layer metal wiring M111 is coupled to the drains of the P channel MOS transistors PM1 and PM2 through a contact. The first layer metal wiring M111 is coupled to a power supply potential wiring VDD. The first layer metal wiring M112 is coupled to the drains of the N channel MOS transistors ND1 and ND2 through a contact. The first layer metal wiring M112 is coupled to the ground potential wiring VSS.

As shown in FIG. 27, second layer metal wirings (M20 through M25) are provided in the forming area for the memory cell MC00 along the Y direction. The second layer metal wiring M20 configures the bit line BL1. The second layer metal wiring M20 is coupled to the first layer metal wiring M14 through a via 1. The second layer metal wiring M21 configures the search line /SL0. The second layer metal wiring M21 is coupled to the first layer metal wiring M18 through a via 1. The second layer metal wiring M22 configures the ground potential wiring VSS. The second layer metal wiring M22 is coupled to the first layer metal wirings M16 and M112 through vias 1. The second layer metal wiring M23 configures the power supply potential wiring VDD. The second layer metal wiring M23 is coupled to the first layer metal wiring M111 through a via 1. The second layer metal wiring M24 configures the search line SL0. The second layer metal wiring M24 is coupled to the first layer metal wiring M17 through a via 1. The second layer metal wiring M25 configures the bit line BL0. The second layer metal wiring M25 is coupled to the first layer metal wiring M13 through a via 1.

According to the layout configuration of the exemplary embodiment 3, the following effects can be obtained.

The word lines WLe0 and WLo0 are wired in the Y direction (vertical direction) using the first layer metal wirings (M11, M12). The search line pair (SL0, /SL0) and the bit line pair (BL0, BL1) are wired in the X direction (horizontal direction) using the second layer metal wirings (M24, M21, M25, M20). No third layer metal wirings are required for the configuration of each memory cell in FIGS. 24 and 25. Thus, the memory cells can be implemented with a small number of wiring layers. Therefore, third layer metal wirings and metal wirings corresponding to a fourth layer, a fifth layer, etc. more than the third layer can be utilized as wiring regions (wirings) for signals, etc.

Incidentally, according to need, the ground potential wiring VSS and the power supply potential wiring VDD may be configured by the third layer metal wirings to stabilize the power supply potential and the ground potential.

Further, since the match line ML0 and the search lines SL0 and /SL0 can be wired by lower layers, a parasitic capacitance generated at the via part for placing the layer upward can be reduced. Thus, the load capacitances of the match line ML0 and the search lines SL0 and /SL0 can be reduced as a whole. Thus, low power consumption in the search operation of the BCAM, and the speed enhancement thereof can be expected.

(Modification 3)

A modification of the exemplary embodiment 3 will next be described using FIGS. 28 through 30. The modification 3 is a configuration example in which the configuration of the local ground wiring LVSS and the match line control circuit MLCa described in the modification 2 is applied to the BCAM in the exemplary embodiment 3.

Figure 28:
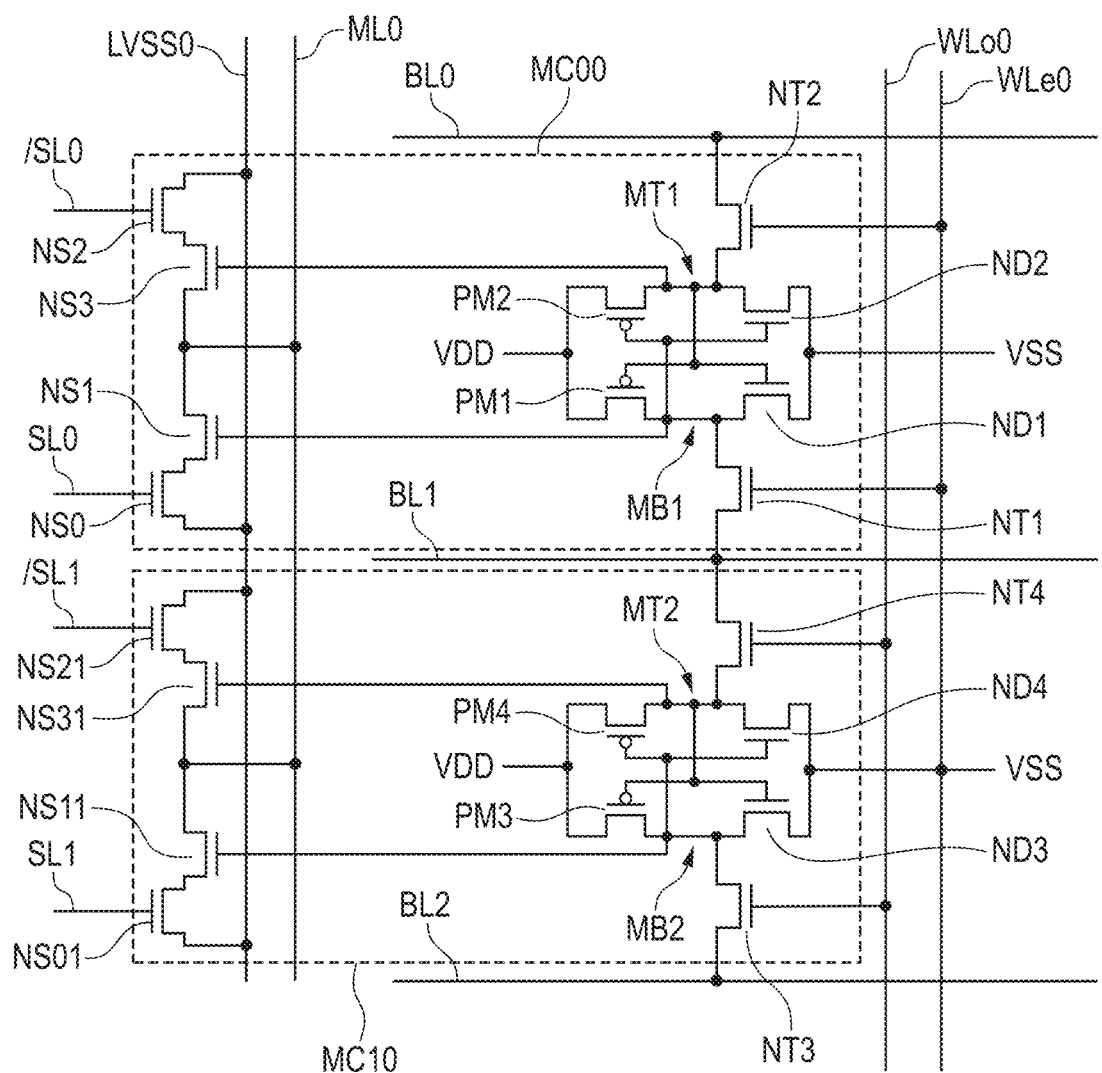
FIG. 28 is a diagram showing a circuit example of each memory cell of a BCAM according to a modification 3.

FIG. 28 is a diagram showing a circuit example of each memory cell in the BCAM according to the modification 3. FIG. 29 is a diagram showing a layout arrangement of the memory cell in the BCAM formed with first layer metal wirings. FIG. 30 is a diagram showing a layout arrangement of the memory cell in the BCAM formed with second layer metal wirings.

In FIG. 28, it is different from FIG. 25 in that sources of N channel MOS transistors NS0, NS2, NS01, and NS21 are coupled to a local ground wiring LVSS. Since other configurations are the same as those in FIG. 24, their description will be omitted.

Figure 29:
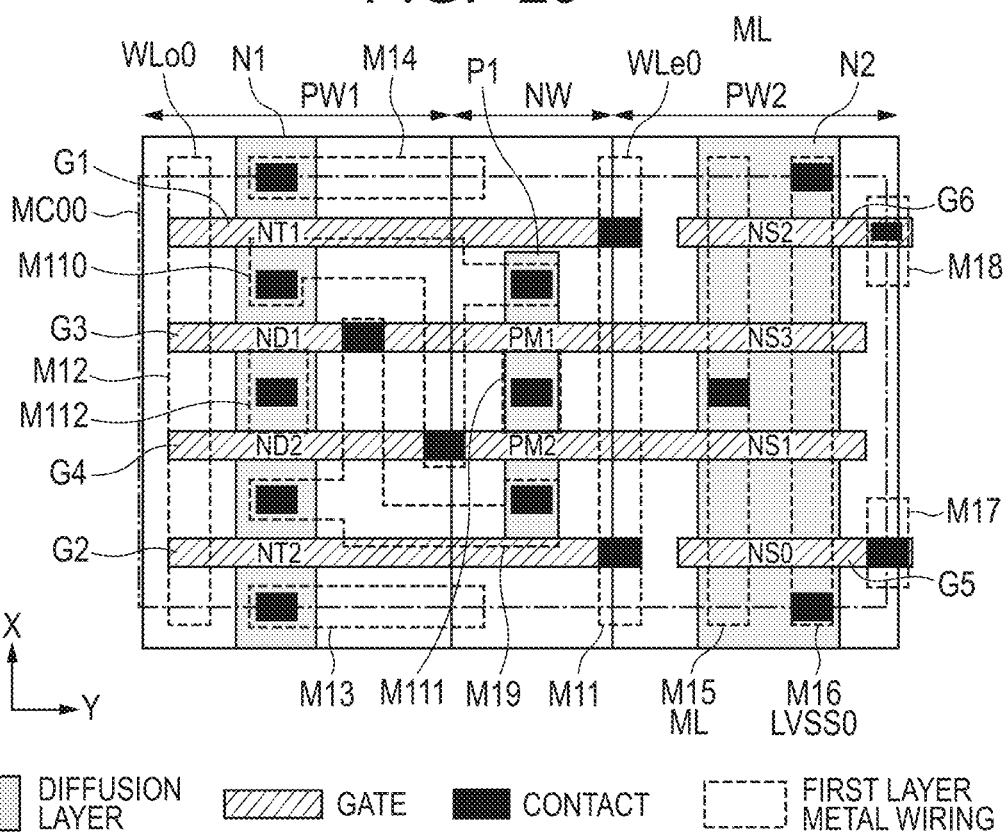
FIG. 29 is a diagram showing a layout arrangement of the memory cell of the BCAM formed with first layer metal wirings.

In FIG. 29, it is different from FIG. 26 in that a first layer metal wiring M16 is configured as a local ground wiring LVSS. Since other configurations are the same as those in FIG. 25, their description will be omitted.

Figure 30:
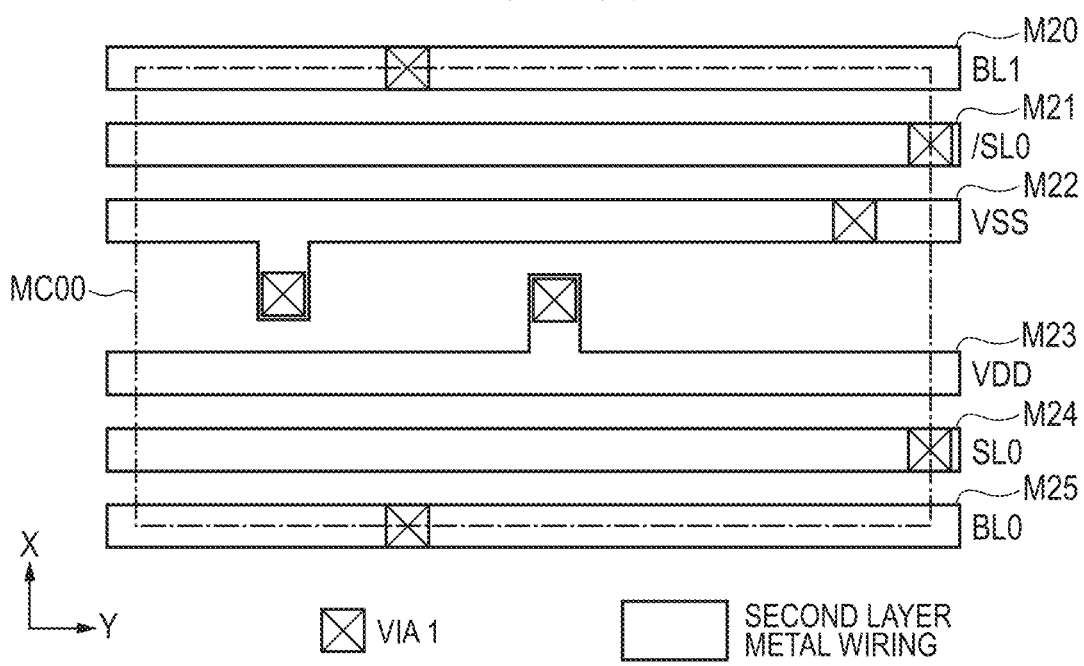
FIG. 30 is a diagram showing a layout arrangement of the memory cell of the BCAM formed with second layer metal wirings.

In FIG. 30, it is different from FIG. 27 in that a second layer metal wiring M22 is coupled only to a first layer metal wiring M112 (the second layer metal wiring M22 is not coupled to the first layer metal wiring M16 through a via 1). Since other configurations are the same as those in FIG. 26, their description will be omitted.

According to the modification 3, it is possible to obtain the effect of the exemplary embodiment 3, and the effect of the modification 2 of the exemplary embodiment 2.

(Modification 4)

Figure 31:
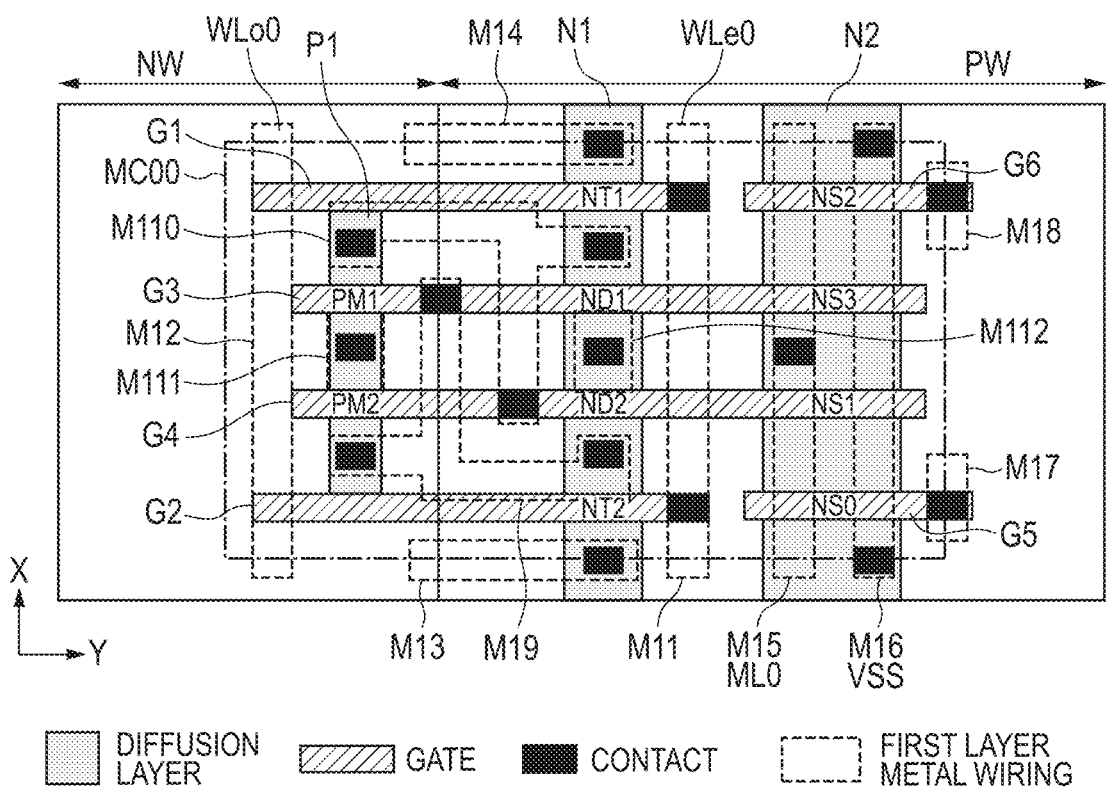
FIG. 31 is a diagram showing a layout arrangement of a memory cell of a BCAM formed with first layer metal wirings according to a modification 4.
Figure 32:
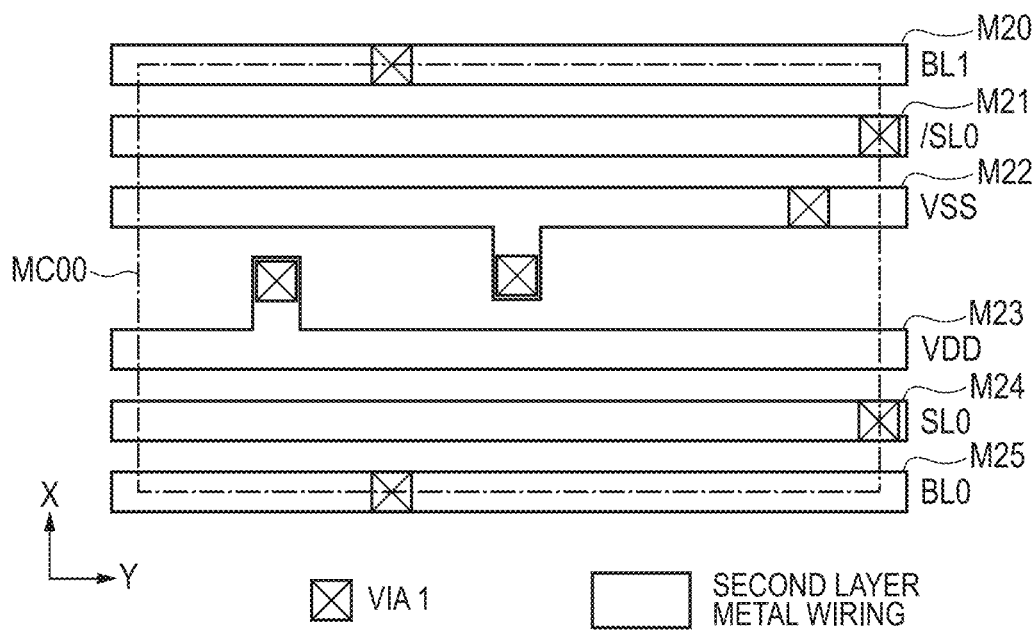
FIG. 32 is a diagram showing a layout arrangement of the memory cell of the BCAM formed with second layer metal wirings according to the modification 4.

A modification of the exemplary embodiment 3 will next be described using FIGS. 31 and 32. In the modification 4, the two P-type well regions PW1 and PW2 described in FIG. 26 (the modification 2 of the exemplary embodiment 3) are formed as one P-type well region PW, and the N-type impurity region N1 formed in the P-type well region PW1 is formed within the P-type well region PW. FIG. 31 is a diagram showing a layout arrangement of a memory cell of a BCAM formed with first layer metal wirings according to the modification 4. FIG. 32 is a diagram showing a layout arrangement of the memory cell of the BCAM formed with second layer metal wirings according to the modification 4.

As shown in FIG. 31, in a forming area for a memory cell MC00, the N-type impurity regions N1 and N2 are arranged in the P-type well region PW to run in parallel in an X direction. The N-type impurity region N1 is arranged between a P-type impurity region P1 and the N-type impurity region N2. Thus, N channel MOS transistors NT1, ND1, ND2, and NT2 are arranged between P channel MOS transistors PM1 and PM2 and N channel MOS transistors NS0 through NS3. An N-type well region NW is shared with a memory cell formed on the left-hand side in plan view. Further, the P-type well region PW is shared with a memory cell formed on the right-hand side in plan view. Since other configurations are the same as those in FIG. 26, their description will be omitted.

In FIG. 32, it is different from FIG. 27 in that the coupling position of a first layer metal wiring M112 and a second layer metal wiring M22 (ground potential wiring VSS) and the coupling position of a first layer metal wiring M111 and a second layer metal wiring M23 (power supply potential wiring VDD) are changed in association with the changes of both the arrangement position of the P channel MOS transistors PM1 and PM2, and the arrangement position of the N channel MOS transistors NT1, ND1, ND2, and NT2. Since other configurations are the same as those in FIG. 26, their description will be omitted.

According to the modification 4, as shown in FIG. 31, the slender strip type N-type well region NW shown in FIG. 26 (the modification 2 of the exemplary embodiment 3) is omitted, and the relatively thick N-type well region NW and P-type well region PW shared with the adjacent cell are provided. Therefore, since process control at the formation of the N-type and P-type well regions NW and PW becomes relatively easy, the manufacture of the N-type and P-type well regions NW and PW can be facilitated.

(Modification 5)

Figure 33A:
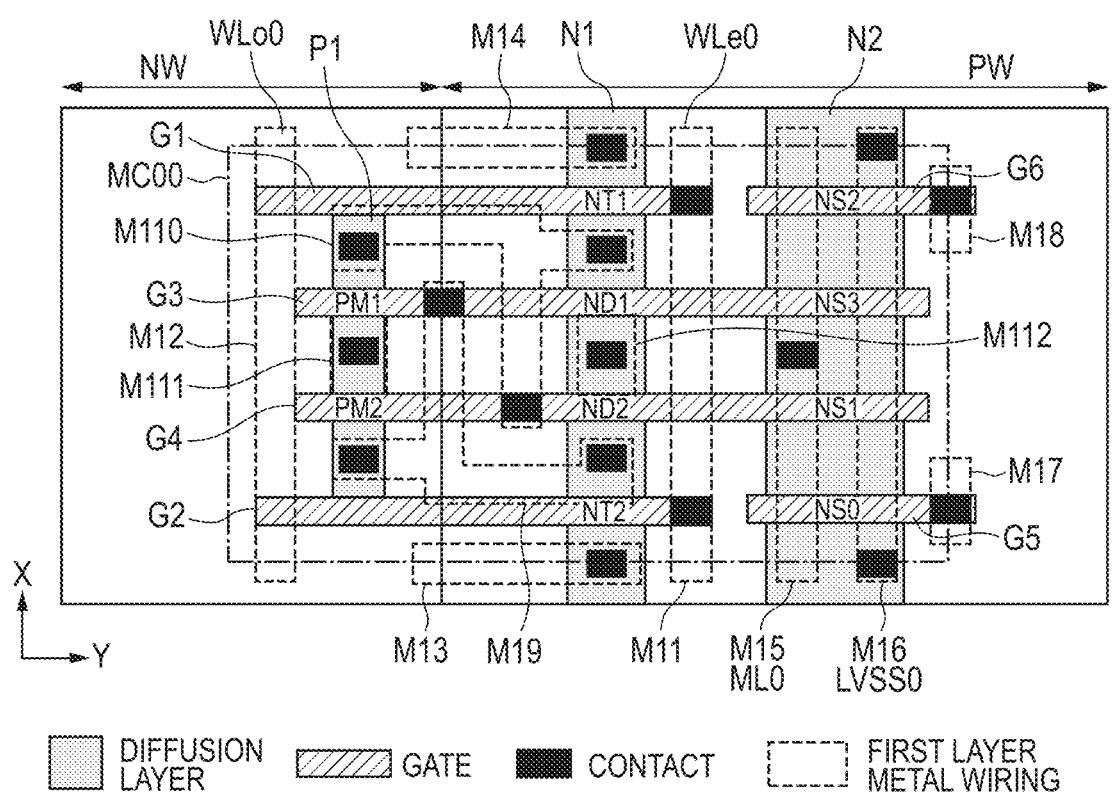
FIG. 33A is a diagram showing a layout arrangement of a memory cell of a BCAM formed with first layer metal wirings according to a modification 5.
Figure 33B:
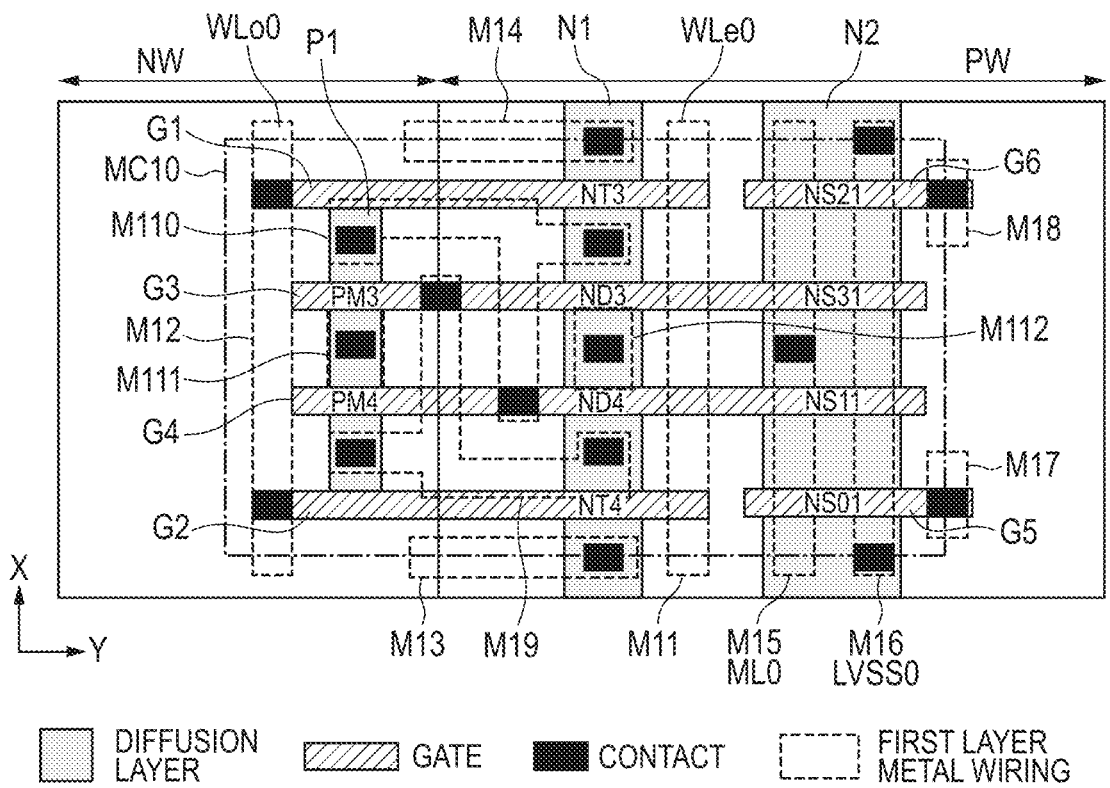
FIG. 33B is a diagram showing a layout arrangement of a memory cell of the BCAM formed with first layer metal wirings according to the modification 5 and a diagram showing a layout arrangement of the memory cell adjacent to the memory cell shown in FIG. 33A in an X direction.
Figure 34:
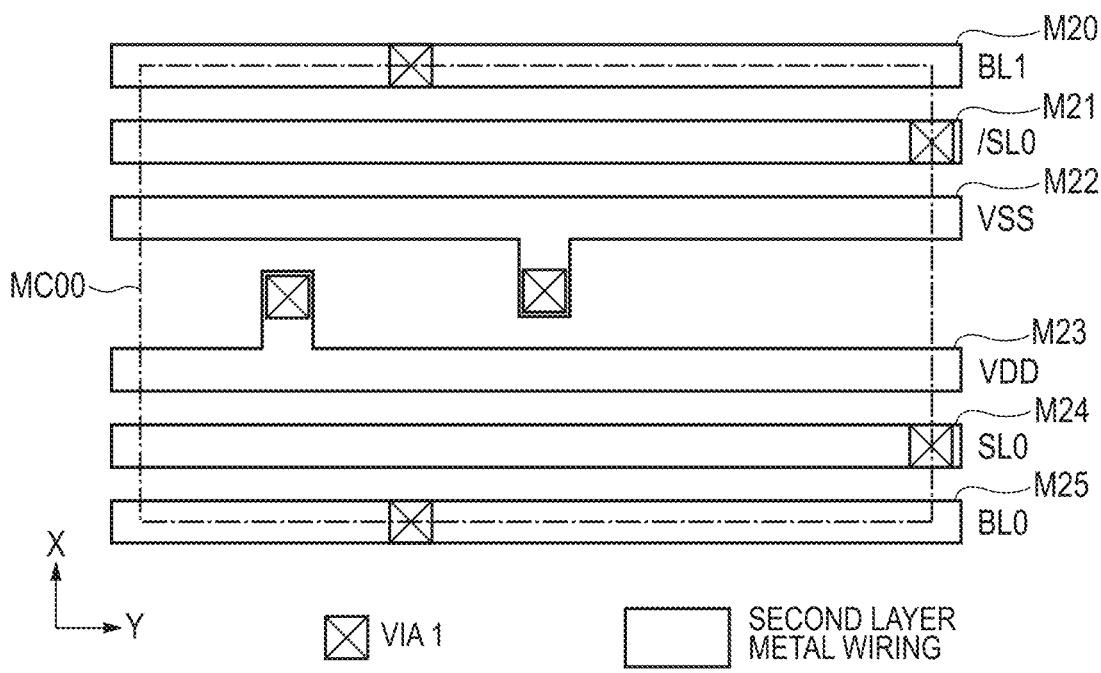
FIG. 34 is a diagram showing a layout arrangement of the memory cell of the BCAM formed with second layer metal wirings according to the modification 5.

A modification of the exemplary embodiment 3 will next be described using FIGS. 33A and 33B, and FIG. 34. In the modification 5, the configuration of the local ground wiring LVSS0 and the match line control circuit MLCa described in the modification 2 is applied to the layout arrangement of the memory cell in the modification 4. FIGS. 33A and 33B are respectively diagrams showing a layout arrangement of each memory cell of a BCAM formed with first layer metal wirings according to the modification 5. The memory cell shown in FIG. 33B corresponds to a memory cell MC10 adjacent to a memory cell MC00 shown in FIG. 33A in an X direction. FIG. 34 is a diagram showing a layout arrangement of the memory cell of the BCAM formed with second layer metal wirings according to the modification 5.

In FIGS. 33A and 33B, they are different from FIG. 31 in that the first layer metal wiring M16 is configured as the local ground wiring LVSS0. Since other configurations are the same as those in FIG. 31, their description will be omitted.

In the memory cell MC00 shown in FIG. 33A, a first layer metal wiring M11 being a word line WLe0 is coupled to gate electrodes G1 and G2 thereof through contacts. On the other hand, in the memory cell MC10 shown in FIG. 33B, a first layer metal wiring M12 being a word line WLo0 is coupled to gate electrodes G1 and G2 through contacts.

In FIG. 34, it is different from FIG. 32 in that a second layer metal wiring M22 being a ground potential wiring VSS is coupled only to a first layer metal wiring M112 through a via 1 (the second layer metal wiring M22 is not coupled to a first layer metal wiring M16 through a via 1). Since other configurations are the same as those in FIG. 32, their description will be omitted.

According to the modification 5, it is possible to obtain an effect similar to that in each of the modifications 2 and 4.

Exemplary Embodiment 4

Figure 35:
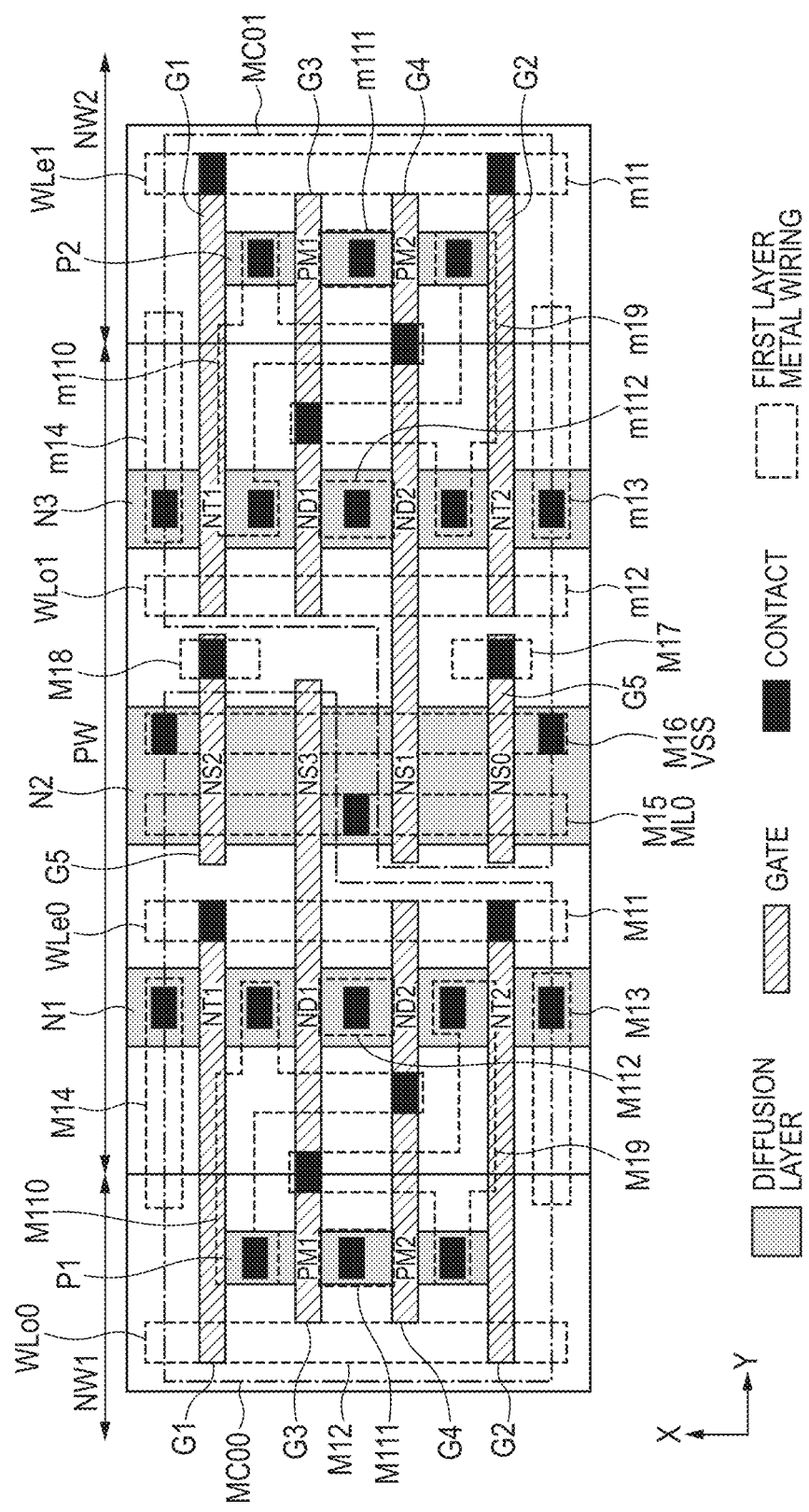
FIG. 35 is a diagram showing a layout arrangement of each memory cell of a TCAM formed with first layer metal wirings according to an exemplary embodiment 4.
Figure 36:
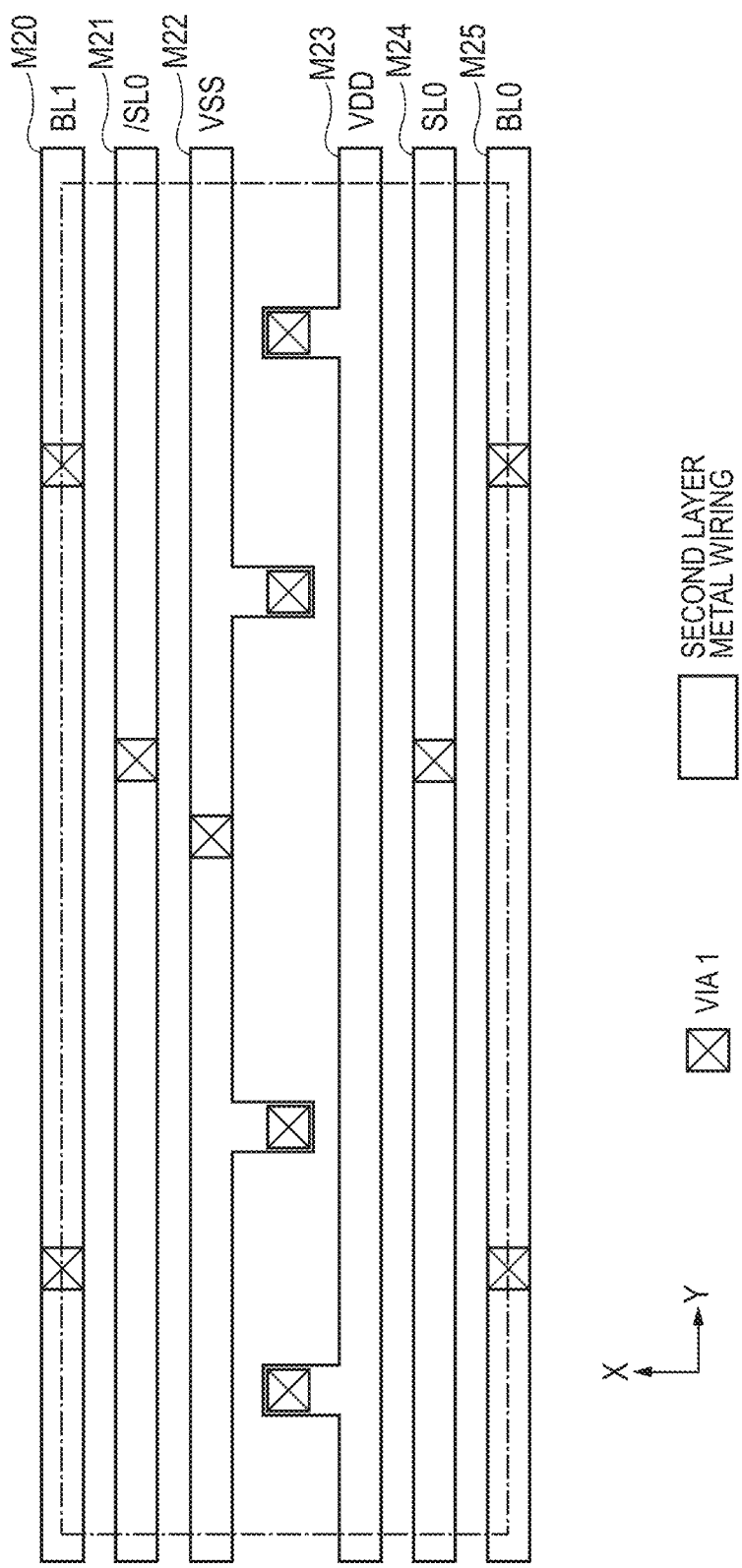
FIG. 36 is a diagram showing a layout arrangement of a memory cell of a TCAM formed with second layer metal wirings according to an exemplary embodiment 5.

An exemplary embodiment 4 will next be described using FIGS. 35 and 36. In the exemplary embodiment 2, the TCAM cell TCEL has been configured by using the two of the memory cells MC00 and MC10. In the exemplary embodiment 4, a TCAM cell TCEL is configured by using two of memory cells MC00 and MC01. Further, the modification 4 (FIG. 31) is used in the layout arrangement of the memory cells. FIG. 35 is a diagram showing a layout arrangement of memory cells of a TCAM formed with first layer metal wirings according to the exemplary embodiment 4. FIG. 36 is a diagram showing a layout arrangement of the memory cells of the TCAM formed with second layer metal wirings according to the exemplary embodiment 4.

In FIG. 35, the TCAM cell TCEL has two N-type well regions NW1 and NW2 provided along an X direction, and a P-type well region PW provided between the N-type well regions NW1 and NW2, which are formed in the surface of a semiconductor substrate.

In a forming area for the memory cell MC00, five gate electrodes (G1 through G5) are extended in a Y direction. The gate electrode G1 configures a gate electrode of an N channel MOS transistor NT1. The gate electrode G2 configures a gate electrode of an N channel MOS transistor NT2. The gate electrode G3 configures gate electrodes of a P channel MOS transistor PM1, an N channel MOS transistor ND1, and an N channel MOS transistor NS3. The gate electrode G4 configures gate electrodes of a P channel MOS transistor PM2, an N channel MOS transistor ND2, and an N channel MOS transistor NS3. The gate electrode G5 configures a gate electrode of an N channel MOS transistor NS2.

In a forming area for the memory cell MC01, five gate electrodes (G1 through G5) are extended in the Y direction. The gate electrode G1 configures a gate electrode of an N channel MOS transistor NT1. The gate electrode G2 configures a gate electrode of an N channel MOS transistor NT2. The gate electrode G3 configures gate electrodes of a P channel MOS transistor PM1, an N channel MOS transistor ND1, and an N channel MOS transistor NS3. The gate electrode G4 configures gate electrodes of a P channel MOS transistor PM2, an N channel MOS transistor ND2, and an N channel MOS transistor NS1. The gate electrode G5 configures a gate electrode of an N channel MOS transistor NS0.

N-type impurity regions N1, N2, and N3 are provided in the P-type well region PW so as to be separated from each other along the X direction. The N-type impurity region N1 configures sources or drains of the N channel MOS transistors NT1, ND1, ND2, and NT2 in the memory cell MC00. The N-type impurity region N2 configures sources or drains of the N channel MOS transistors NS2, NS3, NS1, and NS0 included in a data comparison circuit DCMP. The N-type impurity region N3 configures sources or drains of the N channel MOS transistors NT1, ND1, ND2, and NT2 in the memory cell MC01.

A P-type impurity region P1 is provided in the N-type well region NW1 along the X direction. The P-type impurity region P1 configures sources or drains of the P channel MOS transistors PM1 and PM2 in the memory cell MC00.

A P-type impurity region P2 is provided in the N-type well region NW2 along the X direction. The P-type impurity region P2 configures sources or drains of the P channel MOS transistors PM1 and PM2 in the memory cell MC01.

As shown in FIG. 35, the first layer metal wirings (M11 through M19, M110 through M112, m11 through m14, m19, m110 through m112) are provided in the forming areas for the memory cells MC00 and MC01.

The first layer metal wirings (M11 through M19, M110 through M112) will first be described. The first layer metal wiring M11 configures a word line WLe0 provided along the X direction and is coupled to the gate electrodes G1 and G2 through contacts. The first layer metal wiring M12 configures a word line WLo0 provided along the X direction. The first layer metal wiring M12 is coupled to the gate electrodes G1 and G2 through contacts in the forming area for the memory cell MC00. The first layer metal wiring M13 is coupled to the source or drain of the N channel MOS transistor NT2 through a contact. The first layer metal wiring M13 is coupled to a bit line BL0. The first layer metal wiring M14 is coupled to the source or drain of the N channel MOS transistor NT1 through a contact. The first layer metal wiring M14 is coupled to a bit line BL1. The first layer metal wiring M15 configures a match line ML0 provided along the X direction. The first layer metal wiring M15 is coupled to the drains of the N channel MOS transistors NS3 and NS1 through a contact. The first layer metal wiring M16 configures a ground potential wiring VSS provided along the X direction. The first layer metal wiring M16 is coupled to the sources of the N channel MOS transistors NS2 and NS0 through contacts. The first layer metal wiring M17 is coupled to the gate electrode G5 in the forming area for the memory cell MC01 through a contact. The first layer metal wiring M17 is coupled to a search line SL0. The first layer metal wiring M18 is coupled to the gate electrode G5 in the forming area for the memory cell MC01 through a contact. The first layer metal wiring M18 is coupled to a search line /SL0. The first layer metal wiring M19 is coupled to the drain of the P channel MOS transistor PM2, the drain of the N channel MOS transistor ND2, and the gate electrode G3 through contacts. The first layer metal wiring M110 is coupled to the drain of the P channel MOS transistor PM1, the drain of the N channel MOS transistor ND1, and the gate electrode G4 through contacts. The first layer metal wiring M111 is coupled to the drains of the P channel MOS transistors PM1 and PM2 through a contact. The first layer metal wiring M111 is coupled to a power supply potential wiring VDD. The first layer metal wiring M112 is coupled to the drains of the N channel MOS transistors ND1 and ND2 through a contact. The first layer metal wiring M112 is coupled to the ground potential wiring VSS.

The first layer metal wirings (m11 through m14, m19, m110 through m112) in the forming area for the memory cell MC01 will next be described. The first layer metal wiring m11 configures a word line WLe1 provided along the X direction and is coupled to the gate electrodes G1 and G2 through contacts. The first layer metal wiring m12 configures a word line WLo1 provided along the X direction. The first layer metal wiring m12 is coupled to the gate electrodes G1 and G2 through contacts in the forming area for the memory cell MC01. The first layer metal wiring m13 is coupled to the source or drain of the N channel MOS transistor NT2 through a contact. The first layer metal wiring m13 is coupled to the bit line BL0. The first layer metal wiring m14 is coupled to the source or drain of the N channel MOS transistor NT1 through a contact. The first layer metal wiring m14 is coupled to the bit line BL1. The first layer metal wiring m19 is coupled to the drain of the P channel MOS transistor PM2, the drain of the N channel MOS transistor ND2, and the gate electrode G3 through contacts. The first layer metal wiring m110 is coupled to the drain of the P channel MOS transistor PM1, the drain of the N channel MOS transistor ND1, and the gate electrode G4 through contacts. The first layer metal wiring m111 is coupled to the drains of the P channel MOS transistors PM1 and PM2 through a contact. The first layer metal wiring m111 is coupled to the power supply potential wiring VDD. The first layer metal wiring m112 is coupled to the drains of the N channel MOS transistors ND1 and ND2 through a contact. The first layer metal wiring m112 is coupled to the ground potential wiring VSS.

As shown in FIG. 36, the second layer metal wirings (M20 through M25) are provided in the forming areas for the memory cells MC00 and MC01 along the Y direction.

The second layer metal wiring M20 configures the bit line BL1. The second layer metal wiring M20 is coupled to the first layer metal wirings M14 and m14 through vias 1. The second layer metal wiring M21 configures the search line /SL0. The second layer metal wiring M21 is coupled to the first layer metal wiring M18 through a via 1. The second layer metal wiring M22 configures the ground potential wiring VSS. The second layer metal wiring M22 is coupled to the first layer metal wirings M16, M112, and m112 through vias 1. The second layer metal wiring M23 configures the power supply potential wiring VDD. The second layer metal wiring M23 is coupled to the first layer metal wirings M111 and m111 through vias 1. The second layer metal wiring M24 configures the search line SL0. The second layer metal wiring M24 is coupled to the first layer metal wiring M17 through a via 1. The second layer metal wiring M25 configures the bit line BL0. The second layer metal wiring M25 is coupled to the first layer metal wirings M13 and m13 through vias 1.

Incidentally, when the configuration of the local ground wiring LVSS0 and the match line control circuit MLCa described in the modification 2 is applied, the first layer metal wiring M16 is configured as the local ground wiring LVSS0. In this case, in the first layer metal wiring M16, the via 1 associated with a part thereof corresponding to the second layer metal wiring M22 is deleted in such a manner that the first layer metal wiring M16 is not coupled to the second layer metal wiring M22 through the via 1.

Exemplary Embodiment 5

Figure 37:
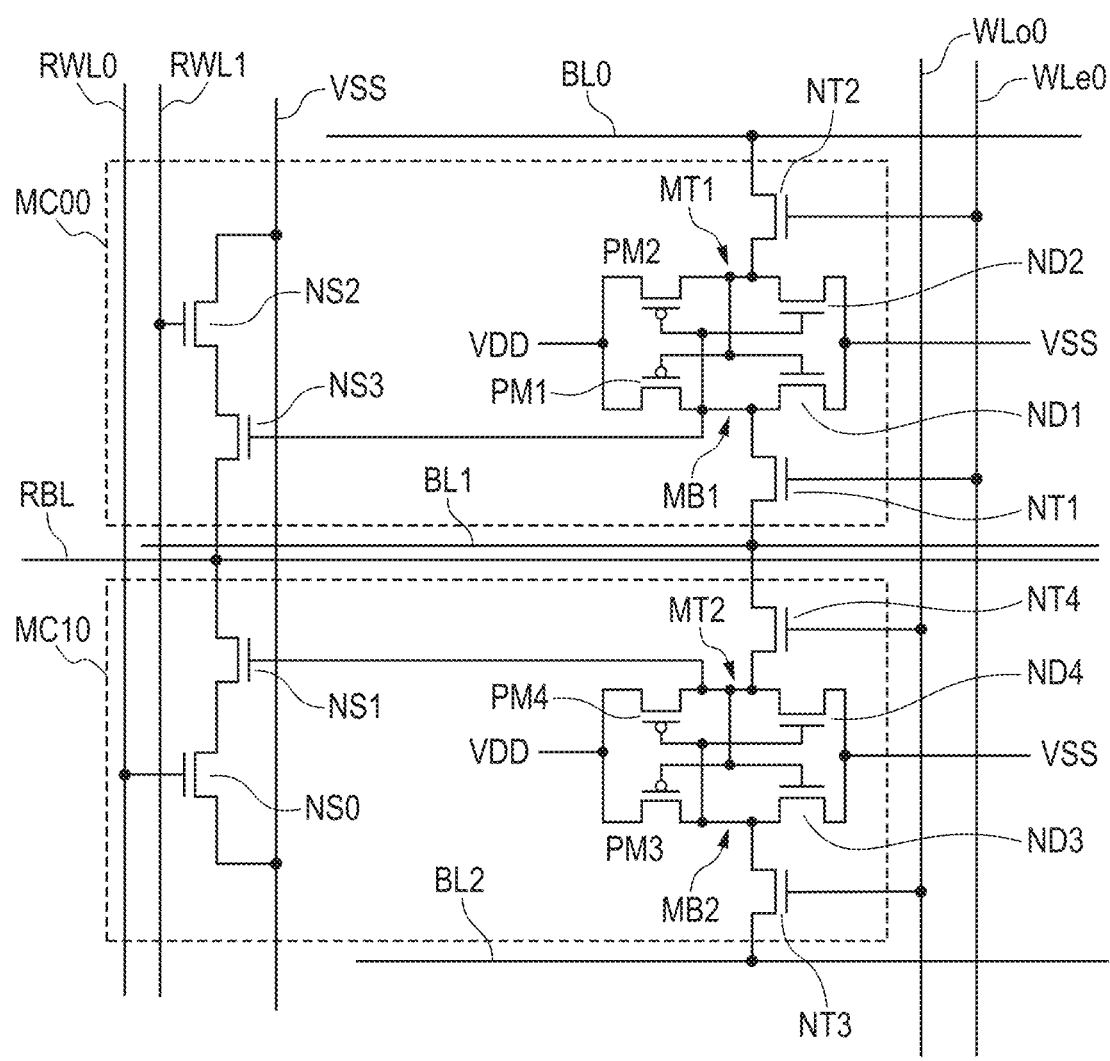
FIG. 37 is a diagram showing a circuit example of a two-port type memory cell according to the exemplary embodiment 5.
Figure 38:
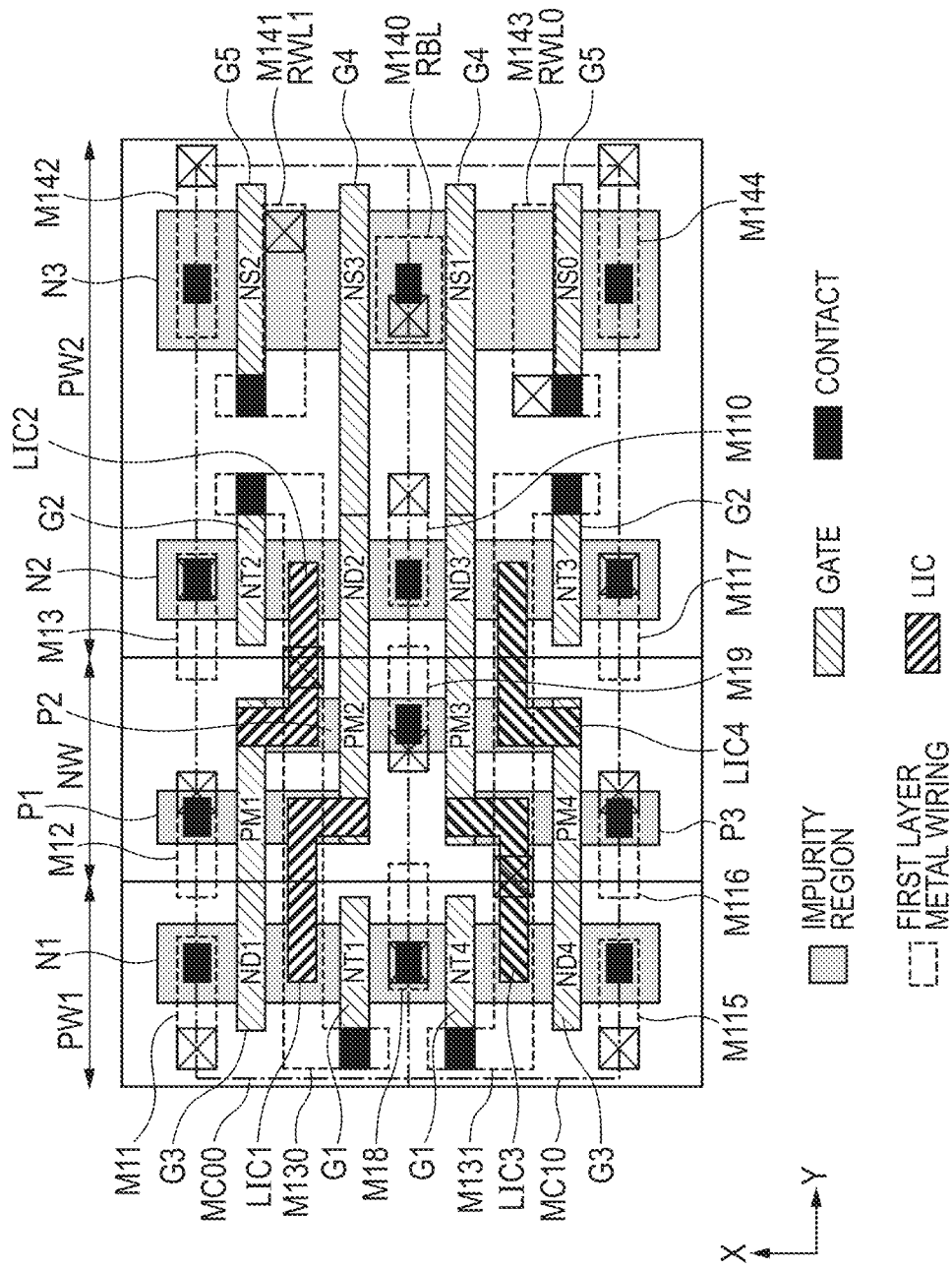
FIG. 38 is a diagram showing a layout arrangement of the two-port type memory cell formed with first layer metal wirings.
Figure 39:
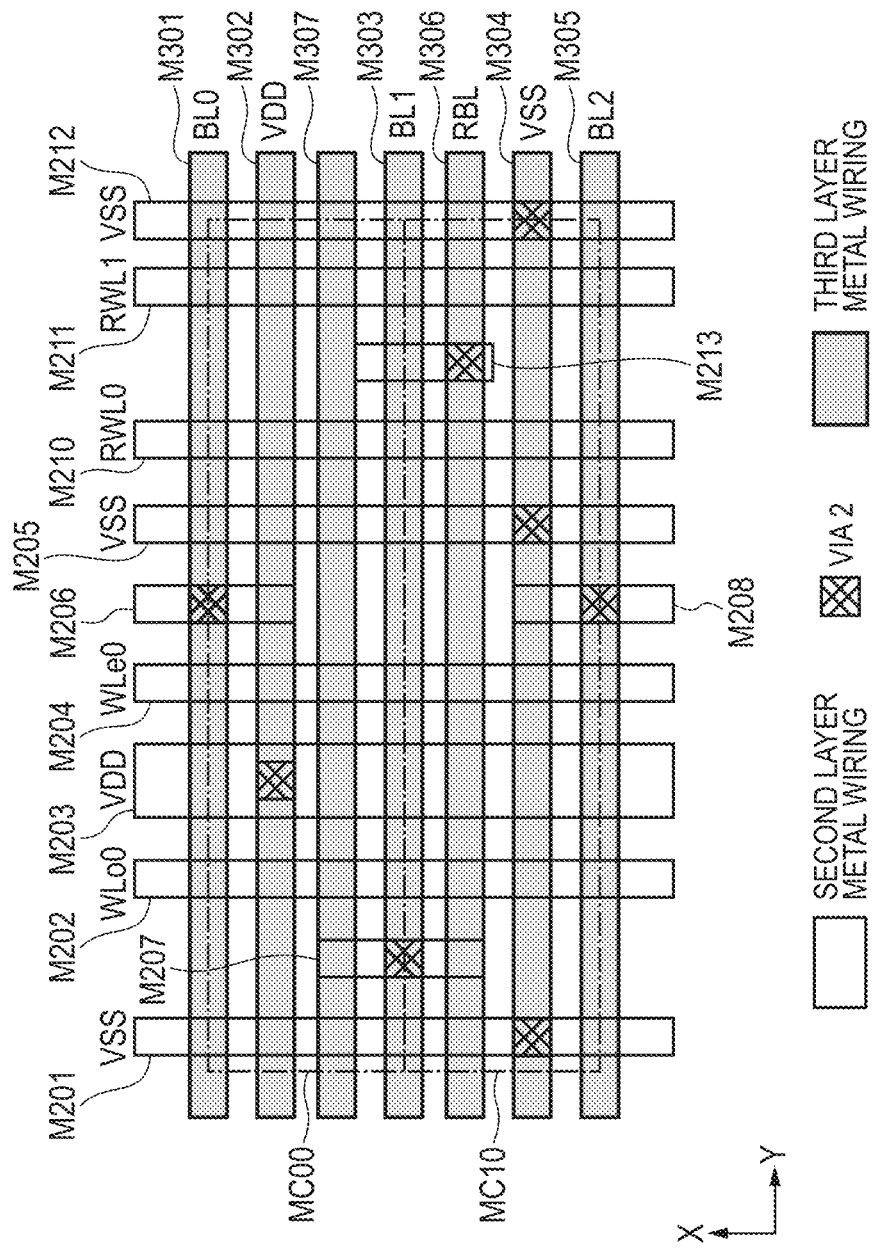
FIG. 39 is a diagram showing a layout arrangement of the two-port type memory cell formed with second layer metal wirings and third layer metal wirings.

An exemplary embodiment 5 will next be described using FIGS. 37 through 39. The exemplary embodiment 5 is an example of application to a two-port type memory cell 2PCEL. FIG. 37 is a diagram showing a circuit example of the two-port type memory cell according to the exemplary embodiment 5. FIG. 38 is a diagram showing a layout arrangement of the two-port type memory cell formed with first layer metal wirings. FIG. 39 is a diagram showing a layout arrangement of the two-port type memory cell formed with second layer metal wirings and third layer metal wirings.

In FIG. 37, it is different from FIG. 5 in that two N channel MOS transistors (NS3 and NS2 and NS1 and NS0) for a read port are respectively provided in memory cells MC00 and MC10. With their provision, two word lines RWL0 and RWL1 for the read port and a bit line RBL for the read port are provided. Word lines WLo0 and WLe0 can be configured as word lines for a write port.

In the memory cell MC00, a source-drain path of the N channel MOS transistor NS2 and a source-drain path of the N channel MOS transistor NS3 are coupled in series between the bit line RBL and a ground potential wiring VSS. A gate of the N channel MOS transistor NS2 is coupled to the word line RWL1 for the read port. A gate of the N channel MOS transistor NS3 is coupled to a second memory node MB1 in the memory cell MC00.

In the memory cell MC10, a source-drain path of the N channel MOS transistor NS0 and a source-drain path of the N channel MOS transistor NS1 are coupled in series between the bit line RBL and the ground potential wiring VSS. A gate of the N channel MOS transistor NS0 is coupled to the word line RWL0 for the read port. A gate of the N channel MOS transistor NS1 is coupled to a first memory node MT2 in the memory cell MC10.

With above configuration, the two-port type memory cell 2PCEL is configured. For example, in the memory cell MC00, when the word line RWL1 is brought to a selection level like a high level where the second memory node MB1 stores a high level "1" therein, the N channel MOS transistors NS2 and NS3 are respectively brought into an on state. Therefore, the potential of the bit line RBL precharged to the high level is transitioned to the low level side. Thus, the data stored in the memory cell MC00 is read to the bit line RBL. Further, when the word line RWL1 is brought to the selection level like the high level where the second memory node MB1 stores a low level "0" therein, the N channel MOS transistor NS2 is brought into an on state, but the N channel MOS transistor NS3 maintains an off state. Accordingly, the potential of the bit line RBL precharged to the high level is maintained. Thus, the data stored in the memory cell MC00 is read to the bit line RBL.

In FIG. 38, it is different from FIG. 11 in that in forming areas for the memory cells MC00 and MC10, gate electrodes G4 are extended in a Y direction, gate electrodes G5 are provided along the Y direction, an N-type impurity region N3 is formed within a P-type well region PW2, and first layer metal wirings M140 through M144 are anew provided. Thus, the two N channel MOS transistors (NS3 and NS2 and NS1 and NS0) for the read port are respectively formed in the forming areas for the memory cells MC00 and MC10. Since other configurations are the same as those in FIG. 11, their description will be omitted.

In FIG. 38, the N-type impurity region N3 configures the sources or drains of the N channel MOS transistors (NS2, NS3, NS1, NS0). In the forming area for the memory cell MC00, the gate electrode G5 configures the gate of the N channel MOS transistor NS2. In the forming area for the memory cell MC10, the gate electrode G5 configures the gate of the N channel MOS transistor NS1.

The first layer metal wiring M140 is coupled to the N-type impurity region N3 configuring the drains of the N channel MOS transistors NS3 and NS1 through a contact. The first layer metal wiring M140 is coupled to the bit line RBL through a via 1. The first layer metal wiring M141 is coupled to the gate of the N channel MOS transistor NS2 through a contact. The first layer metal wiring M141 is coupled to the word line RWL1 through a via 1. The first layer metal wiring M142 is coupled to the N-type impurity region N3 configuring the source of the N channel MOS transistor NS3 through a contact. The first layer metal wiring M142 is coupled to the ground potential wiring VSS through a via 1. The first layer metal wiring M143 is coupled to the gate of the N channel MOS transistor NS0 through a contact. The first layer metal wiring M143 is coupled to the word line RWL0 through a via 1. The first layer metal wiring M144 is coupled to the N-type impurity region N3 configuring the source of the N channel MOS transistor NS0 through a contact. The first layer metal wiring M144 is coupled to the ground potential wiring VSS through a via 1.

In FIG. 39, it is different from FIG. 13 in that second layer metal wirings M210 through M213 are provided along the Y direction, and third layer metal wirings M306 and M307 are provided along an X direction. Since other configurations are the same as those in FIG. 13, their description will be omitted.

In FIG. 39, the second layer metal wiring M210 configures the word line RWL0. The second layer metal wiring M210 is coupled to the first layer metal wiring M143 through a via 1. The second layer metal wiring M211 configures the word line RWL1. The second layer metal wiring M211 is coupled to the first layer metal wiring M143 through a via 1. The second layer metal wiring M212 is the ground potential wiring VSS. The ground potential wiring VSS is coupled to the first layer metal wirings M142 and M144 through vias 1. The second layer metal wiring M213 is coupled to the first layer metal wiring M140 through a via 1. The second layer metal wiring M213 is coupled to a third layer metal wiring M306 through a via 2.

The third layer metal wiring M306 configures the bit line RBL. The third layer metal wiring M306 is arranged to run in parallel between the bit line BL1 (M303) and the ground potential wiring VSS (M304). The third layer metal wiring M307 is a passing wiring and is arranged to run in parallel between the power supply potential wiring VDD (M302) and the bit line BL1 (M303). Incidentally, the third layer metal wiring M307 may not be provided.

According to the exemplary embodiment 5, it is possible to configure a two-port type memory capable of obtaining a similar effect to the embodiment and the exemplary embodiment 1.

Exemplary Embodiment 6

Figure 40:
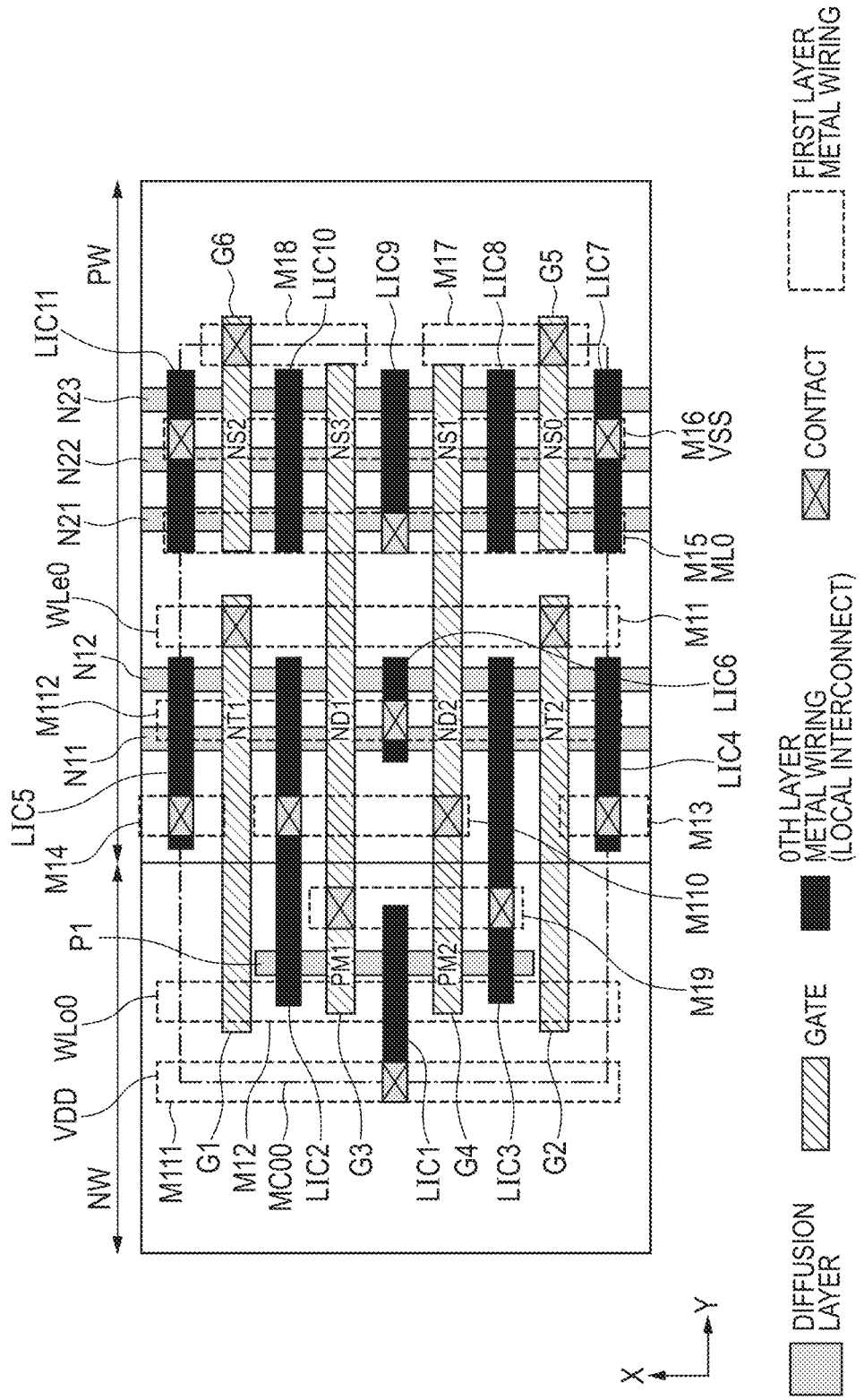
FIG. 40 is a diagram showing a layout arrangement of a memory cell of a BCAM formed with first layer metal wirings according to an exemplary embodiment 6.
Figure 41:
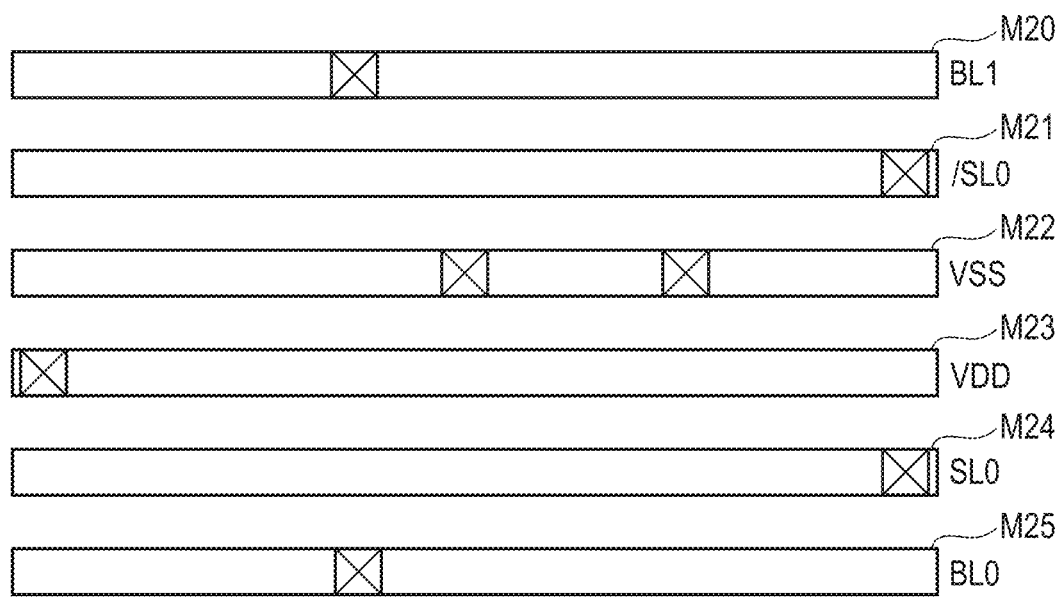
FIG. 41 is a diagram showing a layout arrangement of the memory cell of the BCAM formed with second layer metal wirings according to the exemplary embodiment 6.

An exemplary embodiment 6 will next be described using FIGS. 40 and 41. In the exemplary embodiment 6, the layout arrangement of the memory cell of the BCAM according to the modification 4 of FIG. 31 is laid out using a FinFET structure. FIG. 40 is a diagram showing a layout arrangement of the memory cell of the BCAM formed with first layer metal wirings according to the exemplary embodiment 6. FIG. 41 is a diagram showing a layout arrangement of the memory cell of the BCAM formed with second layer metal wirings according to the exemplary embodiment 6. Incidentally, a circuit configuration of the memory cell of the BCAM is the same as that of FIG. 25.

In FIG. 40, a forming area for a memory cell MC00 includes gate electrodes G1 through G6 provided along a Y direction, an N-type well region NW provided along an X direction, and a P-type well region PW adjacent to the N-type well region NW and provided along the X direction. The N-type well region NW is shared with a memory cell formed on the left-hand side thereof in plan view. Further, the P-type well region PW is provided along the Y direction and shared with a memory cell formed on the right-hand side thereof in plan view. Besides, there are provided in the forming area for the memory cell MC00, local interconnect wirings (LIC1 through LIC11) as 0th layer metal wirings provided along the Y direction, and first layer metal wirings (M11 through M19, M110 through M112) provided along the X direction.

The gate electrode G1 configures a gate of an N channel MOS transistor NT1. The gate electrode G2 configures a gate of an N channel MOS transistor NT2. The gate electrode G3 configures gates of a P channel MOS transistor PM1, an N channel MOS transistor ND1, and an N channel MOS transistor NS3. The gate electrode G4 configures gates of a P channel MOS transistor PM2, an N channel MOS transistor ND2, and an N channel MOS transistor NS1. The gate electrode G5 configures a gate of an N channel MOS transistor NS0. The gate electrode G6 configures a gate of an N channel MOS transistor NS2.

A P-type impurity region P1 is arranged in the N-type well region NW along the X direction. The P-type impurity region P1 serves as sources or drains of the P channel MOS transistors PM1 and PM2.

N-type impurity regions N11, N12, N21, N22, and N23 are arranged in the P-type well region PW to run in parallel in the X direction. The N-type impurity regions N11 and N12 are arranged between the P-type impurity region P1 and the N-type impurity region N21. The N-type impurity regions N11 and N12 configure sources or drains of the N channel MOS transistors NT1, ND1, ND2, and NT2. Each of the N channel MOS transistors NT1, ND1, ND2, and NT2 has a configuration in which two transistors are coupled in parallel.

The N-type impurity regions N21, N22, and N23 configure sources or drains of the N channel MOS transistors NS0 through NS3. Each of the N channel MOS transistors NS0 through NS3 has a configuration in which three transistors are coupled in parallel. The N channel MOS transistors NT1, ND1, ND2, and NT2 are arranged between the P channel MOS transistors PM1 and PM2 and the N channel MOS transistors NS0 through NS3.

The first layer metal wiring M11 configures a word line WLe0. The M11 is coupled to the gate electrodes G1 and G2 through contacts. The first layer metal wiring M12 configures a word line WLo0. The M12 is coupled to the gate electrodes G1 and G2 through contacts in a forming area for a memory cell MC10. The first layer metal wiring M13 is coupled to the LIC4 through a contact. The LIC4 is coupled to the N-type impurity regions N11 and N12 configuring the source of the N channel MOS transistor NT2. The M13 is coupled to a bit line BL1. The first layer metal wiring M14 is coupled to the LIC5 through a contact. The LIC5 is coupled to the N-type impurity regions N11 and N12 configuring the source of the N channel MOS transistor NT1. The M14 is coupled to a bit line BL0. The first layer metal wiring M15 configures a match line ML0. The M15 is coupled to the LIC9 through a contact. The LIC9 is coupled to the N-type impurity regions N21, N22, and N23 configuring the drains of the N channel MOS transistors NS1 and NS3. The first layer metal wiring M16 is coupled to the LIC7 and LIC11 through contacts. The LIC7 is coupled to the N-type impurity regions N21, N22, and N23 configuring the source of the N channel MOS transistor NS0. The LIC11 is coupled to the N-type impurity regions N21, N22, and N23 configuring the source of the N channel MOS transistor NS2. The M16 is coupled to a ground potential wiring VSS. The first layer metal wiring M17 is coupled to the gate electrode G5 through a contact. The M17 is coupled to a search line SL0. The first layer metal wiring M18 is coupled to the gate electrode G6 through a contact. The M18 is coupled to a search line /SL0. The first layer metal wiring M19 is coupled to the gate electrode G3 and the LIC3 through contacts. The LIC3 is coupled to the P-type impurity region P1 configuring the drain of the P channel MOS transistor PM2, and the N-type impurity regions N11 and N12 configuring the drain of the N channel MOS transistor ND2. The first layer metal wiring M110 is coupled to the gate electrode G4 and the LIC2 through contacts. The LIC2 is coupled to the P-type impurity region P1 configuring the drain of the P channel MOS transistor PM1, and the N-type impurity regions N11 and N12 configuring the drain of the N channel MOS transistor ND1. The first layer metal wiring M111 is coupled to the LIC1 through a contact. The LIC1 is coupled to the P-type impurity region P1 configuring the sources of the P channel MOS transistors PM1 and PM2. The M111 is coupled to a power supply potential wiring VDD. The first layer metal wiring M112 is coupled to the LIC6 through a contact. The LIC6 is coupled to the N-type impurity regions N11 and N12 configuring the sources of the N channel MOS transistors ND1 and ND2. Incidentally, the LIC8 is coupled to the N-type impurity regions N21, N22, and N23 configuring the drain of the N channel MOS transistor NS2 or the source of the N channel MOS transistor NS3. The LIC10 is coupled to the N-type impurity regions N21, N22, and N23 configuring the drain of the N channel MOS transistor NS0 or the source of the N channel MOS transistor NS1.

In FIG. 41, second layer metal wirings (M20 through M25) are provided in the forming area for the memory cell MC00 along the Y direction as shown in FIG. 27.

The second layer metal wiring M20 configures the bit line BL1. The second layer metal wiring M20 is coupled to the first layer metal wiring M14 through a via 1. The second layer metal wiring M21 configures the search line /SL0. The second layer metal wiring M21 is coupled to the first layer metal wiring M18 through a via 1. The second layer metal wiring M22 configures the ground potential wiring VSS. The second layer metal wiring M22 is coupled to the first layer metal wirings M16 and M112 through vias 1. The second layer metal wiring M23 configures the power supply potential wiring VDD. The second layer metal wiring M23 is coupled to the first layer metal wiring M111 through a via 1. The second layer metal wiring M24 configures the search line SL0. The second layer metal wiring M24 is coupled to the first layer metal wiring M17 through a via 1. The second layer metal wiring M25 configures the bit line BL0. The second layer metal wiring M25 is coupled to the first layer metal wiring M13 through a via 1.

When the configuration of the local ground wiring LVSS and the match line control circuit MLCa described in the modification 2 is applied to the exemplary embodiment 6, i.e., when the second layer metal wiring M22 is coupled only to the first layer metal wiring M112 through the vial (it is not coupled to the first layer metal wiring M16) where the first layer metal wiring M16 is configured as the local ground wiring LVSS, the via 1 associated with a part of the first layer metal wiring M16 corresponding to the second layer metal wiring M22 is deleted in such a manner that the first layer metal wiring M16 is not coupled to the second layer metal wiring M22 through the via 1. Thus, the first layer metal wiring M16 can be configured as the local ground wiring LVSS.

According to the exemplary embodiment 6, the following effects can be obtained.

Since the wiring pitches of the first layer metal wirings (M11 through M19, M110 through M112) are at equal intervals, and only linear patterns are adopted, their manufacture is facilitated.

Since the wiring pitches of the second layer metal wirings (M20 through M25) are at equal intervals, and only linear patterns are adopted, their manufacture is facilitated.

The relatively thick N-type well region NW and P-type well region PW shared with each adjacent cell are configured as with the modification 4. Therefore, since process control at the time of forming the N-type and P-type well regions NW and PW becomes relatively easy, the manufacture of the N-type and P-type well regions NW and PW can be facilitated.

Although the invention made above by the present inventors has been described specifically on the basis of the exemplary embodiments, the present invention is not limited to the above embodiment and exemplary embodiments. It is needless to say that the present invention can be modified in various ways.

What is claimed is:

1. A semiconductor memory device comprising:
a plurality of memory cells; and
a word line coupled to the plurality of memory cells,
a plurality of bit lines coupled to the memory cells,
wherein the word line is extended in a first direction,
wherein each of the plurality of memory cells includes a gate electrode extended along a second direction intersecting with the first direction,
wherein the bit lines are extended in the second direction,
wherein the gate electrodes include a first gate electrode, a second gate electrode, a third gate electrode, and a fourth gate electrode,
wherein the first gate electrode, the second gate electrode, the third gate electrode, and the fourth gate electrode are provided to be separated from each other and formed in a bending-free linear form,
wherein the first gate electrode and the third gate electrode are arranged to run in parallel in the first direction,
wherein the first gate electrode and the fourth gate electrode are linearly arranged in the second direction, and
wherein the third gate electrode and the second gate electrode are linearly arranged in the second direction.

2. The semiconductor memory device according to claim 1,
wherein each of the memory cells has a rectangular-shaped pattern slender in the second direction, and
wherein the first gate electrode, the second gate electrode, the third gate electrode, and the fourth gate electrode are arranged in the slender rectangular-shaped pattern.

3. The semiconductor memory device according to claim 2, wherein each of the memory cells is a static type memory cell including six MOS transistors.

4. The semiconductor memory device according to claim 1, wherein in each of the memory cells, a length of the word line corresponding to one memory cell is shorter than a length of the bit line corresponding to one memory cell.

5. A semiconductor memory device comprising:
a plurality of memory cells;
a word line coupled to the memory cells; and
a plurality of bit lines coupled to the memory cells,
wherein the word line is arranged to extend in a first direction,
wherein the plurality of bit lines are arranged to extend in a second direction intersecting with the first direction,
wherein each of the memory cells includes a plurality of gate electrodes extended in the second direction,
wherein each of the memory cells includes six MOS transistors,
wherein two of the six MOS transistors are arranged next to each other in the first direction,
wherein the gate electrodes include a first gate electrode, a second gate electrode, a third gate electrode, and a fourth gate electrode,
wherein the first gate electrode, the second gate electrode, the third gate electrode, and the fourth gate electrode are provided to be separated from each other and formed in a bending-free linear form,
wherein the first gate electrode and the third gate electrode are arranged to vertically run in parallel in the first direction,
wherein the first gate electrode and the fourth gate electrode are linearly arranged in the second direction, and
wherein the third gate electrode and the second gate electrode are linearly arranged in the second direction.

6. The semiconductor memory device according to claim 5,
wherein the memory cells are extended in the first direction, and
wherein in the memory cells extended in the first direction, two memory cells arranged next to each other share one of the bit lines.

7. The semiconductor memory device according to claim 5,
wherein the six MOS transistors include first and second P channel MOS transistors, and first, second, third and fourth N channel MOS transistors,
wherein the first gate electrode is configured to be a gate of the first N channel MOS transistor,
wherein the second gate electrode is configured to be a gate of the second N channel MOS transistor,
wherein the third gate electrode is configured to be a gate of the first P channel MOS transistor and a gate of the third N channel MOS transistor, and
wherein the fourth gate electrode is configured to be a gate of the second P channel MOS transistor and a gate of the fourth N channel MOS transistor.

8. The semiconductor memory device according to claim 7,
wherein sources or drains of the first N channel MOS transistor and the third N channel MOS transistor are comprised of an N-type impurity region formed in a first P-type well region provided along the first direction, wherein sources or drains of the second N channel MOS transistor and the fourth N channel MOS transistor are comprised of an N-type impurity region formed in a second P-type well region provided along the first direction, and wherein sources or drains of the first and second P channel MOS transistors are comprised of a P-type impurity region formed in an N-type well region provided along the first direction and provided to be interposed by the first and second P-type well regions.

9. The semiconductor memory device according to claim 5, wherein the semiconductor memory device is formed using first, second, third and fourth layer metal wirings, wherein the word line is formed by one of the third layer metal wiring and the fourth layer metal wiring, and wherein the bit lines are respectively formed by the other of the third layer metal wiring and the fourth layer metal wiring.

10. The semiconductor memory device according to claim 5, wherein the semiconductor memory device is formed using first, second and third layer metal wirings, wherein the word line is formed by one of the second layer metal wiring and the third layer metal wiring, and wherein the bit lines are formed by the other of the second layer metal wiring and the third layer metal wiring.

11. A semiconductor memory device comprising:
a first word line and a second word line provided along a first direction;
a first bit line, a second bit line, and a third bit line provided along a second direction intersecting with the first direction;
a first memory cell coupled to the first word line, the first bit line, and the second bit line; and
a second memory cell coupled to the second word line, the second bit line, and the third bit line,
wherein each of the first memory cell and the second memory cell has a gate electrode extended in the second direction,
wherein the gate electrodes include a first gate electrode, a second gate electrode, a third gate electrode, and a fourth gate electrode,
wherein the first gate electrode, the second gate electrode, the third gate electrode, and the fourth gate electrode are provided to be separated from each other and formed in a bending-free linear form,
wherein the first gate electrode and the third gate electrode are arranged to vertically run in parallel in the first direction,
wherein the first gate electrode and the fourth gate electrode are linearly arranged in the second direction,
wherein the third gate electrode and the second gate electrode are linearly arranged in the second direction,
wherein each of the first memory cell and the second memory cell includes first and second P channel MOS transistors, and first, second, third and fourth N channel MOS transistors,
wherein the first gate electrode is configured to be a gate of the first N channel MOS transistor,
wherein the second gate electrode is configured to be a gate of the second N channel MOS transistor,
wherein the third gate electrode is configured to be a gate of the first P channel MOS transistor and a gate of the third N channel MOS transistor, and
wherein the fourth gate electrode is configured to be a gate of the second P channel MOS transistor and a gate of the fourth N channel MOS transistor.

12. The semiconductor memory device according to claim 11, wherein sources or drains of the first N channel MOS transistor and the third N channel MOS transistor are comprised of an N-type impurity region formed in a first P-type well region provided along the first direction, wherein sources or drains of the second N channel MOS transistor and the fourth N channel MOS transistor are comprised of an N-type impurity region formed in a second P-type well region provided along the first direction, and wherein sources or drains of the first and second P channel MOS transistors are comprised of a P-type impurity region formed in an N-type well region provided along the first direction and provided to be interposed by the first and second P-type well regions.

13. The semiconductor memory device according to claim 12, wherein the semiconductor memory device is formed using first, second, third and fourth layer metal wirings, wherein the first and second word lines are respectively formed by one of the third layer metal wiring and the fourth layer metal wiring, and wherein the first through third bit lines are respectively formed by the other of the third layer metal wiring and the fourth layer metal wiring.

14. The semiconductor memory device according to claim 12, wherein the semiconductor memory device is formed using first, second and third layer metal wirings, wherein the first and second word lines are respectively formed by one of the second layer metal wiring and the third layer metal wiring, and wherein the first through third bit lines are respectively formed by the other of the second layer metal wiring and the third layer metal wiring.

* * * * *